(12) United States Patent
Jung et al.

(10) Patent No.: US 11,856,770 B2
(45) Date of Patent: Dec. 26, 2023

(54) SEMICONDUCTOR DEVICE, METHOD OF MANUFACTURING THE SAME, AND MASSIVE DATA STORAGE SYSTEM INCLUDING THE SAME

(71) Applicant: Samsung Electronics Co., Ltd., Suwon-si (KR)

(72) Inventors: Kwangyoung Jung, Hwaseong-si (KR); Jaebok Baek, Osan-si (KR); Giyong Chung, Seoul (KR); Jeehoon Han, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 182 days.

(21) Appl. No.: 17/357,213

(22) Filed: Jun. 24, 2021

(65) Prior Publication Data

US 2022/0139945 A1  May 5, 2022

(30) Foreign Application Priority Data

Nov. 3, 2020  (KR) .................. 10-2020-0144930

(51) Int. Cl.
  *H10B 43/10*  (2023.01)
  *H01L 25/18*  (2023.01)
  (Continued)

(52) U.S. Cl.
  CPC .......... *H10B 43/10* (2023.02); *H01L 25/0657* (2013.01); *H01L 25/18* (2013.01);
  (Continued)

(58) Field of Classification Search
  CPC ........ H10B 43/27; H10B 43/10; H10B 43/35; H10B 43/50; H10B 41/27; H10B 43/40;
  (Continued)

(56) References Cited

U.S. PATENT DOCUMENTS 9,583,503 B1  2/2017  Lee
9,640,549 B2  5/2017  Lee et al.
(Continued)

FOREIGN PATENT DOCUMENTS

KR  2015-0057254 A  5/2015
KR  2017-0119158 A  10/2017
(Continued)

*Primary Examiner* — Telly D Green
(74) *Attorney, Agent, or Firm* — Harness, Dickey & Pierce, P.L.C.

(57) ABSTRACT

A semiconductor device includes a gate electrode structure, a channel, first division patterns, and a second division pattern. The gate electrode structure is on a substrate, and includes gate electrodes stacked in a first direction perpendicular to the substrate. Each gate electrode extends in a second direction parallel to the substrate. The channel extends in the first direction through the gate electrode structure. The first division patterns are spaced apart from each other in the second direction, and each first division pattern extends in the second direction through the gate electrode structure. The second division pattern is between the first division patterns, and the second division pattern and the first division patterns together divide a first gate electrode in a third direction parallel to the substrate and crossing the second direction. The second division pattern has an outer contour that is a curve in a plan view.

19 Claims, 54 Drawing Sheets

(51) Int. Cl.
  *H01L 25/065* (2023.01)
  *H10B 43/27* (2023.01)
  *H01L 23/00* (2006.01)

(52) U.S. Cl.
  CPC .............. *H10B 43/27* (2023.02); *H01L 24/08* (2013.01); *H01L 2224/08145* (2013.01); *H01L 2924/1431* (2013.01); *H01L 2924/14511* (2013.01)

(58) Field of Classification Search
  CPC ... H10B 41/10; H10B 41/40; H01L 21/02164; H01L 21/02532; H01L 21/02592; H01L 21/31111; H01L 23/528; H01L 29/40117; H01L 27/0688; H01L 23/5226
  See application file for complete search history.

(56) References Cited

U.S. PATENT DOCUMENTS

| | | | |
|---|---|---|---|
| 10,515,974 B2* | 12/2019 | Lee | H10B 43/10 |
| 10,559,583 B2 | 2/2020 | Park et al. | |
| 10,566,345 B2 | 2/2020 | Kanamori et al. | |
| 10,672,789 B2 | 6/2020 | Song et al. | |
| 10,804,292 B2* | 10/2020 | Yun | H01L 23/528 |
| 11,205,663 B2* | 12/2021 | Yun | H01L 23/528 |
| 11,610,908 B2* | 3/2023 | Baek | G11C 5/025 |
| 2017/0301684 A1 | 10/2017 | Park et al. | |
| 2018/0374862 A1* | 12/2018 | Lee | H10B 41/50 |
| 2020/0020702 A1 | 1/2020 | Baek | |
| 2020/0111803 A1 | 4/2020 | Baek et al. | |
| 2020/0135757 A1* | 4/2020 | Yun | H01L 23/528 |
| 2020/0161329 A1 | 5/2020 | Park et al. | |
| 2020/0161330 A1 | 5/2020 | Kanamori et al. | |
| 2020/0388624 A1* | 12/2020 | Baek | H10B 41/27 |
| 2020/0411549 A1* | 12/2020 | Yun | H10B 43/27 |
| 2021/0134831 A1* | 5/2021 | Song | H10B 43/27 |
| 2021/0320125 A1* | 10/2021 | Shin | H10B 41/40 |
| 2021/0384218 A1* | 12/2021 | Baek | H01L 23/5226 |

FOREIGN PATENT DOCUMENTS

| | | |
|---|---|---|
| KR | 2018-0010368 A | 1/2018 |
| KR | 2019-0051651 A | 5/2019 |
| KR | 2019-0053715 A | 5/2019 |
| KR | 2020-0040351 A | 4/2020 |

\* cited by examiner

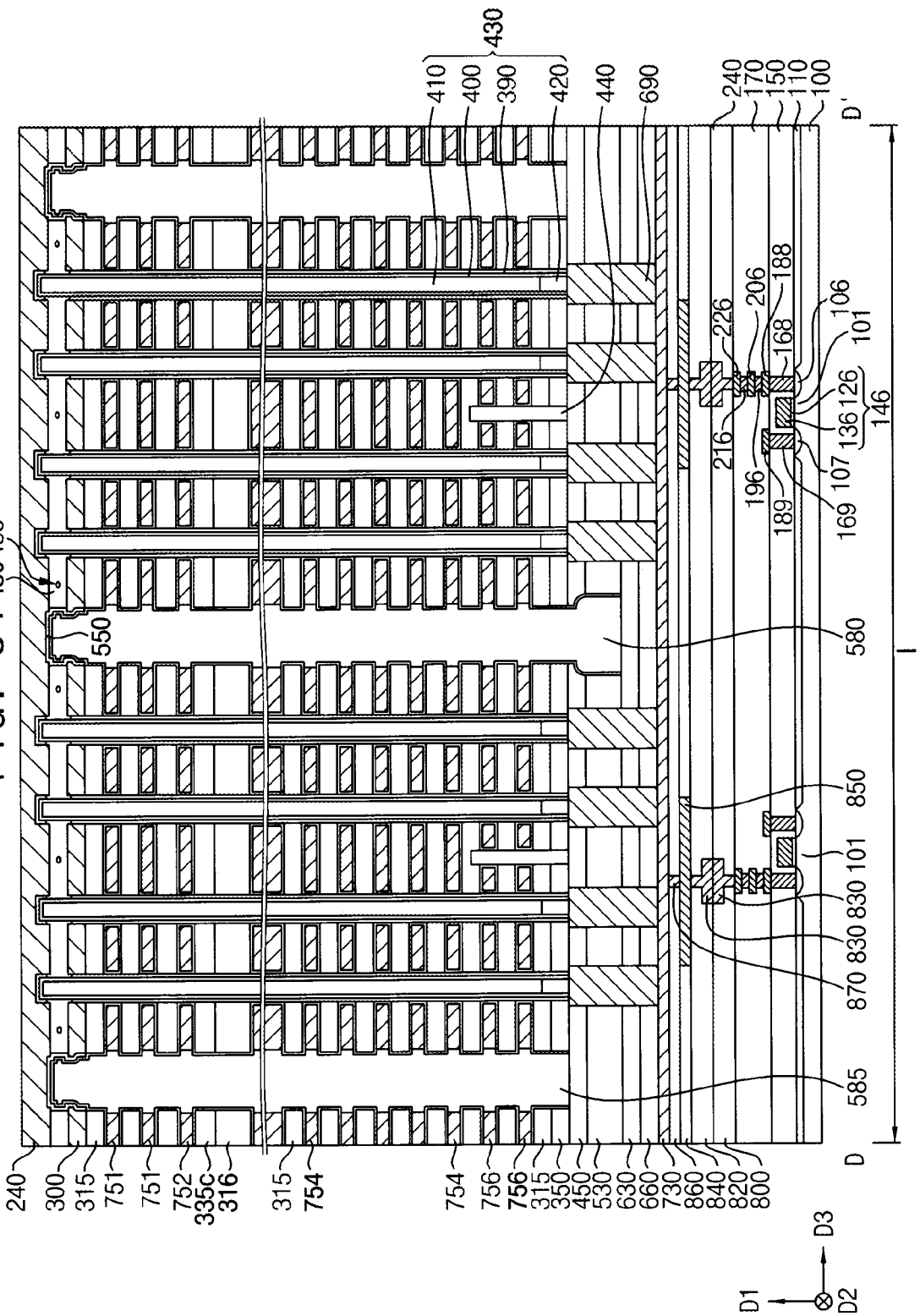

SEMICONDUCTOR DEVICE, METHOD OF MANUFACTURING THE SAME, AND MASSIVE DATA STORAGE SYSTEM INCLUDING THE SAME

CROSS-REFERENCE TO RELATED APPLICATIONS

This application claims priority under 35 USC § 119 to Korean Patent Application No. 10-2020-0144930, filed on Nov. 3, 2020 in the Korean Intellectual Property Office (KIPO), the contents of which are herein incorporated by reference in their entirety.

BACKGROUND

Inventive concepts relate to a semiconductor device, a method of manufacturing the same, and a massive data storage system including the same.

In an electronic system requiring data storage needs a high capacity semiconductor device that may store high capacity data. Thus, a method of increasing the data storage capacity of the semiconductor device has been studied. For example, a semiconductor device including memory cells that may be 3-dimensionally stacked has been suggested.

As the number of stacks of the memory cells in the semiconductor device increases, the memory cells may be bent according to the shapes of underlying structures, and the electrical and/or mechanical characteristics of the memory cells may be deteriorated.

SUMMARY

Some example embodiments provide a semiconductor device having improved characteristics.

Alternatively or additionally some example embodiments provide a method of manufacturing/fabricating a semiconductor device having improved characteristics.

Alternatively or additionally some example embodiments provide a massive data storage system including a semiconductor device having improved characteristics.

According to some example embodiments of inventive concepts, there is provided a semiconductor device. The semiconductor device may include a gate electrode structure on a substrate, the gate electrode structure including gate electrodes spaced apart from each other in a first direction perpendicular to an upper surface of the substrate, each of the gate electrodes extending in a second direction parallel to the upper surface of the substrate, a channel on the substrate and extending rough the gate electrode structure in the first direction, first division patterns apart from each other in the second direction, each of the first division patterns extending in the second direction through the gate electrode structure, and a second division pattern between the first division patterns, the second division pattern and the first division patterns together dividing a first gate electrode among the gate electrodes in a third direction parallel to the upper surface of the substrate and crossing the second direction. The second division pattern has an outer contour that has a curve in a plan view.

According to some example embodiments of inventive concepts, there is provided a semiconductor device. The semiconductor device may include a gate electrode structure on a substrate, the gate electrode structure including gate electrodes spaced apart from each other in a first direction perpendicular to an upper surface of the substrate, each of the gate electrodes extending in a second direction parallel to the upper surface of the substrate, a channel on the substrate and extending in the first direction through the gate electrode structure, first division patterns spaced apart from each other in the second direction, each of the first division patterns extending in the second direction through the gate electrode structure, and a second division pattern between the first division patterns, the second division pattern and the first division patterns together dividing a first gate electrode among the gate electrodes in a third direction parallel to the upper surface of the substrate and crossing the second direction. The second division pattern includes a horizontal portion at a same level as the first gate electrode, the horizontal portion and the first division patterns together dividing the first gate electrode in the third direction, and a vertical portion connected to the horizontal portion, the vertical portion extending in the first direction from the horizontal portion.

According to some example of inventive concepts, there is provided a semiconductor device. The semiconductor device may include lower circuit patterns on a substrate, the lower circuit patterns including a cell array region and an extension region at least partially surrounding the cell array region, a common source plate (CSP) over the lower circuit patterns, a gate electrode structure on the CSP, the gate electrode structure including gate electrodes spaced apart from each other in a first direction perpendicular to an upper surface of the substrate, each of the gate electrodes extending in a second direction parallel to the upper surface of the substrate, a memory channel structure extending through the gate electrode structure on the cell array region of the substrate to contact an upper surface of the CSP, the memory channel structure including a channel extending in the first direction, and a charge storage structure on an outer sidewall of the channel, a first division pattern at each of opposite sides of the gate electrode structure in a third direction parallel to the upper surface of the substrate and crossing the second direction, the division pattern extending in the second direction, second division patterns spaced apart from each other in the second direction, each of the second division patterns extending in the second direction through the gate electrode structure between the first division patterns, a third division pattern between the second division patterns, the second and third division patterns dividing a first gate electrode in the third direction, the first gate electrode among the gate electrodes, an insulation pattern structure extending through a portion of the gate electrode structure on the CSP, a through via extending in the first direction through the insulation pattern structure and the CSP, the through via contacting one of the lower circuit patterns to be electrically connected to the one of the lower circuit patterns, a contact plug extending in the first direction to contact an upper surface of an end portion in the second direction of each of the gate electrodes, and a support structure extending in the first direction through the gate electrode structure to contact an upper surface of the CSP, the support structure being adjacent to the contact plug. The third division pattern has an outer contour that has a curve in a plan view.

According to some example embodiments of inventive concepts, there is provided a method of manufacturing a semiconductor device including alternately and repeatedly stacking a first insulation layer and a sacrificial layer on a substrate in a first direction perpendicular to an upper surface of the substrate, forming a second insulation layer on an uppermost one of the sacrificial layers, forming a hole through the second insulation layer, the hole exposing the uppermost one of the sacrificial layers, partially removing the exposed uppermost one of the sacrificial layers through the hole to form a first gap exposing an uppermost one of the first insulation layers, forming a division layer on the first and second insulation layers to fill the first gap and the hole, alternately and repeatedly stacking an additional first insulation layer and an additional sacrificial layer on the division layer in the first direction to form a mold layer on the substrate, the mold layer including the first and second insulation layers, the sacrificial layers, and the division layer, forming a first opening through the mold layer to extend in a second direction parallel to the upper surface of the substrate, the first opening extending through at least a portion of the division layer in the first gap, removing the sacrificial layers through the first opening to form second gaps, and forming gate electrodes in the second gaps, respectively.

According to some example embodiments of inventive concepts, there is provided a method of manufacturing a semiconductor device including alternately and repeatedly stacking a first insulation layer and a sacrificial layer on a substrate in a first direction perpendicular to an upper surface of the substrate, partially removing an uppermost one of the sacrificial layers by performing an isotropic etching process thereon to form a first gap exposing an uppermost one of the first insulation layers, forming a division layer on the uppermost one of the first insulation layers and the uppermost one of the sacrificial layers to fill the first gap, alternately and repeatedly stacking an additional first insulation layer and an additional sacrificial layer on the division layer in the first direction to form a mold layer on the substrate, the mold layer including the first insulation layers, the sacrificial layers, and the division layer, forming a first opening through the mold layer to extend in a second direction parallel to the upper surface of the substrate, the first opening extending through at least a portion of the division layer in the first gap, removing the sacrificial layers through the first opening to form second gaps, and forming gate electrodes in the second gaps, respectively.

According to some example embodiments of inventive concepts, there is provided a massive data storage system. The massive data storage system may include (I) a semiconductor device comprising (A) a memory cell structure including (1) a gate electrode structure on a substrate, the gate electrode structure including gate electrodes spaced apart from each other in a first direction perpendicular to an upper surface of the substrate, each of the gate electrodes extending in a second direction parallel to the upper surface of the substrate, (2) a channel extending in the first direction through the gate electrode structure on the substrate, (3) first division patterns spaced apart from each other in the second direction, each of the first division patterns extending in the second direction through the gate electrode structure, and (4) a second division pattern between the first division patterns, the second division pattern and the first division patterns together dividing a first gate electrode among the gate electrodes in a third direction parallel to the upper surface of the substrate and crossing the second direction with the second division pattern has an outer contour that has a curve in a plan view; (B) peripheral circuit wirings configured to apply electrical signals to the memory cell structure, and (C) an input/output pad electrically connected to the peripheral circuit wirings. The system further comprises (II) a controller circuitry electrically connected to the semiconductor device through the input/output pad, the controller circuitry configured to control the semiconductor device.

In the method of manufacturing the semiconductor device in accordance with some example embodiments, the sacrificial layer for forming the GSL may be partially removed to form a gap, and the division layer may be formed on the sacrificial layer to fill the gap. The division layer may have a flat upper surface, so that additional sacrificial layers and insulation layers may be alternately and repeatedly stacked to be parallel to the upper surface of the substrate. Thus, portions of the sacrificial layers that are bent and/or crooked might not be excessively removed to increase the process margin, and the gate electrodes substituted for the sacrificial layers may have enhanced electrical characteristics.

BRIEF DESCRIPTION OF THE DRAWINGS

FIG. 54 is a cross-sectional view illustrating a semiconductor device in accordance with some example embodiments, which may correspond to FIG. 48.

DETAILED DESCRIPTION OF SOME EXAMPLE EMBODIMENTS

The above and other aspects and features of the semiconductor devices, the methods of manufacturing the same, and the electronic system, e.g., massive data storage system including the same in accordance with some example embodiments will become readily understood from detail descriptions that follow, with reference to the accompanying drawings. It will be understood that, although the terms "first," "second," and/or "third" may be used herein to describe various elements, components, regions, layers and/or sections, these elements, components, regions, layers and/or sections should not be limited by these terms. These terms are only used to distinguish one element, component, region, layer and/or section from another region, layer or section. Thus, a first element, component, region, layer and/or section discussed below could be termed a second or third element, component, region, layer and/or section without departing from the teachings of inventive concepts.

Figure 1:
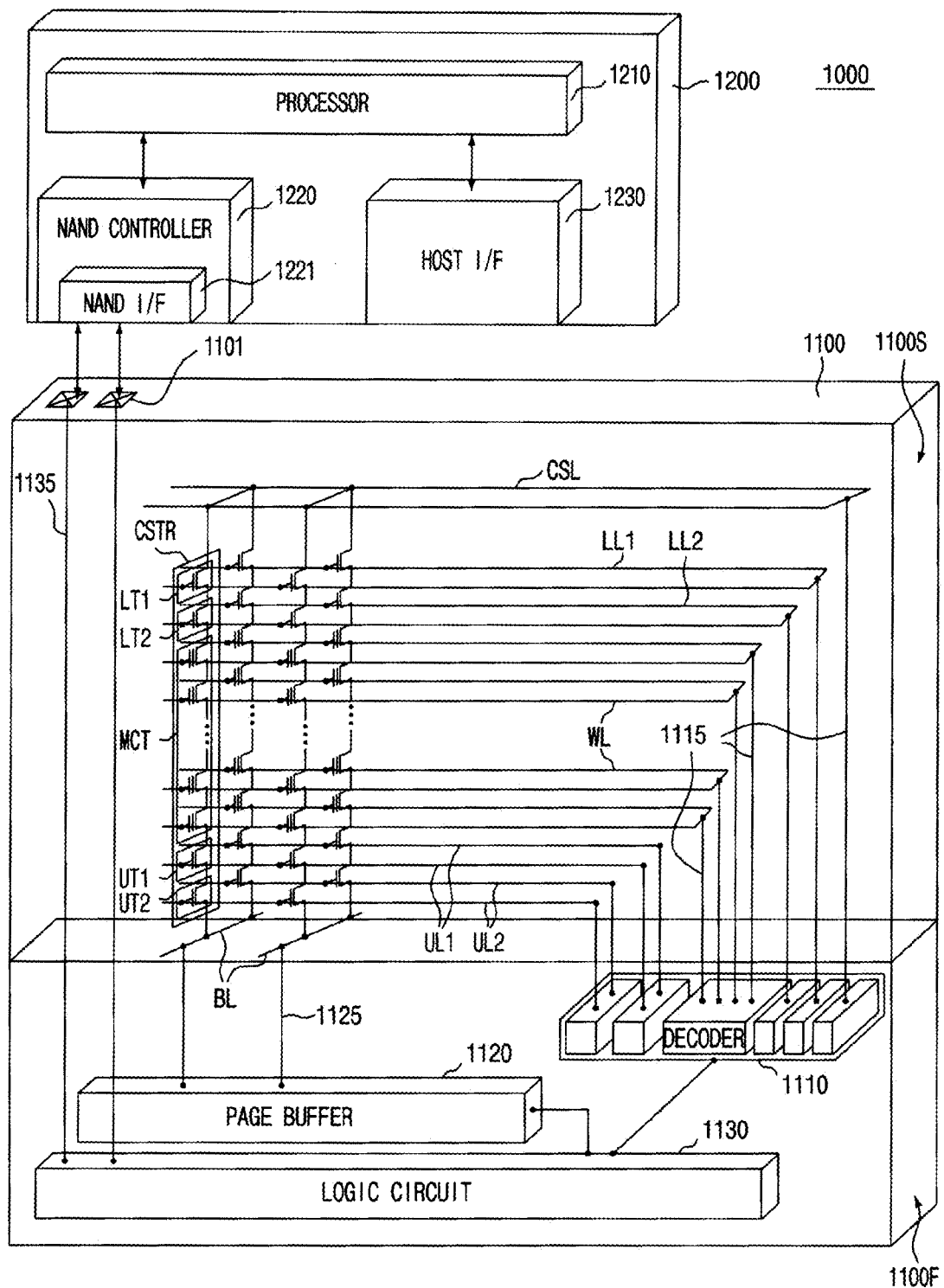
FIG. 1 is a schematic diagram illustrating an electronic system including a semiconductor device in accordance with some example embodiments.

FIG. 1 is a schematic diagram illustrating an electronic system including a semiconductor device in accordance with some example embodiments.

Referring to FIG. 1, an electronic system 1000 may include a semiconductor device 1100 and a controller 1200 electrically connected to the semiconductor device 1100. The electronic system 1000 may be a storage device including one or a plurality of semiconductor devices 1100 or an electronic device including a storage device. For example, the electronic system 1000 may be or may include at least one of a solid state drive (SSD) device, a universal serial bus (USB), a computing system, a medical device, or a communication device that may include one or a plurality of semiconductor devices 1100.

The semiconductor device 1100 may be or may include a non-volatile memory device, for example, a NAND flash memory device that will be illustrated with reference to FIGS. 43 to 54. The semiconductor device 1100 may include a first structure 1100F and a second structure 1100S on the first structure 1100F. In the drawings, the first structure 1100F is under the second structure 1100S, however, inventive concepts may not be limited thereto, and the first structure 1100F may be beside, e.g. adjacent to or partially adjacent to or sharing a portion of a common border, or may be on the second structure 1100S. The first structure 1100F may be or may include a peripheral circuit structure including a decoder circuit 1110, a page buffer 1120, and a logic circuit 1130. The second structure 1100S may be or may include a memory cell structure including a bit line BL, a common source line CSL, word lines WL, first and second upper gate lines UL1 and UL2, first and second lower gate lines LL1 and LL2, and memory cell strings CSTR between the bit line BL and the common source line CSL.

In the second structure 1100S, each of the memory cell strings CSTR may include lower transistors LT1 and LT2 adjacent to the common source line CSL, upper transistors UT1 and UT2 adjacent to the bit line BL, and a plurality of memory cell transistors MCT between the lower transistors LT1 and LT2 and the upper transistors UT1 and UT2. The number of the lower transistors LT1 and LT2 and the number of the upper transistors UT1 and UT2 may be varied in accordance with some example embodiments. The lower transistors LT1 and LT2 and/or the upper transistors UT1 and UT2 may be MOSFET transistors such as NMOS transistors and/or PMOS transistors, and may include planar transistors and/or three-dimensional transistors; however, example embodiments are not limited thereto.

In some example embodiments, the upper transistors UT1 and UT2 may include string selection transistors, and the lower transistors LT1 and LT2 may include ground selection transistors. The lower gate lines LL1 and LL2 may be or correspond to gate electrodes of the lower transistors LT1 and LT2, respectively. The word lines WL may be or correspond to gate electrodes of the memory cell transistors MCT, respectively, and the upper gate lines UL1 and UL2 may be or correspond to gate electrodes of the upper transistors UT1 and UT2, respectively.

In some example embodiments, the lower transistors LT1 and LT2 may include a lower erase control transistor LT1 and a ground selection transistor LT2 that may be connected with each other in serial, e.g. may have their source/drain regions connected to or directly connected to each other. The upper transistors UT1 and UT2 may include a string selection transistor UT1 and an upper erase control transistor UT2. At least one of the lower erase control transistor LT1 and the upper erase control transistor UT2 may be used in an erase operation for erasing data stored in the memory cell transistors MCT through a gate induced drain leakage (GIDL) phenomenon.

The common source line CSL, the first and second lower gate lines LL1 and LL2, the word lines WL, and the first and second upper gate lines UL1 and UL2 may be electrically connected to the decoder circuit 1110 through first connection wirings 1115 extending to the second structure 1110S in the first structure 1100F. The bit lines BL may be electrically connected to the page buffer 1120 through second connection wirings 1125 extending to the second structure 1100S in the first structure 1100F.

In the first structure 1100F, the decoder circuit 1110 and the page buffer 1120 may perform a control operation for at least one selected memory cell transistor among the plurality of memory cell transistors MCT. The decoder circuit 1110 and the page buffer 1120 may be controlled by the logic circuit 1130. The semiconductor device 1100 may communicate with the controller 1200 through an input/output pad 1101 that is electrically connected to the logic circuit 1130. The input/output pad 1101 may be electrically connected to the logic circuit 1130 through an input/output connection wiring 1135 extending to the second structure 1100S in the first structure 1100F.

The controller 1200 may include a processor 1210, a NAND controller 1220, and a host interface 1230. The electronic system 1000 may include a plurality of semiconductor devices 1100, and in this case, the controller 1200 may control the plurality of semiconductor devices 1100.

The processor 1210 may control operations of the electronic system 1000 including the controller 1200. The processor 1210 may be operated by firmware; however, example embodiments are not limited thereto. The processor 1210 and may control the NAND controller 1220 to access the semiconductor device 1100. The NAND controller 1220 may include a NAND interface 1221 for communicating with the semiconductor device 1100. Through the NAND interface 1221, communication such as at least one of control commands for controlling the semiconductor device 1100, data to be written in the memory cell transistors MCT of the semiconductor device 1100, data to be read from the memory cell transistors MCT of the semiconductor device 1100, etc., may be transferred. The host interface 1230 may provide communication between the electronic system 1000 and an outside host. When a control command is received from the outside host through the host interface 1230, the processor 1210 may control the semiconductor device 1100 in response to the control command.

Figure 2:
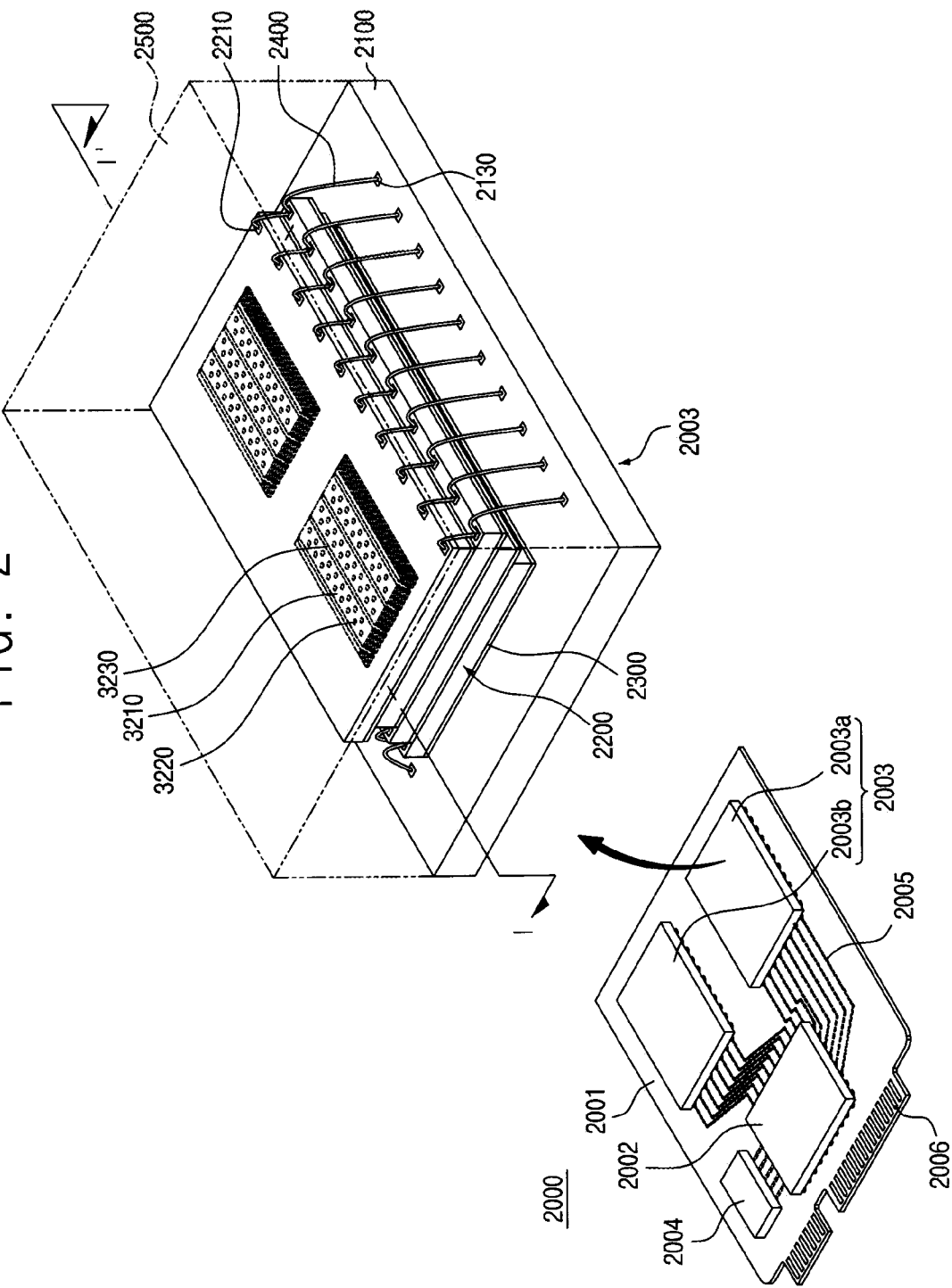
FIG. 2 is a schematic perspective view illustrating an electronic system including a semiconductor device in accordance with some example embodiments.

FIG. 2 is a schematic perspective view illustrating an electronic system including a semiconductor device in accordance with some example embodiments.

Referring to FIG. 2, an electronic system 2000 may include a main substrate 2001, a controller 2002 mounted on the main substrate 2001, at least one semiconductor package 2003, and a buffer such as a dynamic random access memory (DRAM) device 2004. The semiconductor package 2003 and the DRAM device 2004 may be connected to the controller 2002 by wiring patterns 2005 on the main substrate 2001.

The main substrate 2001 may include a connector 2006 having a plurality of pins connected to an outside host. The number and/or the layout of the plurality pins in the connector 2006 may be changed depending on a communication interface between the electronic system 2000 and the outside host. In some example embodiments, the electronic system 2000 may communicate with the outside host according to at least one of a USB, peripheral component interconnect express (PCI-Express), serial advanced technology attachment (SATA), M-Phy for universal flash storage (UFS), etc. In some example embodiments, the electronic system 2000 may be operated by power source provided from the outside host through the connector 2006. The electronic system 2000 may further include power management integrated circuit (PMIC) for distributing the power source provided from the outside host to the controller 2002 and the semiconductor package 2003.

The controller 2002 may write data in the semiconductor package 2003 and/or read data from the semiconductor package 2003, and may enhance the operation speed of the electronic system 2000.

The DRAM device 2004 may be or correspond to or include a buffer memory for reducing the speed difference between the semiconductor package 2003 for storing data and the outside host. The DRAM device 2004 included in the electronic system 2000 may serve as a cache memory, and/or may provide a space for temporarily storing data during the control operation for the semiconductor package 2003. If the electronic system 2000 includes the DRAM device 2004, the controller 2002 may further include a DRAM controller for controlling the DRAM device 2004 in addition to the NAND controller for controlling the semiconductor package 2003.

The semiconductor package 2003 may include first and second semiconductor packages 2003a and 2003b spaced apart from each other. The first and second semiconductor packages 2003a and 2003b may be semiconductor packages each of which may include a plurality of semiconductor chips 2200, e.g. may include the same or different number of semiconductor chips 2200. Each of the first and second semiconductor packages 2003a and 2003b may include a package substrate 2100, the semiconductor chips 2200, bonding layers 2300 disposed under the semiconductor chips 2200, a connection structure 2400 for electrically connecting the semiconductor chips 2200 and the package substrate 2100, and a mold layer 2500 covering the semiconductor chips 2200 and the connection structure 2400 on the package substrate 2100.

The package substrate 2100 may be or include a printed circuit board (PCB) including package upper pads 2130. Each semiconductor chip 2200 may include an input/output pad 2210. The input/output pad 2210 may correspond to the input/output pad 1101 of FIG. 1. Each semiconductor chip 2200 may include gate electrode structures 3210, memory channel structures 3220 extending through the gate electrode structures 3210, and division structures 3230 for dividing the gate electrode structures 3210. Each semiconductor chip 2200 may include a semiconductor device that will be illustrated with reference to FIGS. 43 to 54.

In some example embodiments, the connection structure 2400 may be or include a bonding wire for electrically connecting the input/output pad 2210 and the package upper pads 2130. Thus, in each of the first and second semiconductor packages 2003a and 2003b, the semiconductor chips 2200 may be electrically connected with each other by a bonding wire method, and may be electrically connected to the package upper pads 2130 of the package substrate 2100. Alternatively or additionally, in each of the first and second semiconductor packages 2003a and 2003b, the semiconductor chips 2200 may be electrically connected with each other by a connection structure including a through silicon via (TSV), instead of or in addition to the connection structure 2400 of the bonding wire method.

In some example embodiments, the controller 2002 and the semiconductor chips 2200 may be included in one package. In some example embodiments, the controller 2002 and the semiconductor chips 2200 may be mounted on an interposer substrate different from the main substrate 2001, and the controller 2002 and the semiconductor chips 2200 may be connected with each other by a wiring on the interposer substrate.

Figure 3:
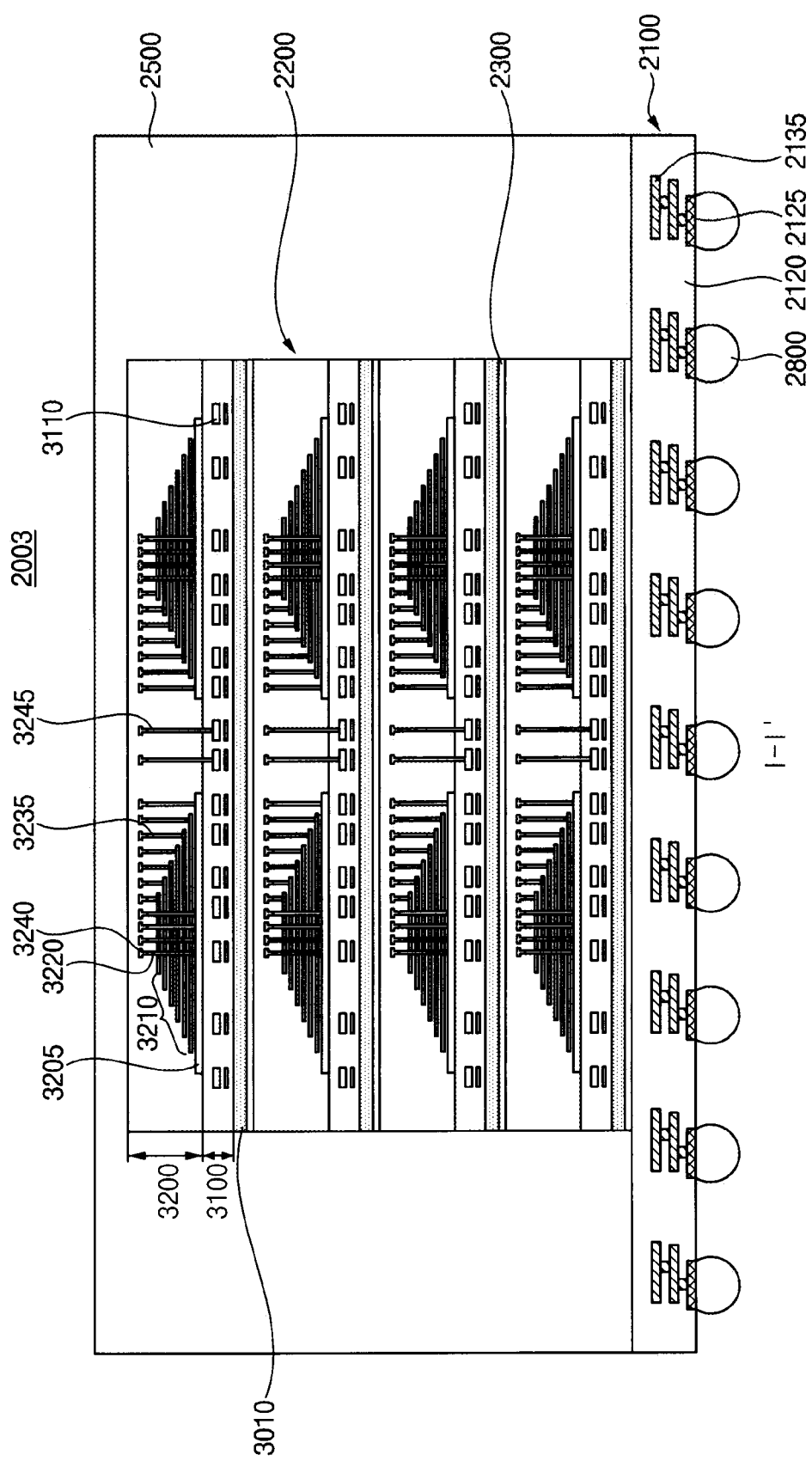
FIGS. 3 and 4 are schematic cross-sectional views illustrating semiconductor packages each of which may include a semiconductor device in accordance with some example embodiments.
Figure 4:
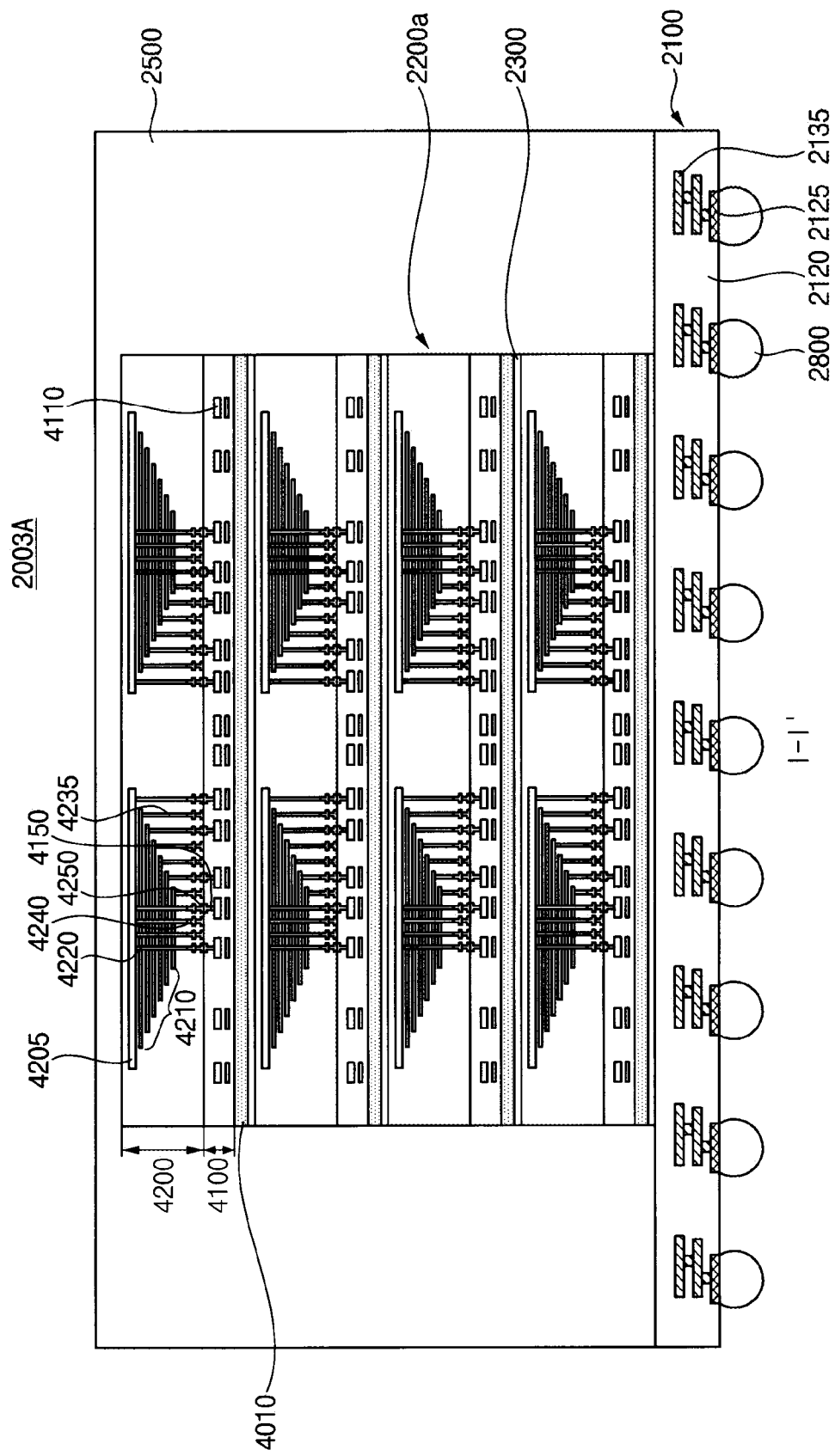

FIGS. 3 and 4 are schematic cross-sectional views illustrating semiconductor packages each of which may include a semiconductor device in accordance with some example embodiments. FIGS. 3 and 4 illustrate some example embodiments of the semiconductor package 2003 shown in FIG. 2, and show a cross-section taken along a line I-I' of the semiconductor package 2003 in FIG. 2.

Referring to FIG. 3, in the semiconductor package 2003, the package substrate 2100 may be or may include a PCB. The package substrate 2100 may include a substrate body part 2120, upper pads 2130 (as indicated in FIG. 2) on an upper surface of the substrate body part 2120, lower pads 2125 on a lower surface of the substrate body part 2120 or exposed through the lower surface of the substrate body part 2120, and inner wirings 2135 for electrically connecting the upper pads 2130 and the lower pads 2125 in an inside of the substrate body part 2120. The upper pads 2130 may be electrically connected to the connection structures 2400. The lower pads 2125 may be connected to wiring patterns 2005 of the main substrate 2010 in the electronic system 2000 through conductive connection parts 2800, as shown in FIG. 2.

Each semiconductor chip 2200 may include a semiconductor substrate 3010, and a first structure 3100 and a second structure 3200 sequentially stacked on the semiconductor substrate 3010. The first structure 3100 may include a peripheral circuit region in which peripheral circuit wirings 3110 may be formed. The second structure 3200 may include a common source line 3205, a gate electrode structure 3210 on the common source line 3205, memory channel structures 3220 and division structures 3230 (refer to FIG. 2) extending through the gate electrode structure 3210, bit lines 3240 electrically connected to the memory channel structures 3220, and gate connection wirings 3235 electrically connected to the word lines WL of the gate electrode structure 3210 (refer to FIG. 1).

The second structure 3200 may further include a first division pattern 335 as illustrated in more detail below with reference to FIGS. 43 and 44.

Each semiconductor chip 2200 may include a through wiring 3245 being electrically connected to the peripheral circuit wirings 3110 of the first structure 3100 and extending in the second structure 3200. The through wiring 3245 may be disposed at an outside of the gate electrode structure 3210, and at least some through wirings 3245 may extend through the gate electrode structure 3210. Each semiconductor chip 2200 may further include the input/output pad 2210 (refer to FIG. 2) electrically connected to the peripheral circuit wirings 3110 of the first structure 3100.

Referring to FIG. 4, in a semiconductor package 2003A, each semiconductor chip 2200a may include a semiconductor substrate 4010, a first structure 4100 on the semiconductor substrate 4010, and a second structure 4200 on and bonded with the first structure 4100 by a wafer bonding method.

The first structure 4100 may include a peripheral circuit region in which a peripheral circuit wiring 4110 and first bonding structures 4150 are formed. The second structure 4200 may include a common source line 4205, a gate electrode structure 4210 between the common source line 4205 and the first structure 4100, memory channel structures 4220 and the division structure 3230 (refer to FIG. 2) extending through the gate electrode structure 4210, and second bonding structures 4250 electrically connected to the memory channel structures 4220 and the word lines WL (refer to FIG. 1) of the gate electrode structure 4210. For example, the second bonding structures 4250 may be electrically connected to the memory channel structures 4220 and the word lines WL (refer to FIG. 1) through the bit lines 4240 electrically connected to the memory channel structures 4220 and the gate connection wirings 4235 electrically connected to the word lines WL (refer to FIG. 1), respectively. The first bonding structures 4150 of the first structure 4100 and the second bonding structures 4250 of the second structure 4200 may contact each other to be bonded with each other. The first bonding structures 4150 and the second bonding structures 4250 may include a conductive material such as a metal, such as at least one of copper, aluminum, tungsten, or gold, and/or an alloy thereof.

The second structure 4200 may further include the first to third support structures 432, 434 and 436 as shown in FIGS. 11 to 13, FIGS. 43 and 44 described below in more detail.

Each semiconductor chip 2200a may further include the input/output pad 2210 (refer to FIG. 2) electrically connected to the peripheral circuit wirings 4110 of the first structure 4100.

The semiconductor chips 2200 of FIG. 3 and the semiconductor chips 2200a of FIG. 4 may be electrically connected with each other by the connection structures 2400 in a bonding wire method. However, in some example embodiments, semiconductor chips such as the semiconductor chips 2200 of FIG. 3 and the semiconductor chips 2200a of FIG. 4 in the same semiconductor package may additionally or alternatively be electrically connected with each other by a connection structure including a TSV.

FIGS. 5 to 49 are plan views and cross-sectional views illustrating a method of manufacturing/fabricating a vertical memory device in accordance with some example embodiments. Particularly, FIGS. 5-6, 9, 11-12, 17, 21, 30, 37, 40 and 43-44 are the plan views, and the FIGS. 7-8, 10, 13-16, 18-20, 22-29, 31-36, 41-42 and 45-49 are the cross-sectional views.

Figure 17:
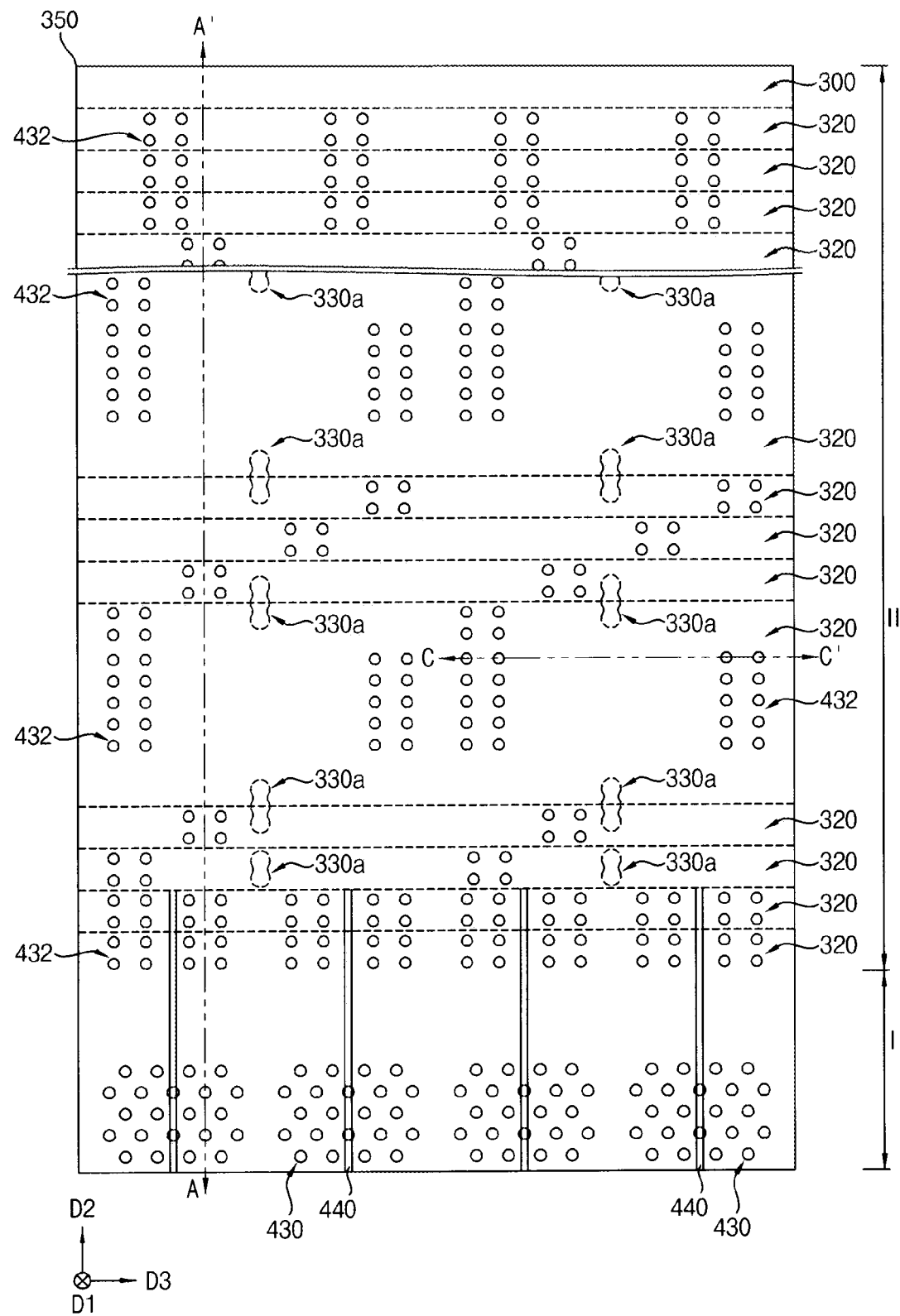
Figure 18:
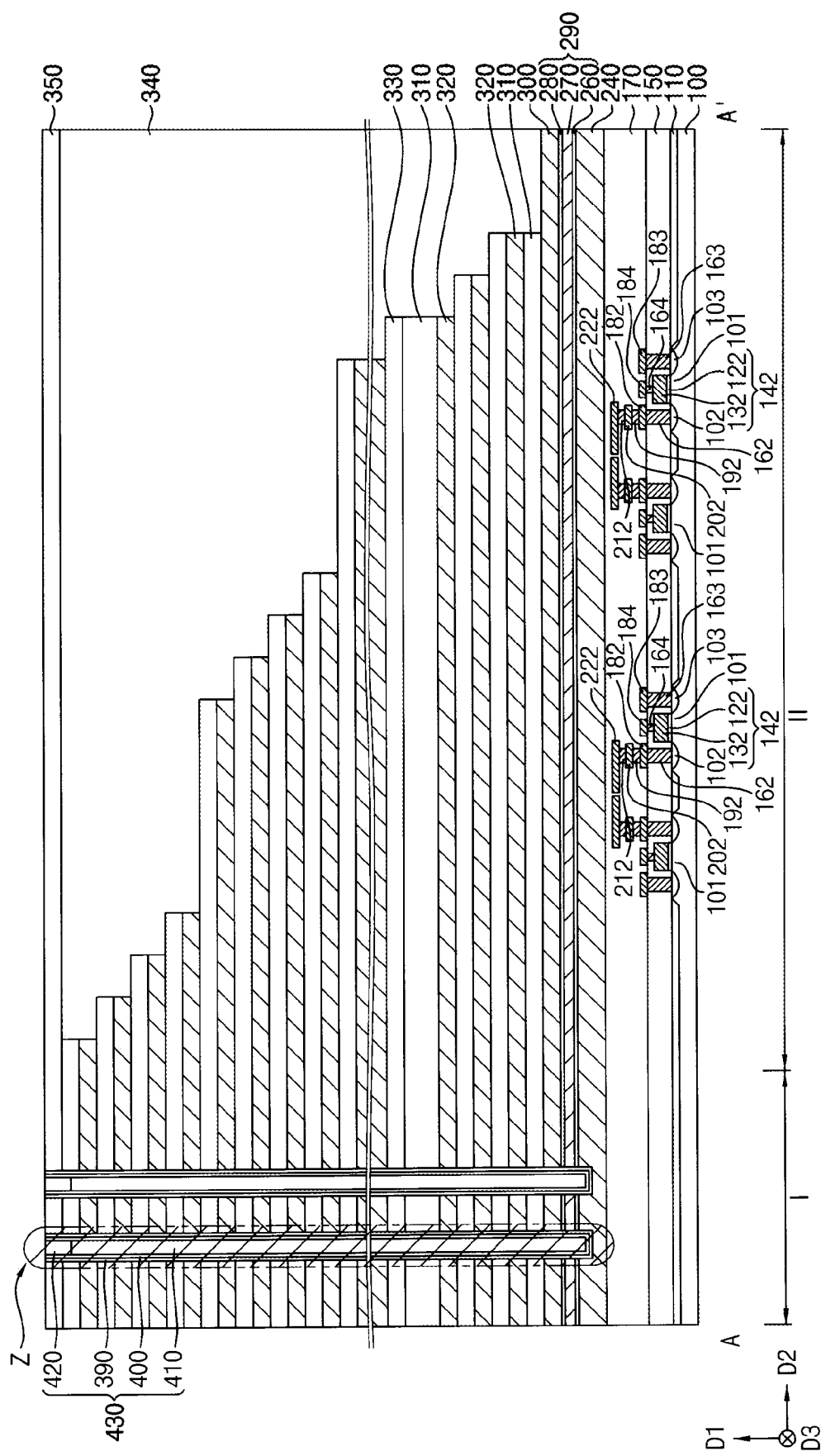
Figure 19:
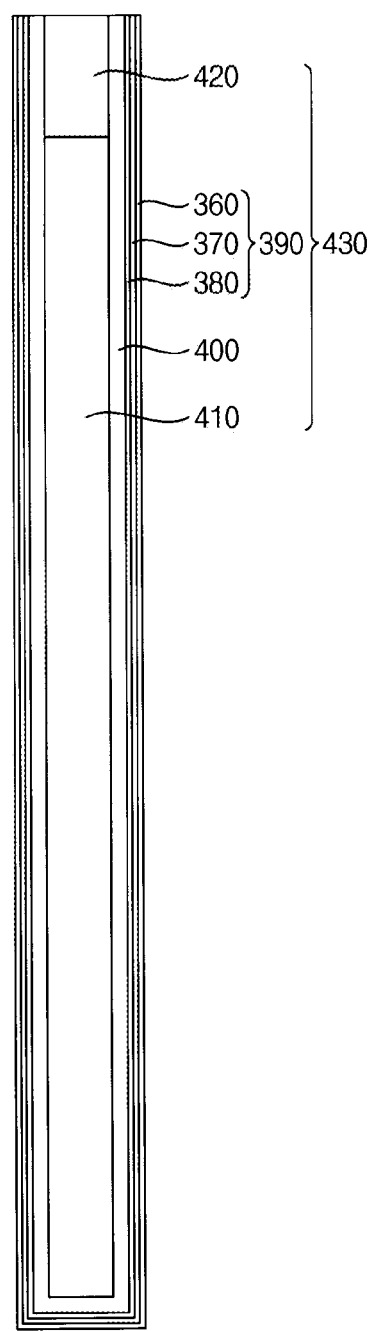
Figure 20:
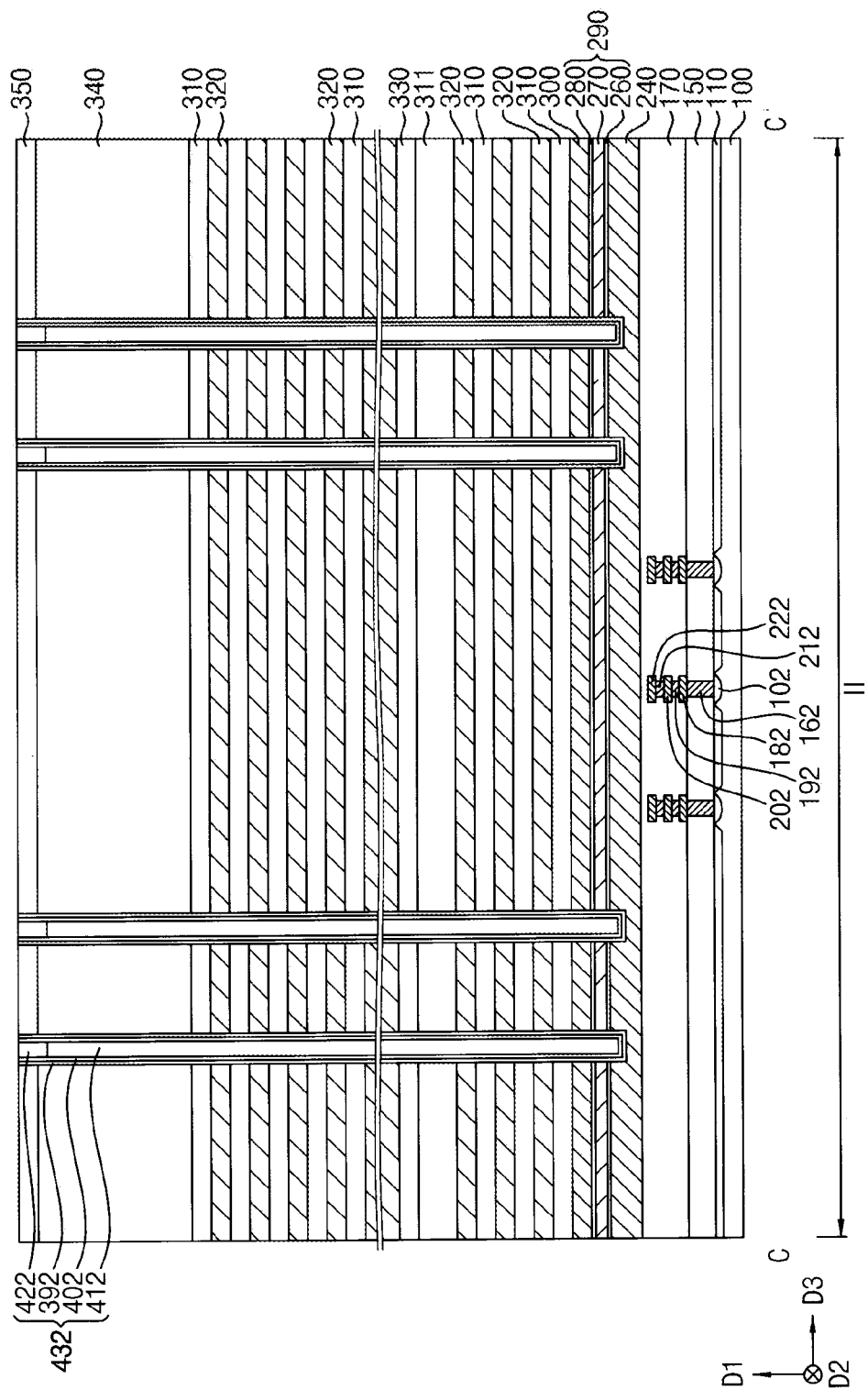
Figure 21:
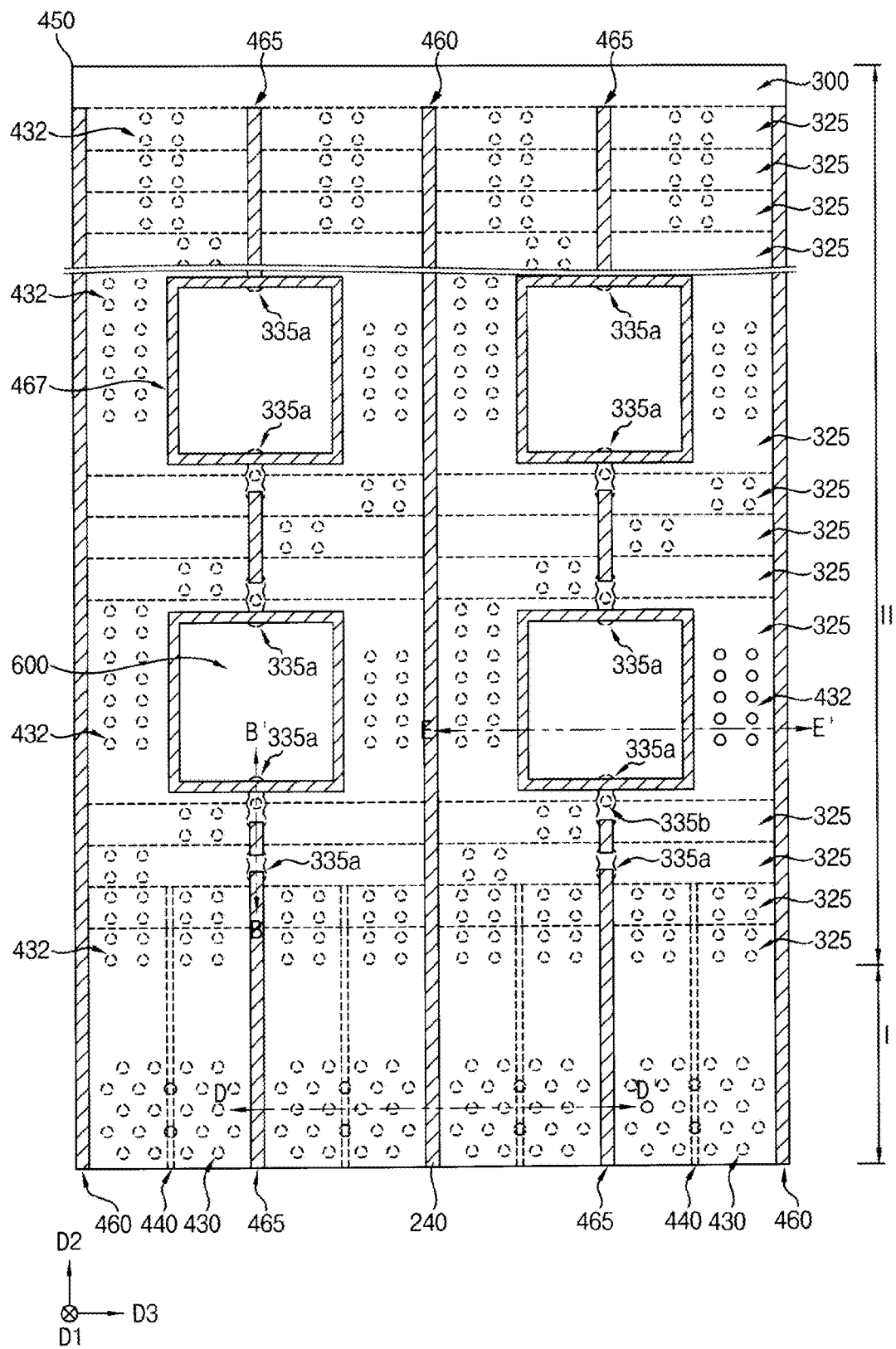
Figure 22:
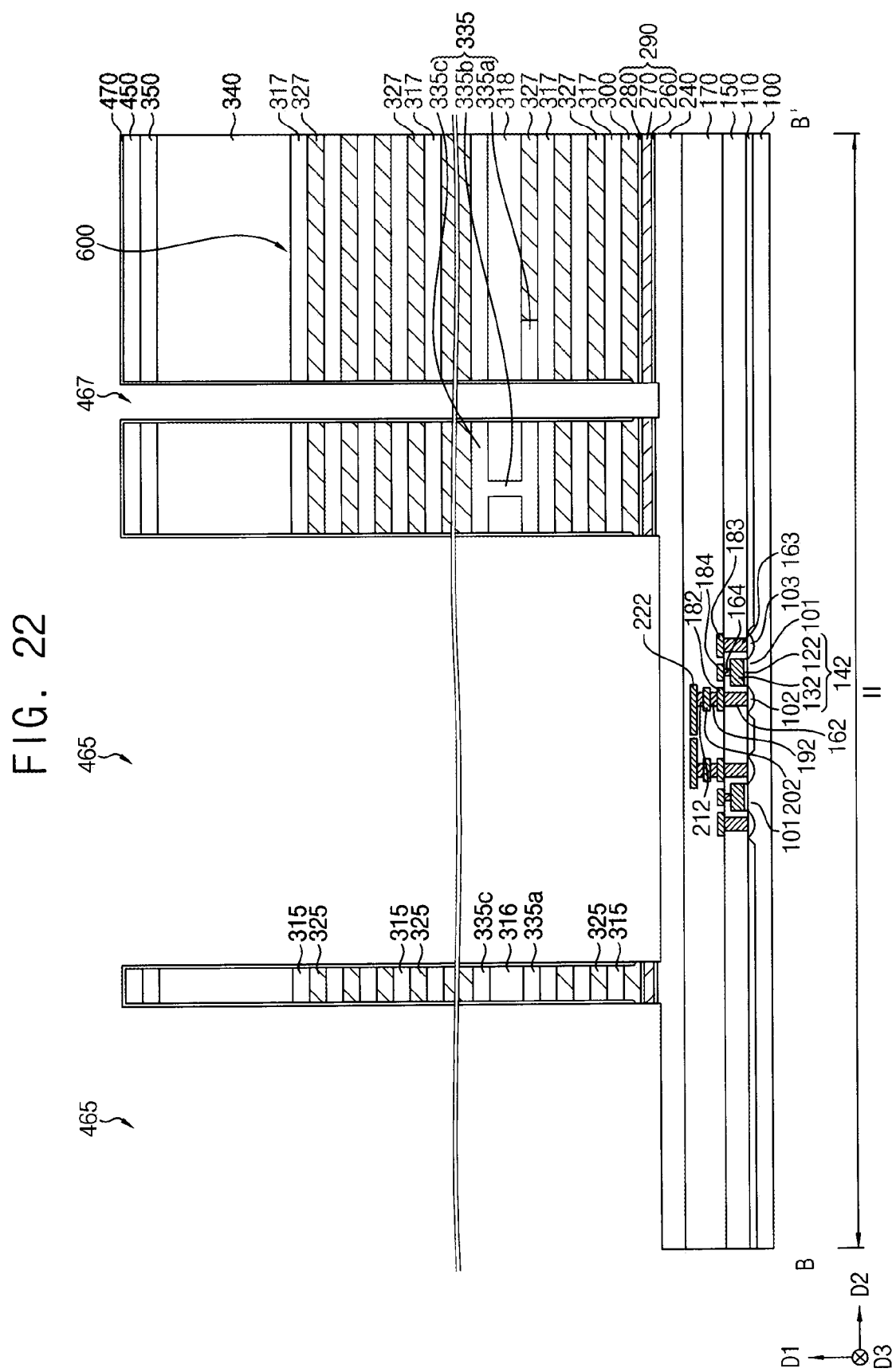
Figure 40:
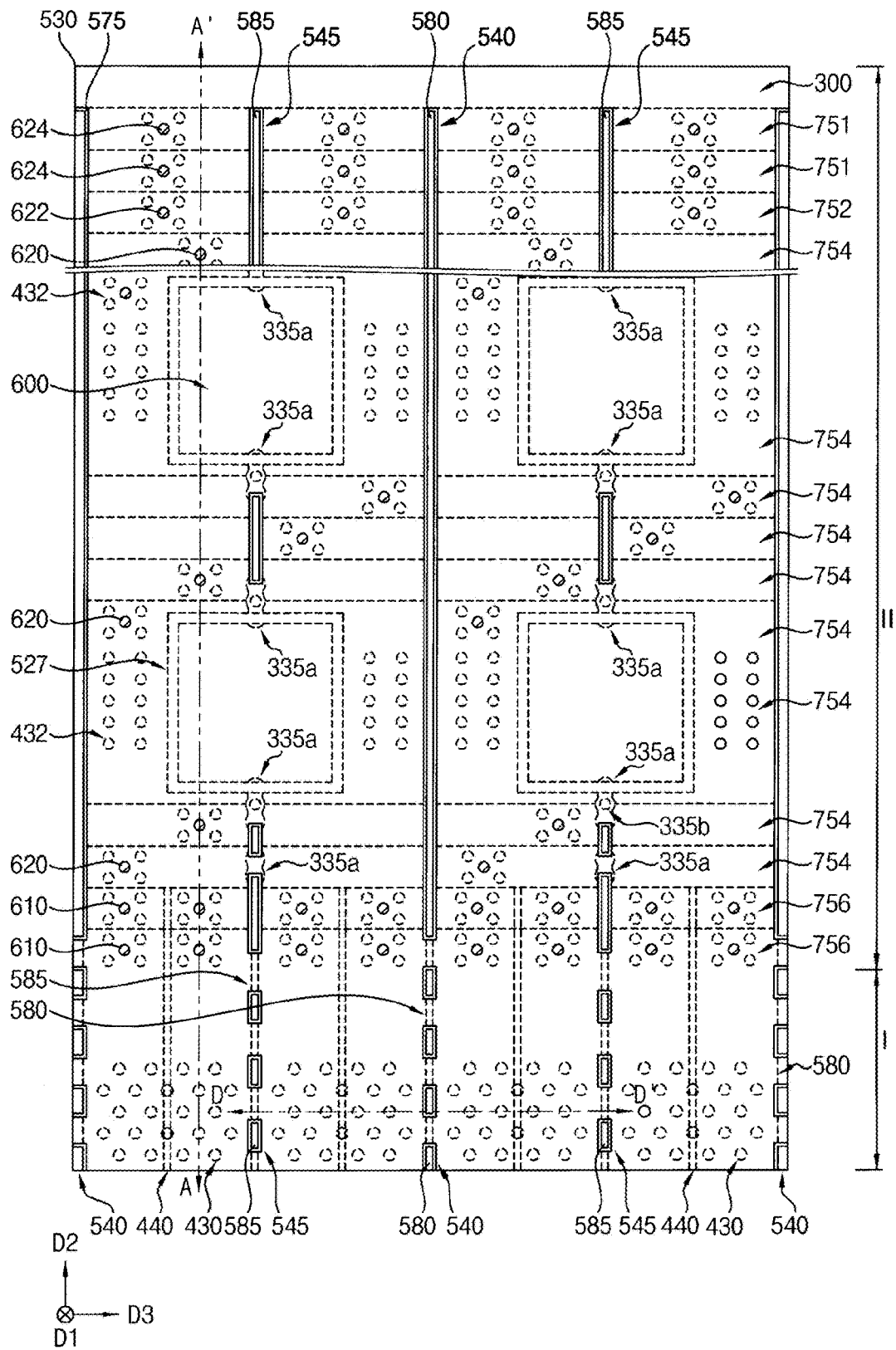
Figure 41:
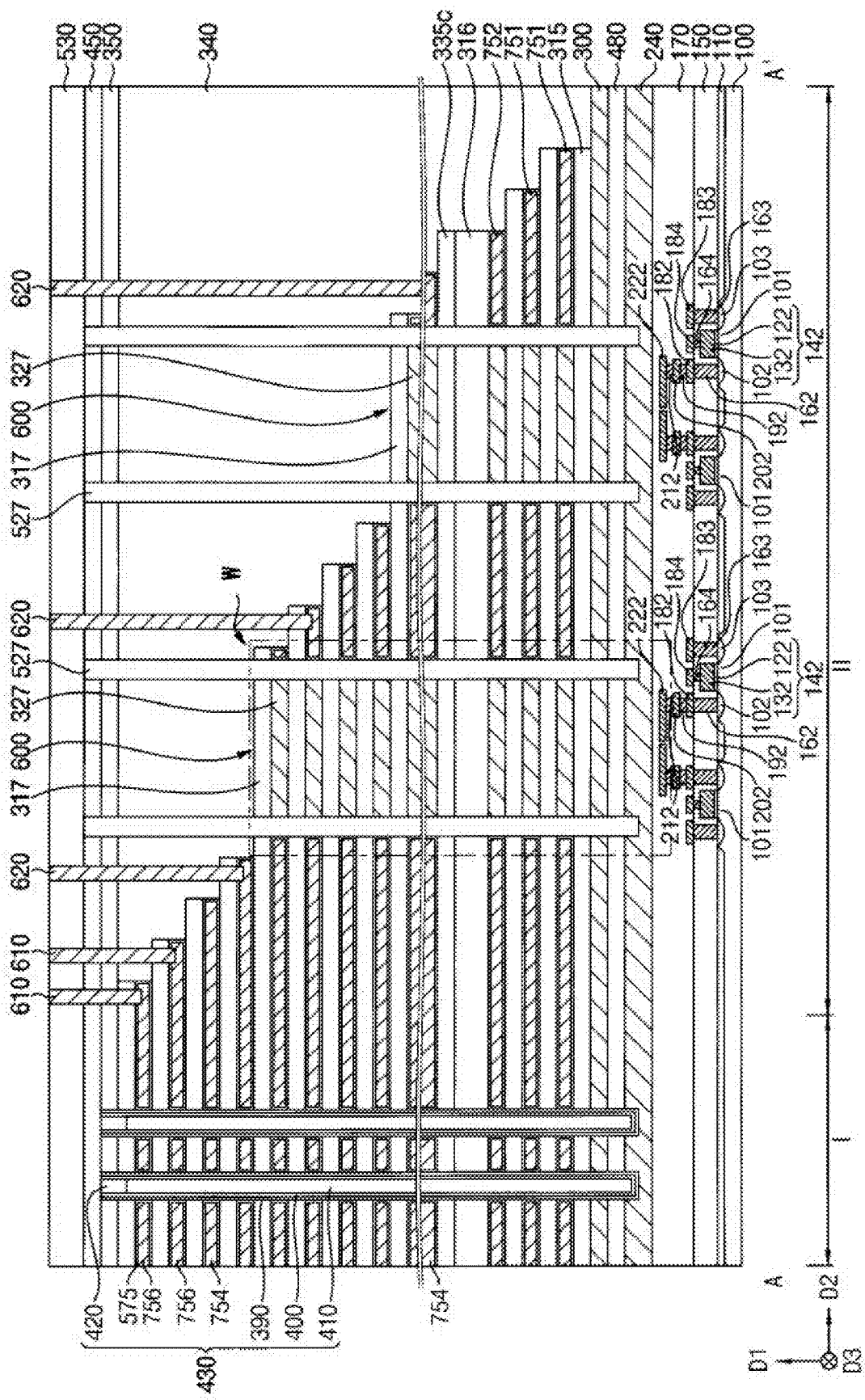
Figure 42:
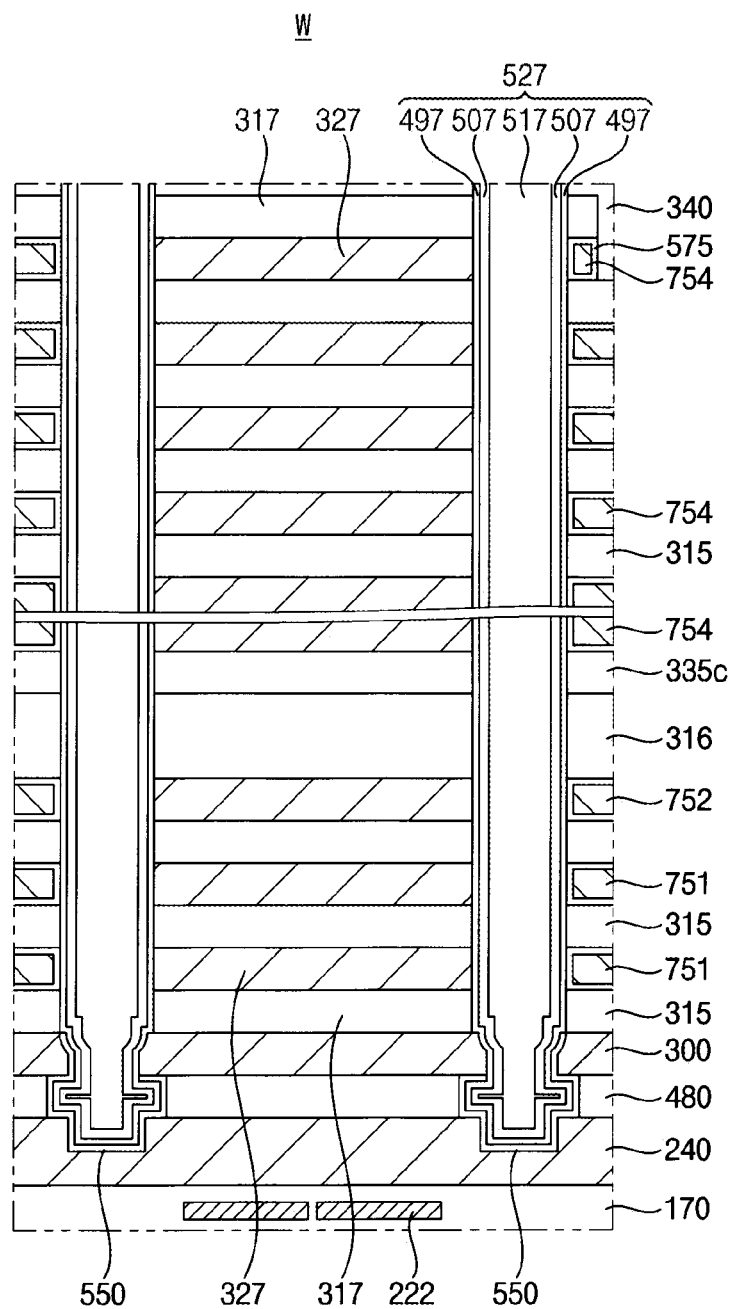

FIGS. 7-8, 16, 18-19, 41-42, 45 and 46 are cross-sectional views taken along lines A-A', respectively, of corresponding plan views, FIGS. 10, 13-15, 22, 28 and 47 are cross-sectional views taken along lines B-B', respectively, of corresponding plan views, FIG. 20 is a cross-sectional view taken along line C-C' of a corresponding plan view, and FIGS. 23, 25-27, 31-33, 35, 38 and 48 are cross-sectional views taken along lines D-D' of corresponding plan views, respectively, and FIGS. 24, 29, 34, 36, 39 and 49 are cross-sectional views taken along lines E-E' of corresponding plan views, respectively. FIGS. 6 to 49 are drawings of region X in FIG. 5, FIGS. 12 and 44 are enlarged cross-sectional views of region Y in FIGS. 11 and 43, respectively, and FIG. 19 is an enlarged cross-sectional view of region Z in FIG. 18, and FIG. 42 is an enlarged cross-sectional view of region W in FIG. 41.

Hereinafter, although not necessarily in the claims, a direction substantially perpendicular to an upper surface of a first substrate may be defined as a first direction D1, and two directions substantially parallel to the upper surface of the first substrate and crossing each other may be defined as second and third directions D2 and D3, respectively. In some example embodiments, the second and third directions D2 and D3 may be perpendicular or substantially perpendicular to each other.

Figure 5:
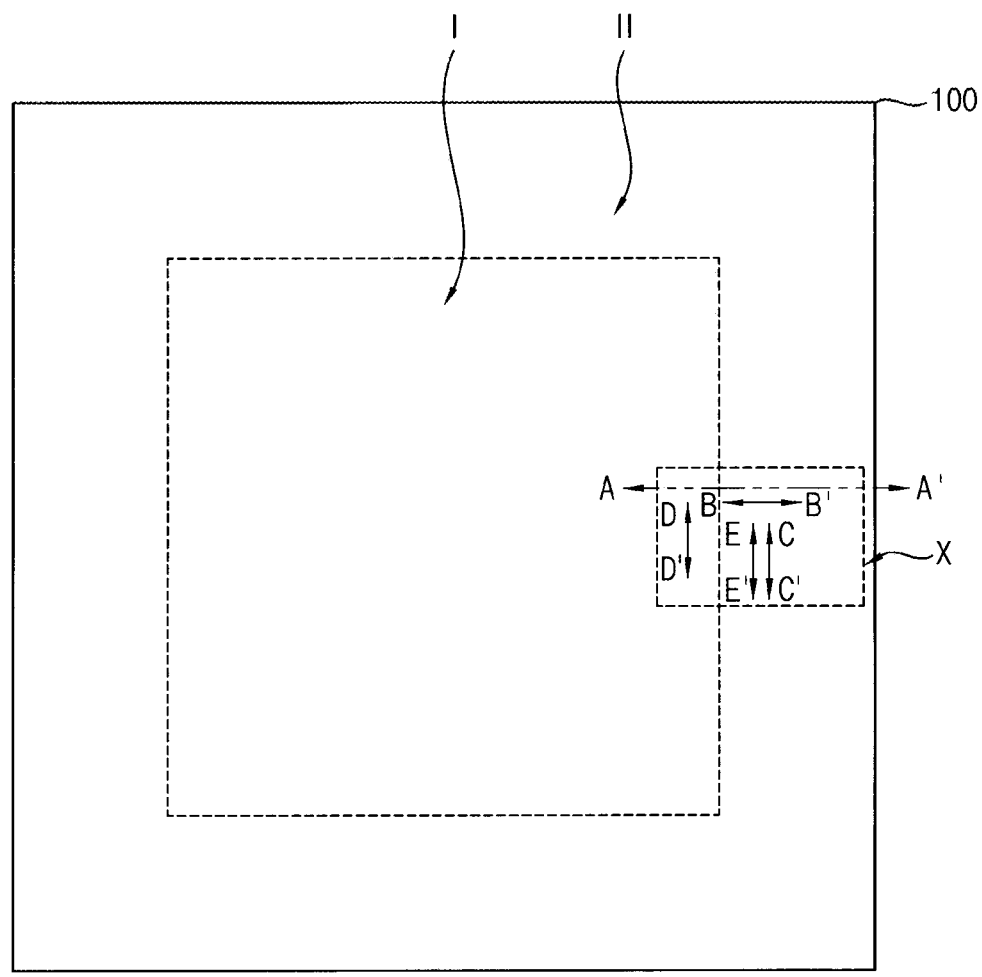
FIGS. 5 to 49 are plan views and cross-sectional views illustrating a method of manufacturing a vertical memory device in accordance with some example embodiments.

Referring to FIG. 5, a substrate 100 may include a first region I and a second region II surrounding the first region I.

The substrate 100 may include at least one of silicon, germanium, silicon-germanium or a III-V compound such as GaP, GaAs, GaSb, etc., and may be in single-crystal or polycrystalline phase. In some example embodiments, the substrate 100 may be or include a silicon-on-insulator (SOI) substrate and/or a germanium-on-insulator (GOI) substrate. In some example embodiments, the substrate 100 may be doped, e.g. lightly doped, with p-type impurities, e.g., boron or n-type impurities, e.g., phosphorus and/or arsenic.

In some example embodiments, the first region I may be or correspond to a cell array region, the second region II be a pad region or extension region, and the first and second cell regions I and II together may form a cell region. For example, memory cells each of which may include a gate electrode, a channel, and a charge storage structure may be formed on the first region I of the substrate 100, and upper contact plugs for transferring electrical signals to the memory cells and pads of the gate electrodes contacting the upper contact plugs may be formed on the second region II of the substrate 100. In the drawings, the second region II entirely surrounds the first region I, however, inventive concepts may not be limited thereto. For example, the second region II may be formed only on each of opposite sides in the second direction D2 of the first region I. Additionally in the drawings, the first region I is in a center of the second region II; however, example embodiments are not limited thereto. Additionally in the drawings, each of the first region I and the second region II are illustrated as square-shaped; however, example embodiments are not limited thereto.

The substrate 100 may further include a third region surrounding the second region II, and upper circuit patterns for applying electrical signals to the memory cells through the upper contact plugs may be formed on the third region of the substrate 100.

Hereinafter, only structures bounded by X partially including the first and second regions I and II of the substrate 100 will be illustrated.

Figure 6:
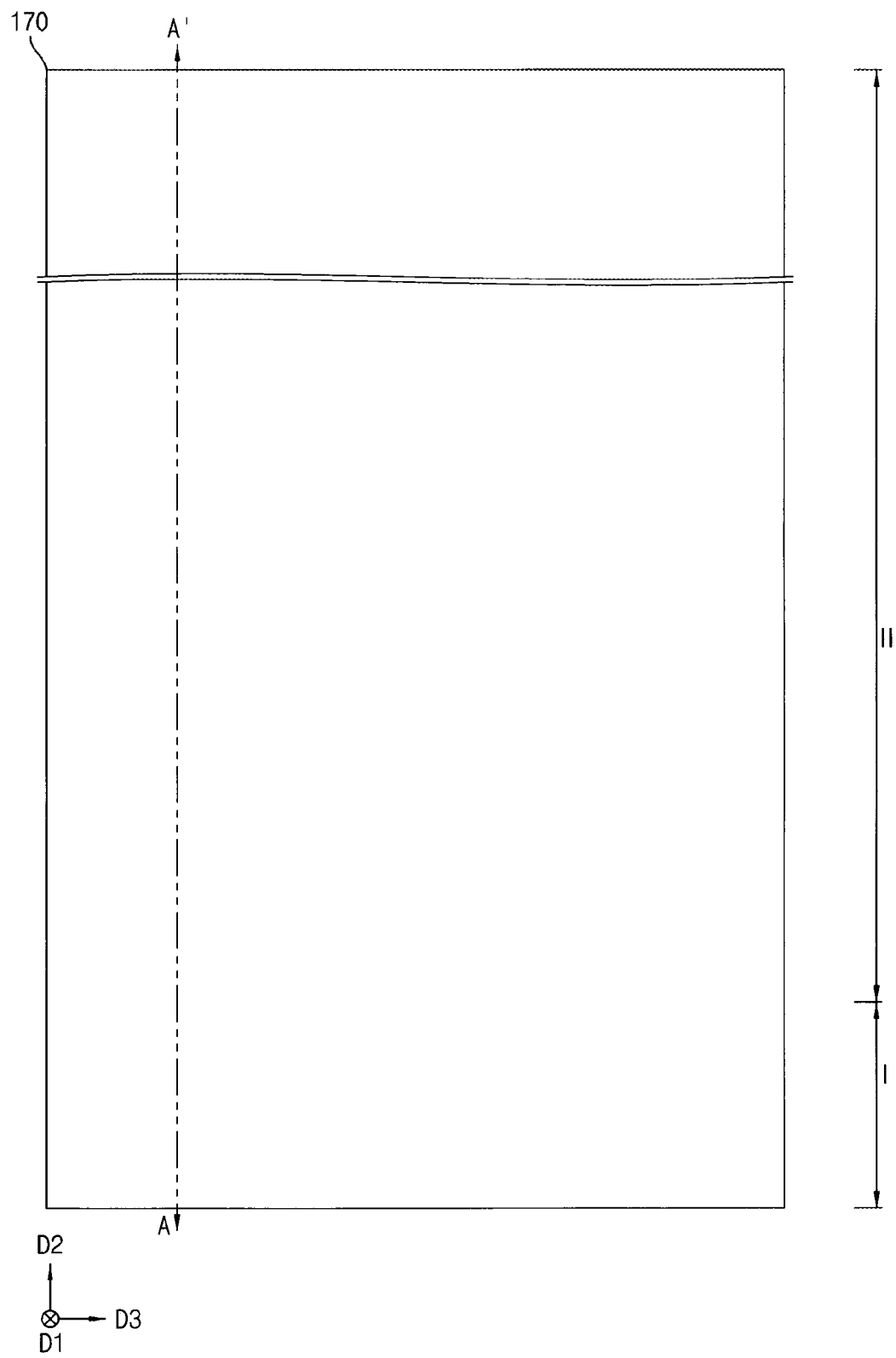
Figure 7:
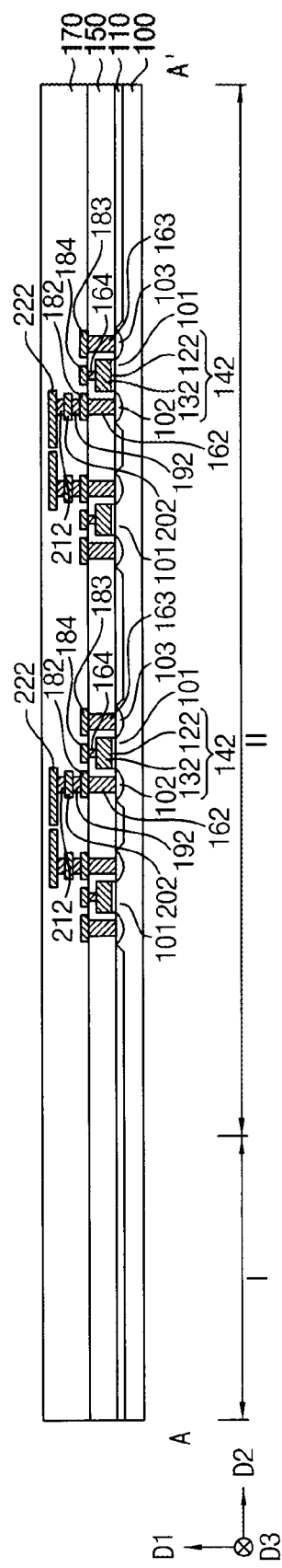

Referring to FIGS. 6 and 7, lower circuit patterns may be formed on the substrate 100, and first and second insulating interlayers 150 and 170 may be formed on the substrate 100 to cover the lower circuit patterns.

The substrate 100 may include a field region on which an isolation pattern 110 is formed and an active region 101 on which no isolation pattern is formed. The isolation pattern 110 may be formed by a shallow trench isolation (STI) process and/or a high-density plasma (HDP) deposition process and/or a spin-on glass (SOG) process, and may include an oxide, e.g., silicon oxide.

In some example embodiments, the semiconductor device may have a cell over periphery (COP) structure. For example, the lower circuit patterns may be formed on the substrate 100, and memory cells, upper contact plugs, and upper circuit patterns may be formed over the lower circuit patterns.

The lower circuit patterns may include, e.g., transistors, lower contact plugs, lower wirings, lower vias, interlayer insulating films, etc.

Figure 23:
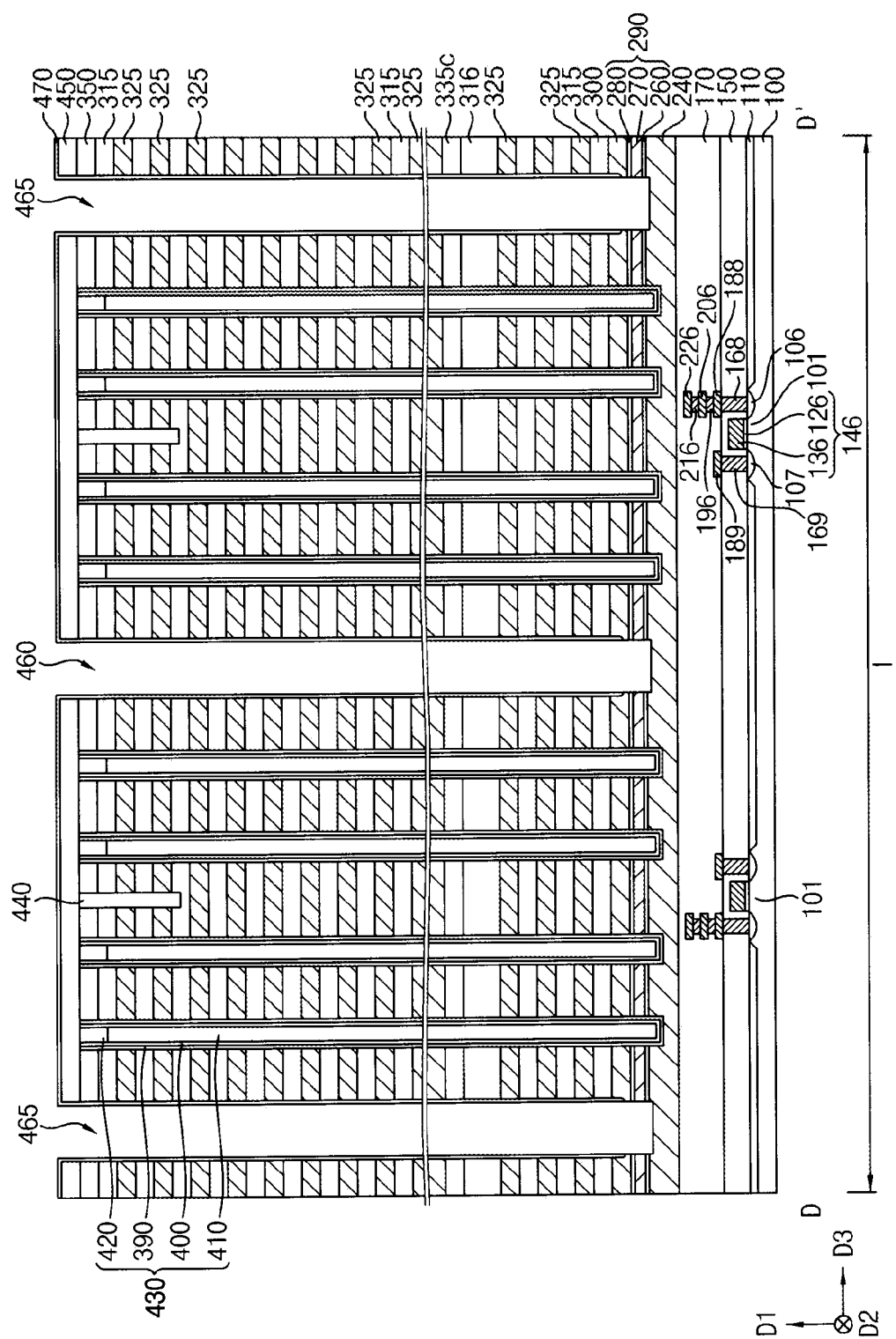
Figure 24:
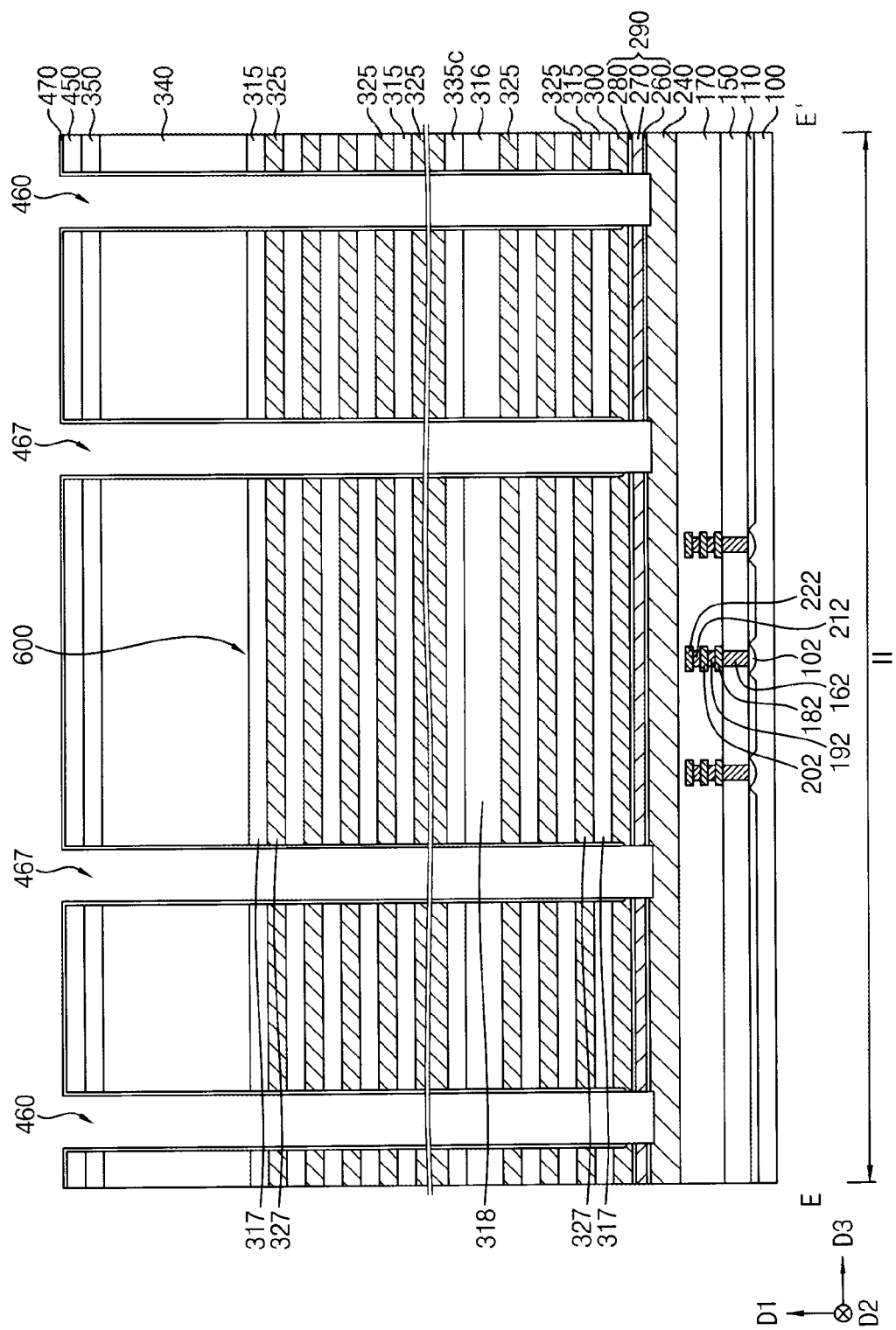

Referring to FIG. 23 together with FIGS. 6 and 7, for example, first and second transistors may be formed on the second and first regions II and I, respectively, of the substrate 100. The first transistor may include a first lower gate structure 142 on the substrate 100 and first and second regions 102 and 103 serving as/corresponding to source/ drain regions at upper portions of the active region 101 adjacent to the first lower gate structure 142, and the second transistor may include a second lower gate structure 146 on the substrate 100 and third and fourth regions 106 and 107 serving as/corresponding to source/drain regions at upper portions of the active region 101 adjacent to the second lower gate structure 146. Either or both of the first transistors and the second transistors may be NMOS transistors, or either of both of the first transistors and the second transistors may be PMOS transistors, or one of the first transistor or the second transistor may be an NMOS transistor and the other of the first transistor or the second transistor may be a PMOS transistor; however, example embodiments are not limited thereto.

The first lower gate structure 142 may include a first lower gate insulation pattern 122 and a first lower gate electrode 132 sequentially stacked on the substrate 100, and the second lower gate structure 146 may include a second lower gate insulation pattern 126 and a second lower gate electrode 136 sequentially stacked on the substrate 100. The first lower gate insulation pattern 122 and/or the second lower gate insulation pattern may be or include silicon oxide; however, example embodiments are not limited thereto. Either or both of the first lower gate electrode 132 or the second lower gate electrode 136 may include a conductive material such as at least one of doped polysilicon or a metal such as tungsten; however, example embodiments are not limited thereto.

A first insulating interlayer 150 may be formed on the substrate 100 to cover the first and second transistors, and first, second, fourth and fifth lower contact plugs 162, 163, 168 and 169 extending through the first insulating interlayer 150 to contact the first to fourth impurity regions 102, 103, 106 and 107, respectively, and a third lower contact plug 164 extending through the first insulating interlayer 150 to contact the first lower gate electrode 132 may be formed. The first insulating interlayer 150 may be or may include oxide; however, example embodiments are not limited thereto. First through fifth lower contact plugs 162, 163, 168, and 169 may include doped polysilicon and/or tungsten; however, example embodiments are not limited thereto.

First to fifth lower wirings 182, 183, 184, 188 and 189 may include a metal such as aluminum and/or copper and be formed on the first insulating interlayer 150 to contact upper surfaces of the first to fifth lower contact plugs 162, 163, 164, 168 and 169, respectively. A first lower via 192, a sixth lower wiring 202, a third lower via 212 and an eighth lower wiring 222 may include a metal such as aluminum and/or copper and may be sequentially stacked on the first lower wiring 182, and a second lower via 196, a seventh lower wiring 206, a fourth lower via 216 and a ninth lower wiring 226 may include a metal such as aluminum and/or copper and may be sequentially stacked on the fourth lower wiring 188.

The second insulating interlayer 170 may be formed on the first insulating interlayer 150 to cover the first to ninth lower wirings 182, 183, 184, 188, 189, 202, 206, 222 and 226 and the first to fourth lower vias 192, 194, 212 and 216.

Each element included in the lower circuit patterns may be formed by, e.g., a patterning process and/or a damascene process.

Figure 8:
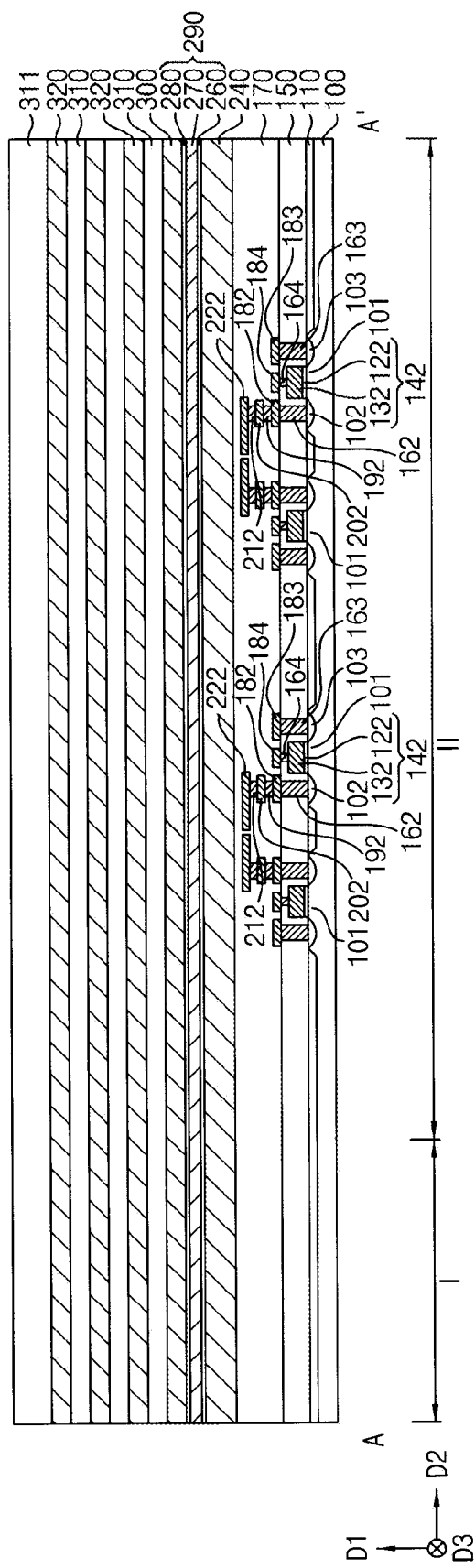

Referring to FIG. 8, a common source plate (CSP) 240, a first sacrificial layer structure 290 and a first support layer 300 may be sequentially formed on the second insulating interlayer 170.

The CSP 240 may include or consist of polysilicon doped with, e.g., n-type impurities such as at least one of arsenic or phosphorus. Alternatively, the CSP 240 may include a metal silicide layer and a polysilicon layer doped with, e.g., n-type impurities sequentially stacked. The metal silicide layer may include, e.g., tungsten silicide.

The first sacrificial layer structure 290 may include first, second and third sacrificial layers 260, 270 and 280 sequentially stacked in the first direction D1. The first and third sacrificial layers 260 and 280 may include an oxide, e.g., silicon oxide, and may not include a nitride, and the second sacrificial layer 270 may include a nitride, e.g., silicon nitride and may not include an oxide.

The first support layer 300 may include a material having an etching selectivity with respect to the first to third sacrificial layers 260, 270 and 280, e.g., polysilicon doped with n-type impurities. A portion of the first support layer 300 may extend through the first sacrificial layer structure 290 to contact an upper surface of the CSP 240, which may form a first support pattern.

A first insulation layer 310 and a fourth sacrificial layer 320 may be alternately and repeatedly stacked on the first support layer 300, and a second insulation layer 311 may be formed on an uppermost one of the fourth sacrificial layers 320. A thickness of each of the first insulation layers 310 and the fourth sacrificial layers 320 may be the same, or may different. In some example embodiments, the first insulation layers 310 and the fourth sacrificial layers 320 are formed at three levels, respectively, however, inventive concepts may not be limited thereto. For example, the numbers of levels at which the first insulation layers 310 and the fourth sacrificial layers 320 are formed may be changed according to the number of the GIDL gate electrodes used in the erase operation for deleting data stored in the memory channel structure 430 using GIDL phenomenon.

The first and second insulation layers 310 and 311 may include an oxide, e.g., silicon oxide and may or may not include a nitride, and the fourth sacrificial layer 320 may include a material having an etching selectivity with respect to the first insulation layer 310, e.g., a nitride such as silicon nitride and may or may not include an oxide.

Figure 9:
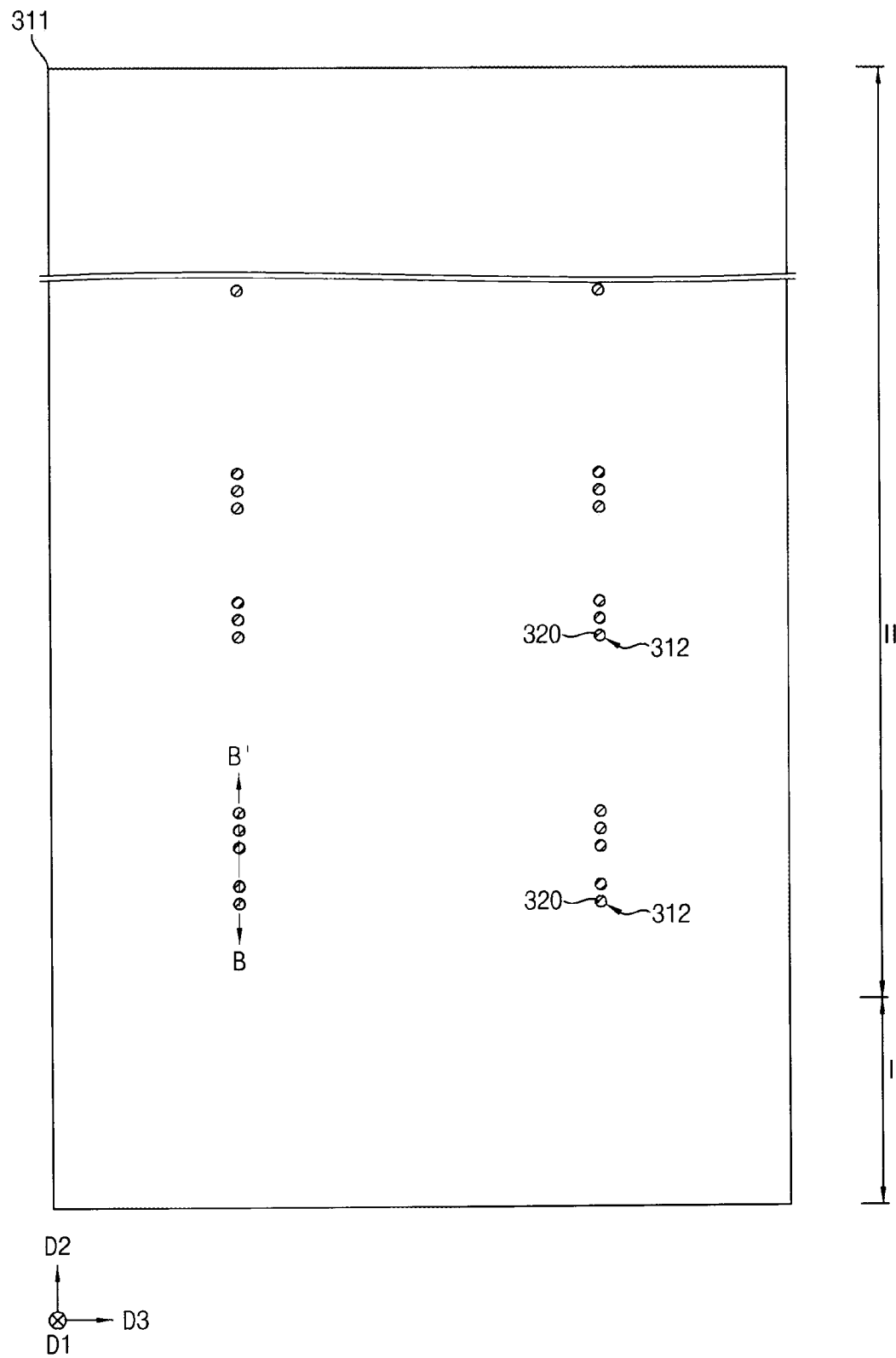
Figure 10:
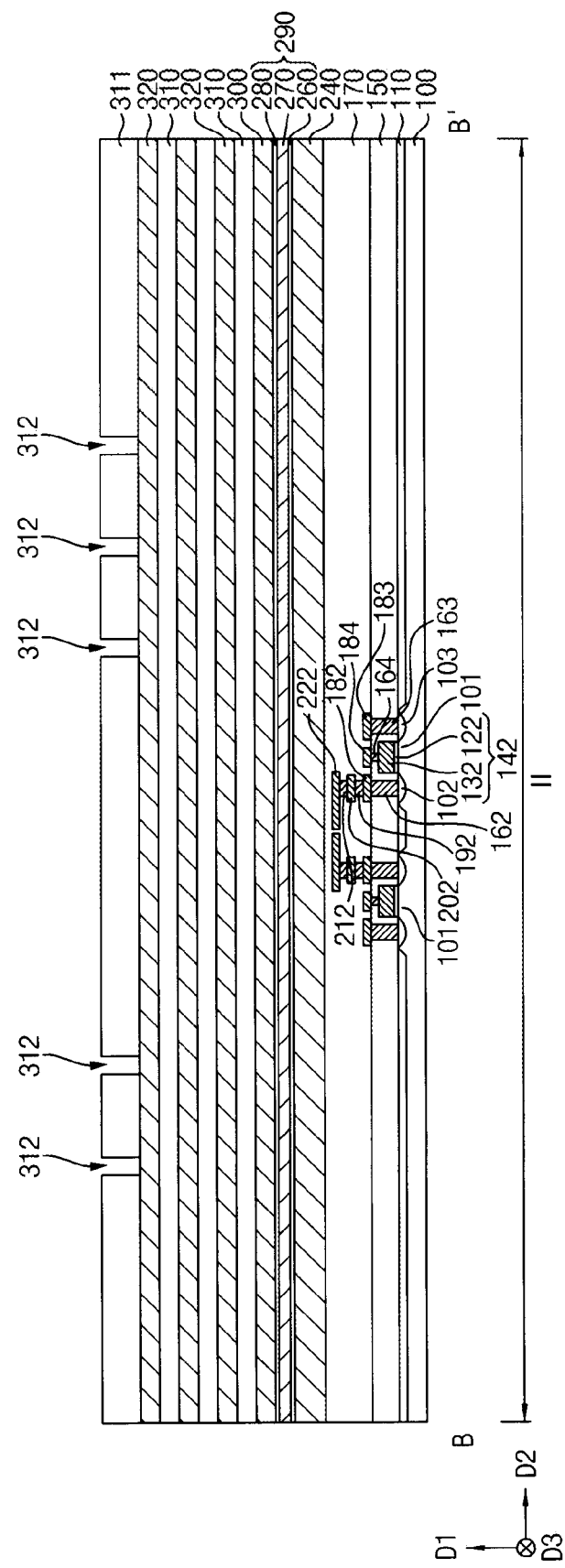

Referring to FIGS. 9 and 10, a first hole 312 may be formed through the second insulation layer 311 to contact an upper surface of the uppermost one of the fourth sacrificial layers 320.

In some example embodiments, a plurality of first holes 312 may be formed to be adjacent to each other in the second direction D2 on the second region II of the substrate 100 to form a first hole group, and a plurality of first hole groups may be spaced apart from each other in the second direction D2 to form a first hole group column. In some example embodiments, a plurality of first hole group columns may be spaced apart from each other in the third direction D3.

In the drawings, the first hole group includes two first holes 312 adjacent to each other in the second direction D2 and three first holes 312 adjacent to each other in the second direction D2, however, inventive concepts may not be limited thereto, and the first hole group may include one or a plurality of first holes 312 adjacent to each other in the second direction D2.

In some example embodiments, each of the first holes 312 may have a shape of at least one of a circle, an ellipse, a polygon, or a rounded polygon with rounded corners, and each of the first circle holes 312 may have the same shape or different shapes and may have the same diameter or different diameters.

Figure 11:
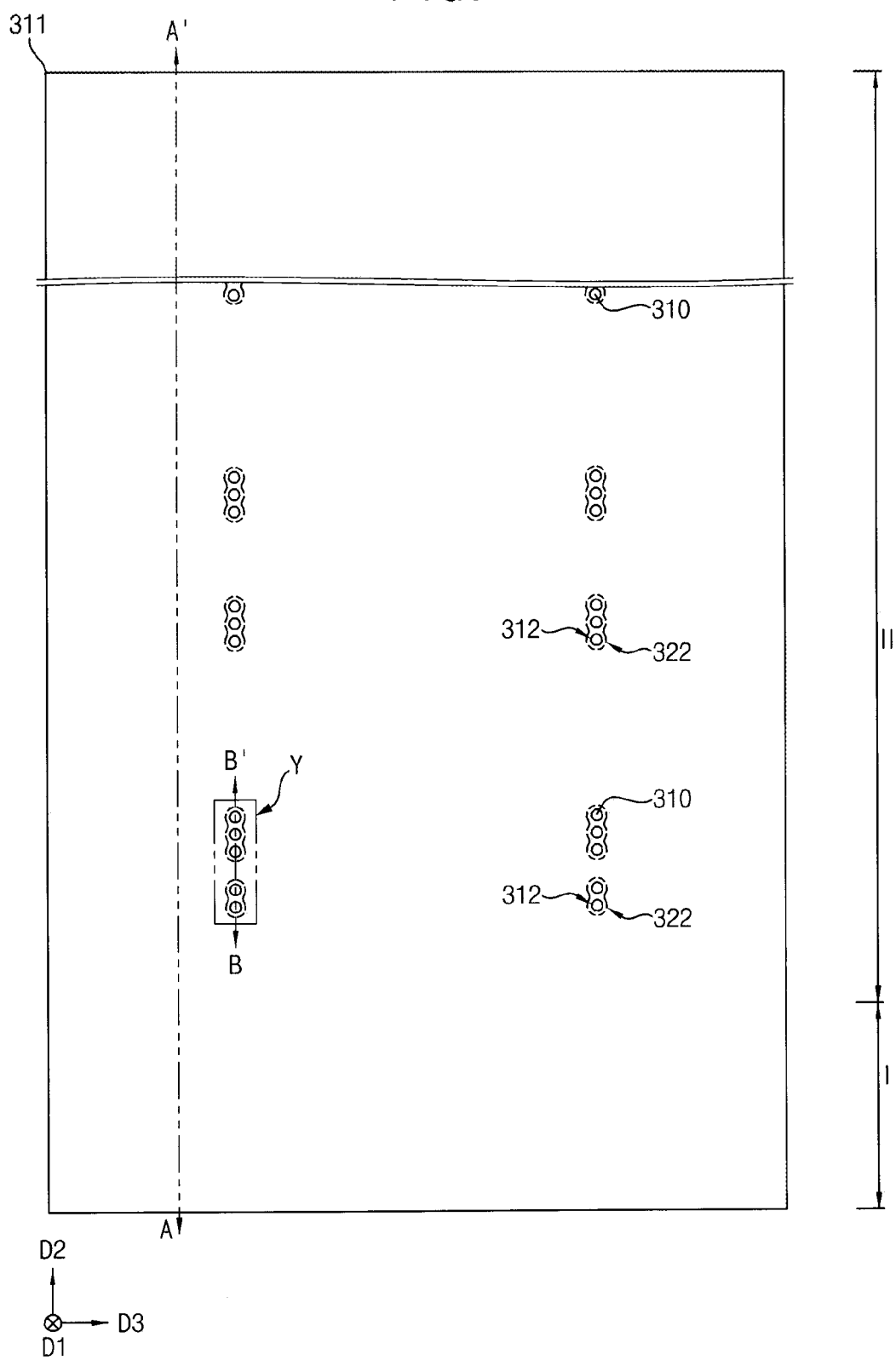
Figure 12:
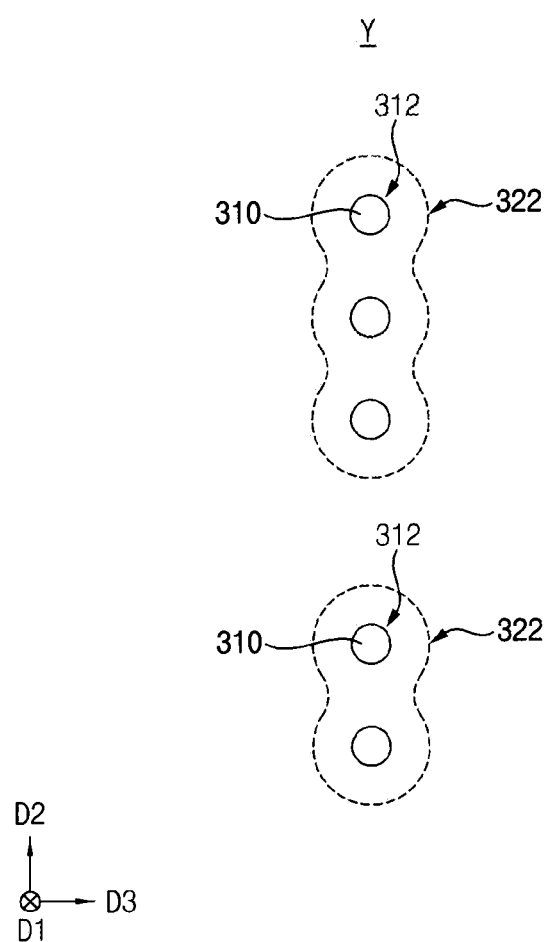
Figure 13:
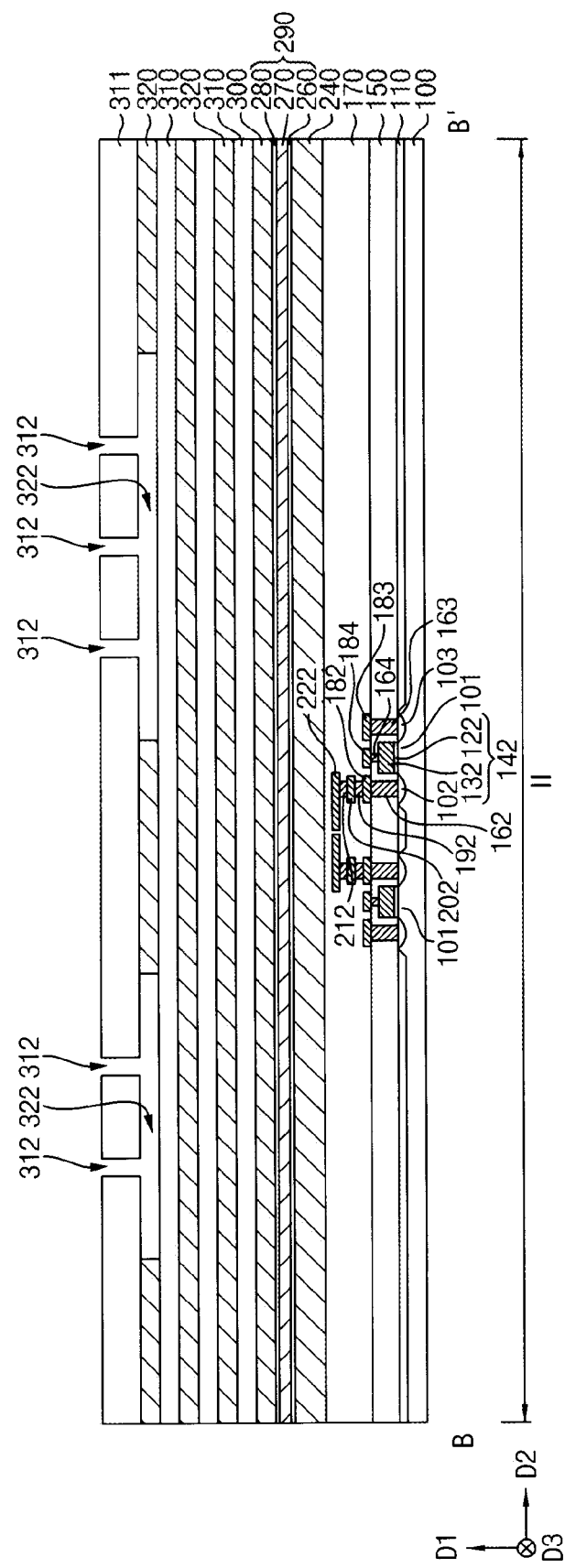

Referring to FIGS. 11 to 13, the upper surface of the uppermost one of the fourth sacrificial layers 320 may be partially removed to form a first gap 322.

In some example embodiments, the fourth sacrificial layer 320 may be partially removed by an isotropic process such as a wet etching process using an etching solution including, e.g., phosphoric acid ($H_3PO_4$). The wet etching process is an isotropic etching process, and thus an outer contour of the first gap 322 may be blown out or have or be shaped as a curve, e.g., a shape of a circle or an ellipse in a plan view. The first holes 312 adjacent to each other in the second direction D2 are formed, and thus in a plan view, e.g. from a perspective looking down on from a direction parallel to the plane formed by the directions D2 and D3, the shape of the outer contour of the first gap 322 may be a shape including circles or ellipses arranged in the second direction D2 in which the circles or ellipses partially overlap each other.

Figure 14:
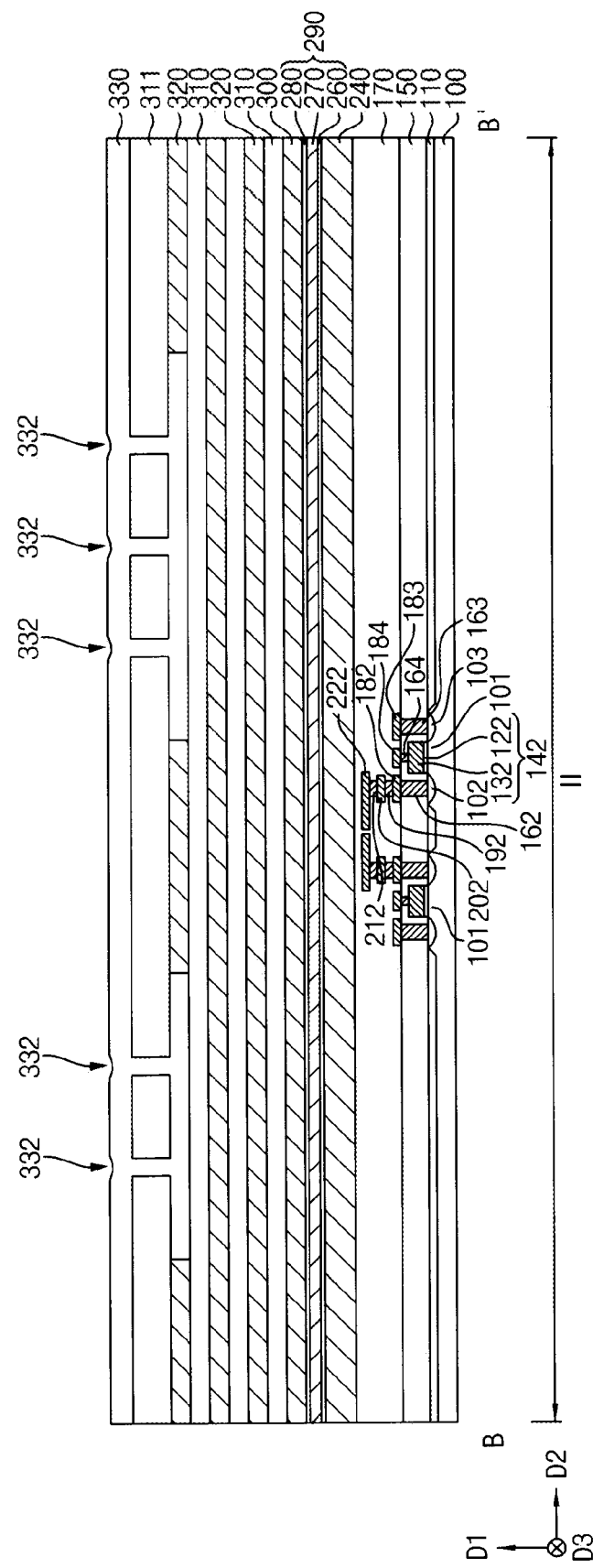

Referring to FIG. 14, a first division layer 330 may be formed on the uppermost one of the fourth sacrificial layer 320 and the second insulation layer 311 to fill the first gaps 322 and the first holes 312.

In some example embodiments, the first division layer 330 may be formed by an atomic layer deposition (ALD) process, and may include, e.g. may consist of, an oxide, e.g., silicon oxide.

A first recess may be formed on a portion of the first division layer 330 on each of the first holes 312. The first gap 322 and/or the first hole 312 might not be filled with the first division layer 330 during the ALD process, and a void may be formed in the first division layer 330.

Figure 15:
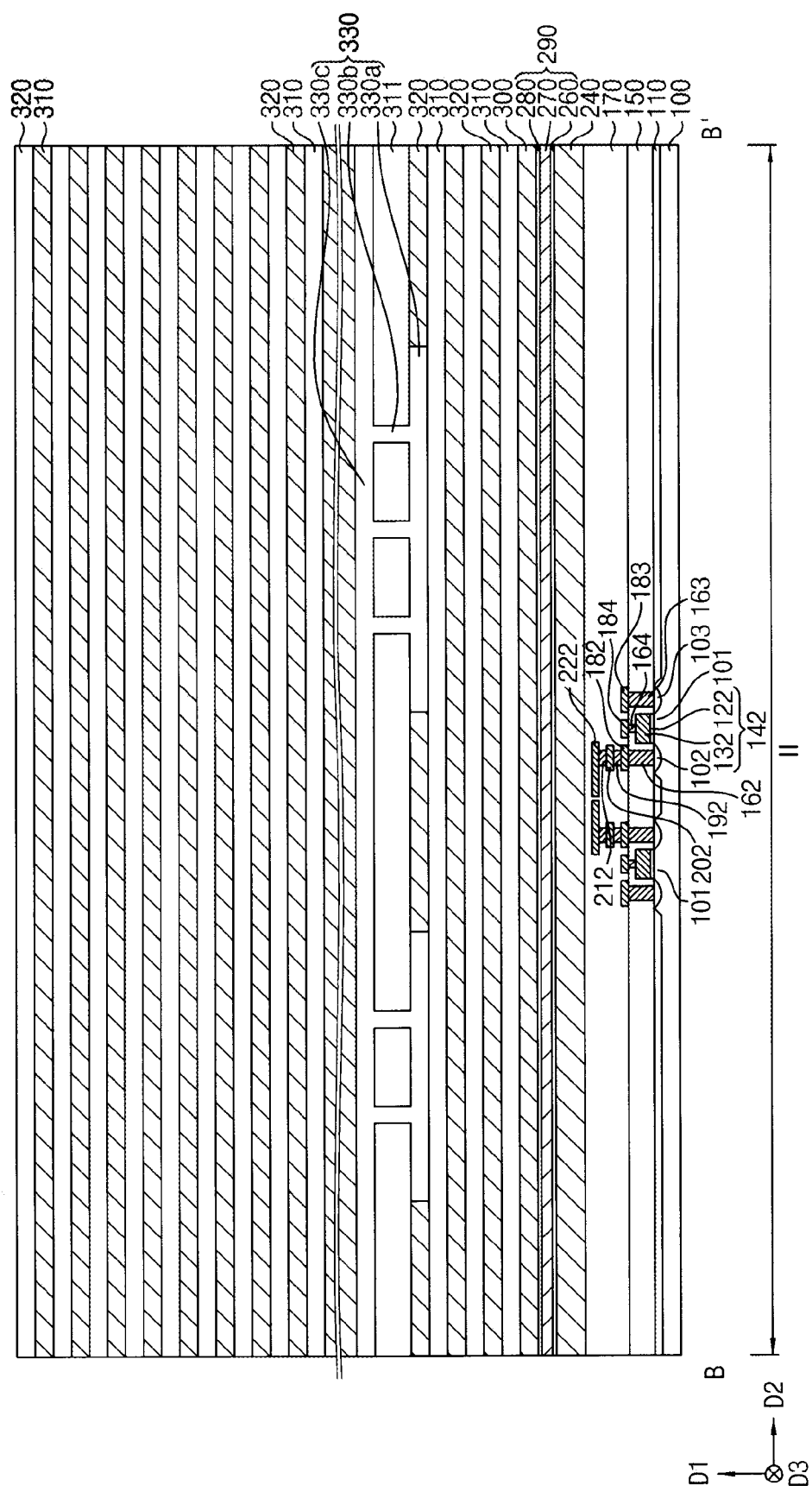

Referring to FIG. 15, an etch-back process and/or buffing chemical mechanical polishing (CMP) process may be performed on an upper surface of the first division layer 330, so as to remove the first recesses 332.

A fourth sacrificial layer 320 and the first insulation layer 310 may be alternately and repeatedly stacked on the first division layer 330. The first insulation layers 310, the fourth sacrificial layers 320, the second insulation layer 311 and the first division layer 330 may form a mold layer. The fourth sacrificial layer 320 and the first insulation layer 310 may have the same, or different, thicknesses from one another.

In some example embodiments, the first division layer 330 may include a first horizontal portion 330a in the first gap 322, a vertical portion 330b in the first hole 312, and a second horizontal portion 330c on the second insulation layer 311 and the vertical portion 330b. The vertical portion 330b may be formed between the first and second horizontal portions 330a and 330c to be connected thereto. In some example embodiments, one or a plurality of vertical portions 330b may be formed on the first horizontal portion 330a. A plurality of first horizontal portions 330a may be spaced apart from each other in the second direction D2 to form a first horizontal portion column, and a plurality of first horizontal portion columns may be formed to be spaced apart from each other in the third direction D3.

Figure 16:
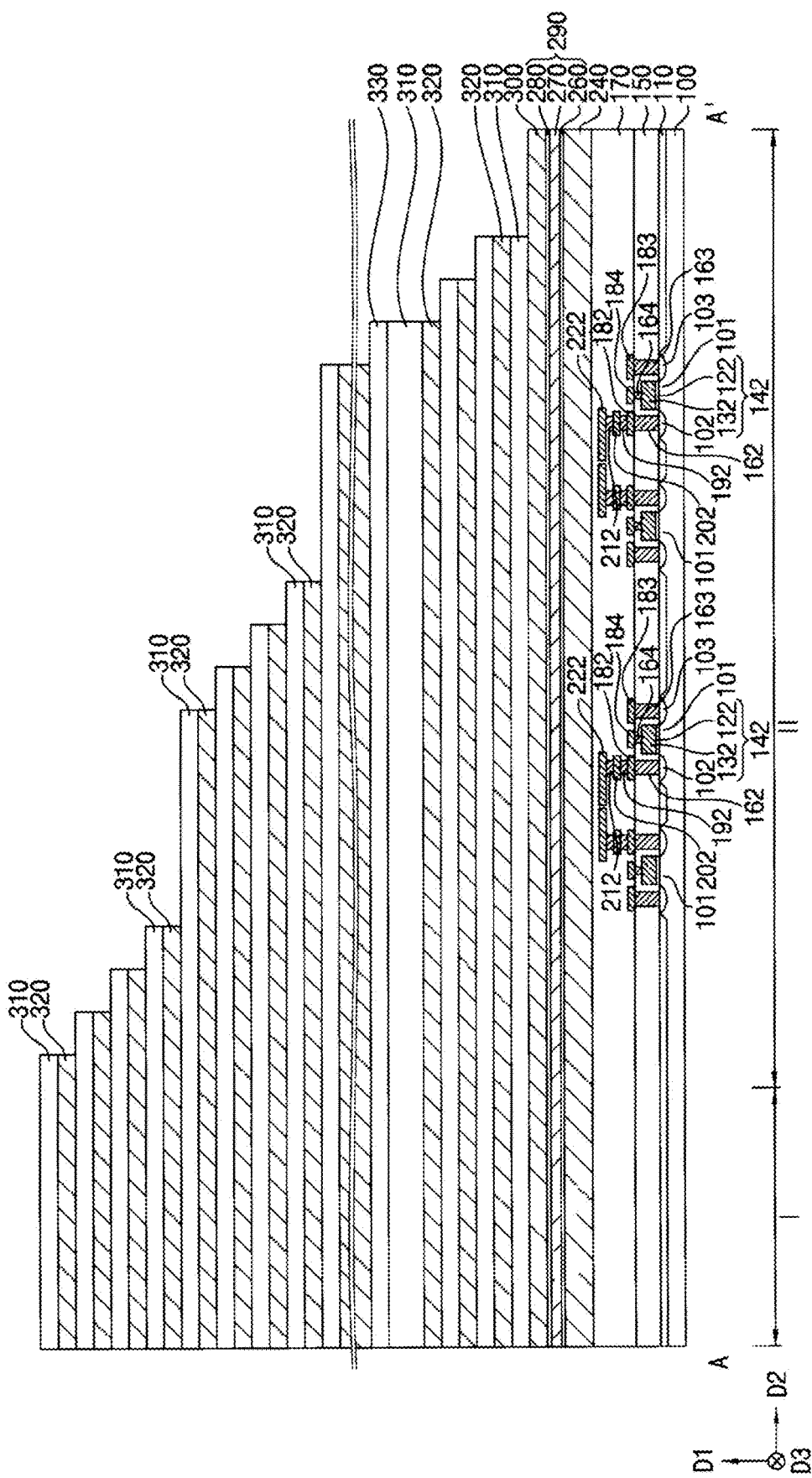

Referring now to FIG. 16, a photoresist pattern (not shown) may be formed on an uppermost one of the first insulation layers 310, and the uppermost one of the first insulation layers 310 and an uppermost one of the fourth sacrificial layers 320 may be etched using the photoresist pattern as an etching mask. Thus, one of the first insulation layers 310 directly under the uppermost one of the fourth sacrificial layers 320 may be partially exposed.

A trimming process in which an area of the photoresist pattern is reduced by a given (e.g. a variable and/or a predetermined) ratio may be performed, and the uppermost one of the first insulation layers 310, the uppermost one of the fourth sacrificial layers 320, the exposed one of the first insulation layers 310, and one of the fourth sacrificial layers 320 directly under the exposed one of the first insulation layers 310 may be etched using the photoresist pattern having the reduced area. The trimming process and the etching process may be alternately and repeatedly performed to form a mold having a staircase shape/step shape including a plurality of step layers each of which may include one fourth sacrificial layer 320 and one first insulation layer 310 sequentially stacked.

Hereinafter, the "step layer" may be defined as not only an exposed portion but also a non-exposed portion of the fourth sacrificial layer 320 and the first insulation layer 310 at the same level, and the exposed portion thereof may be defined as a "step." In some example embodiments, the steps may be arranged in the second direction D2. Alternatively or additionally, the steps may also be arranged in the third direction D3.

In some example embodiments, lengths in the second direction D2 of the steps included in the mold may be uniform except for lengths of some ones, which may be greater than the lengths of other ones. Hereinafter, ones of the steps having relatively small lengths may be referred to as first steps, and other ones of the steps having relatively large lengths may be referred to as second steps. FIG. 16 shows two second steps. The steps will be denoted by dotted lines in plan views hereinafter.

The mold may be formed on the first support layer 300 on the first and second regions I and II of the substrate 100, and an edge upper surface of the first support layer 300 may not be covered by the mold but exposed. The steps of the mold may be formed on the second region II of the substrate 100.

Referring to FIGS. 17 to 20, a third insulating interlayer 340 may be formed on the CSP 240 to cover the mold and the first support layer 300, and may be planarized e.g. with an etch back and/or with a CMP process, until an upper surface of the uppermost one of the first insulation layers 310 of the mold may be exposed. Thus, a sidewall of the mold, an upper surface and a sidewall of the first support layer 300, and a sidewall of the first sacrificial layer structure 290 may be covered by the third insulating interlayer 340. A fourth insulating interlayer 350 may be formed on upper surfaces of the mold and the third insulating interlayer 340.

A channel hole extending in the first direction D1 may be formed through the fourth insulating interlayer 350, the mold, the first support layer 300 and the first sacrificial layer structure 290 on the first region I of the substrate 100 to expose an upper surface of the CSP 240, and a dummy channel hole extending in the first direction D1 may be formed through the third and fourth insulating interlayers 340 and 350, a portion of the mold, the first support layer 300 and the first sacrificial layer structure 290 on the second region II of the substrate 100 to expose an upper surface of or a partially etched surface of the CSP 240. In some example embodiments, a plurality of channel holes may be formed in each of the second and third directions D2 and D3 on the first region I of the substrate 100, and a plurality of dummy channel holes may be formed in each of the second and third directions D2 and D3 on the second region II of the substrate 100.

The channel holes and the dummy channel holes may be simultaneously formed by the same etching process, or may be sequentially formed by independent etching processes. A diameter of the channel holes may be the same as, or different from, a diameter of the dummy holes.

A charge storage structure layer and a channel layer may be sequentially formed on sidewalls of the channels hole and the dummy channel holes, the exposed upper surface of the CSP 240, and an upper surface of the fourth insulating interlayer 350, and a filling layer may be formed on the channel layer to fill the channel holes and the dummy channel holes. The filling layer, the channel layer and the charge storage structure layer may be planarized e.g. with an etch back and/or a CMP process until the upper surface of the fourth insulating interlayer 350 is exposed.

Thus, a charge storage structure 390, a channel 400 and a first filling pattern 410 sequentially stacked may be formed on the channel hole, a dummy charge storage structure 392, a dummy channel 402 and a dummy filling pattern 412 sequentially stacked may be formed on the dummy channel hole.

In some example embodiments, the charge storage structure 390 may include a tunnel insulation pattern 380, a charge storage pattern 370 and a first blocking pattern 360 sequentially stacked from an outer sidewall of the channel 400 in a horizontal direction substantially parallel to the upper surface of the substrate 100. The tunnel insulation pattern 380 and the first blocking pattern 360 may include or consist of an oxide, e.g., silicon oxide, the charge storage pattern 370 may include a nitride or consist of, e.g., silicon nitride, the channel 400 may include or consist of, e.g., doped or undoped polysilicon and/or doped or undoped single crystalline silicon, and the filling pattern 410 may include or consist of an oxide, e.g., silicon oxide.

In some example embodiments, the dummy charge storage structure 392 may include, e.g. may consist of, the same material as the charge storage structure 390, the dummy channel 402 may include, e.g. may consist of, the same material as the channel 400, and the dummy filling pattern 412 may include, e.g. may consist of, the same material as the filling pattern 410. Thus, the dummy charge storage structure 392 may include a dummy tunnel insulation pattern, a dummy charge storage pattern and a dummy blocking pattern sequentially stacked from an outer sidewall of the dummy channel 402 in the horizontal direction.

Upper portions of the filling pattern 410 and the channel 400 may be removed to form a first trench, a capping layer may be formed on the filling pattern 410, the channel 400, the charge storage structure 390 and the fourth insulating interlayer 350, and may be planarized e.g. with an etch back and/or a CMP process until the upper surface of the fourth insulating interlayer 350 is exposed to form a capping pattern 420 filling the first trench. The capping pattern 420 may include, e.g., polysilicon doped with impurities such as boron and/or arsenic and/or phosphorus.

When the first trench is formed, the dummy filling pattern 412 and the dummy channel 402 may also be removed to form a second trench, and when the capping pattern 420 is formed, a dummy capping pattern 422 may also be formed in the second trench. Thus, the dummy capping pattern 422 may include or consist of the same material as the capping pattern 420.

The filling pattern 410, the channel 400, the charge storage structure 390 and the capping pattern 420 may form a memory channel structure 430, which may correspond to the memory channel structures 3220 and 4220 shown in FIGS. 3 and 4. Additionally, the dummy filling pattern 412, the dummy channel 402, the dummy charge storage structure 392 and the dummy capping pattern 422 may form a dummy memory channel structure 432, which may not be electrically active. However, the dummy memory channel structure 432 might not serve as a memory channel structure of the memory cell, but may support the mold, and thus may be referred to as a support structure 432, hereinafter.

In some example embodiments, each of the memory channel structure 430 and the support structure 432 may have a shape of a pillar or cylinder extending in the first direction D1. Each of the memory channel structure 430 and the support structure 432 may have a shape of, e.g., a circle, an ellipse, a rectangle, or a rounded rectangle having rounded corners in a plan view. The numbers and/or layouts of the memory channel structure 430 and the support structure 432 may not be limited to those shown in the drawings, but may be varied.

In some example embodiments, a plurality of memory channel structures 430 may be formed in each of the second and third directions D2 and D3 to form a memory group, and a plurality of memory groups may be formed in the third direction D3 to form a memory block. The erase operation of the semiconductor device may be performed in units of the memory block. FIG. 17 shows two memory blocks arranged in the third direction D3, and each memory block includes two memory groups arranged in the third direction D3.

The fourth insulating interlayer 350 and some of the first insulation layers 310 and the fourth sacrificial layers 320 may be etched to form a first opening extending in the second direction D2, and a second division pattern 440 may be formed in the first opening.

The second division pattern 440 may extend through some of the channels 400, particularly, upper portions of the channels 400 included at a central portion in the third direction D3 in each memory group. Additionally or alternatively, the second division pattern 440 may also extend through the fourth insulating interlayer 350, ones of the fourth sacrificial layers 320 at upper two levels, and ones of the first insulation layers 310 at upper two levels, and may further extend through one of the first insulation layers 310 at a third level from above. The second division pattern 440 may extend in the second direction D2 on the first and second regions I and II of the substrate 100, and may extend through upper two step layers of the mold. Thus, the fourth sacrificial layers 320 at two upper levels of the mold may be divided in the third direction D3 by the second division pattern 440.

However, the number of levels of the fourth sacrificial layers 320 divided by the second division pattern 440 may increase according to the number of levels of GIDL gate electrodes as explained below.

Referring to FIGS. 21 to 24, a fifth insulating interlayer 450 may be formed on the fourth insulating interlayer 350, the capping pattern 420, and the second division pattern 440, and second to fourth openings 460, 465 and 467 may be formed through the third to fifth insulating interlayers 340, 350 and 450 and the mold by an etching process.

In some example embodiments, the second opening 460 may extend in the second direction D2 on the first and second regions I and II of the substrate 100, and may extend to opposite ends in the second direction D2 of the mold having a staircase shape. In some example embodiments, a plurality of second openings 460 may be spaced apart from each other in the third direction D3. Thus, the mold may be divided into a plurality of parts in the third direction D3 by the second openings 460. In some example embodiments, each of the second openings 460 may be formed between the memory blocks. For example, the memory blocks may be divided by the second openings 460 to be spaced apart from each other in the third direction D3.

As the second opening 460 is formed, the first and second insulation layers 310 and 311 and the fourth sacrificial layers 320 of the mold may be divided into first and second insulation patterns 315 and 316 and fourth sacrificial patterns 325, respectively, each of which may extend in the second direction D2. Additionally or alternatively, the second horizontal portion 330c of the first division layer 330 may also be divided into a plurality of parts each of which may extend in the second direction D2. Hereinafter, the first division layer 330 may be referred to as a first division pattern 335, and the first and second horizontal portions 330a and 330c and the vertical portion 330b will be denoted by reference numerals 335a, 335c and 335b, respectively.

In some example embodiments, the third opening 465 may continuously extend in the second direction D2 on the first region I of the substrate 100, however, a plurality of third openings 465 may be spaced apart from each other in the second direction D2 on the second region II of the substrate 100. The third openings 465 arranged in the second direction D2 may be formed between neighboring ones of the second openings 460 in the third direction D3. In some example embodiments, the third openings 465 may be formed between memory groups in each of the memory blocks spaced apart from each other by the second openings 460. For example, the memory groups may be spaced apart from each other in the third direction D3 by the third openings 465 in each of the memory blocks.

However, the third openings 465 may be spaced apart from each other in the second direction D2, which may be different from the second opening 460 continuously extending in the second direction D2 to opposite ends in the second direction D2 of the mold, and thus the memory groups in each memory block may not entirely divided from each other by the third opening 465. In some example embodiments, each of ends in the second direction D2 of each third opening 465 may partially penetrate through the first horizontal portion 335a of the first division pattern 335, and may partially or entirely penetrate through the vertical portions 335b neighboring in the second direction D2.

In the drawings, end portions of the third openings 465 may entirely penetrate through two second vertical portions 335b neighboring in the second direction D2 in a portion of the first division pattern 335 having the two second vertical portions 335b, and end portions of the third openings 465 may entirely penetrate through two second vertical portions 335b at opposite sides in the second direction D2 in a portion of the first division pattern 335 having three second vertical portions 335b neighboring in the second direction D2, however, inventive concepts may not be limited thereto. As end portions of the third openings 465 partially penetrate through a portion of the first horizontal portion 335a, the first horizontal portion 335a may have a shape including circles or ellipses arranged in the second direction D2 but partially overlapping each other and opposite sides of the circles or ellipses in the second direction D2 are removed.

Each of the third openings 465 may continuously extend in the second direction D2 on the first region I of the substrate 100, and may continuously extend to end portions in the second direction D2 of the step layers of the mold at upper two levels even on the second region II of the substrate 100. Thus, the fourth sacrificial patterns 325 at the upper two levels of the mold may be divided by the third opening 465 and the second division patterns 440 at opposite sides in the third direction D3 of the third opening 465. However, as mentioned above, the number of levels of the fourth sacrificial patterns 325 divided by the second division patterns 440 may increase according to the number of the GIDL gate electrodes.

The fourth opening 467 may be formed on the second region II of the substrate 100, and may have a closed ring shape in a plan view. Hereinafter, portions of the first and second insulation patterns 315 and 316 and the fourth sacrificial pattern 325 surrounded by the fourth opening 467 having the closed ring shape may be referred to as third, fourth and fifth insulation patterns 317, 318 and 319, respectively, and may form an insulation pattern structure 600 together with a portion of the first division pattern 335 surrounded by the fourth opening 467 (in the drawing, a portion of the vertical portion 335b and a portion of the second horizontal portion 335c). In some example embodiments, the fourth opening 467 may extend through the second step having a relatively large length in the second direction D2, and may be formed between neighboring ones of the second openings 460 in the third direction D3.

In an example embodiment, the fourth opening 467 may have a rectangular ring shape in a plan view, and opposite sides in the third direction D3 of the rectangular ring shape may be aligned with the second division pattern 440 in the second direction D2. However, inventive concepts may not be limited thereto, and the fourth opening 467 may have, e.g., a rounded rectangular ring shape, an elliptical ring shape, a circular ring shape, etc.

In some example embodiments, the fourth opening 467 may be formed between neighboring ones of the third openings 465 in the second direction D2, but at least a portion of the fourth opening 467 may partially penetrate through the first horizontal portion 335a of the first division pattern 335. Thus, one of the fourth sacrificial patterns 325 at a lowermost level of the mold between the second openings 460 may be divided in the third direction D3 by the third opening 465 extending in the second direction D2 on the first region I of the substrate 100, and may be divided in the third direction D3 by the third openings 465 spaced apart from each other in the second direction D2, the fourth openings 467 between the third openings 465, the insulation pattern structure 600 surrounded by the fourth openings 467, and the first horizontal portion 335a of the first division pattern 335.

Even though the mold may be divided into a plurality of parts spaced apart from each other in the third direction D3 each of which may extend in the second direction D2 by the etching process for forming the second to fourth openings 460, 465 and 467, the mold may not lean or fall down by the support structures 432 and the memory channel structures 430 extending through the mold.

In some example embodiments, the etching process may be performed until the second to fourth openings 460, 465 and 467 expose an upper surface of the first support layer 300, and further extend through an upper portion of the first support layer 300.

A first spacer layer may be formed on sidewalls of the second to fourth openings 460, 465 and 467 and an upper surface of the fifth insulating interlayer 450, and may be anisotropically etched so that portions of the first spacer layer on bottoms of the second to fourth openings 460, 465 and 467 may be removed to form a first spacer 470. Thus, an upper surface of the first support layer 300 may be partially exposed.

The exposed first support layer 300 and a portion of the first sacrificial layer structure 290 thereunder may be removed to enlarge the second to fourth openings 460, 465 and 467 downwardly. Accordingly, each of the second and third openings 460 and 465 may expose an upper surface of the CSP 240, and further extend through an upper portion of the CSP 240.

In some example embodiments, the first spacer 470 may include, e.g., undoped polysilicon. When the first sacrificial layer structure 290 is partially removed, the sidewalls of the second to fourth openings 460, 465 and 467 may be covered by the first spacer 470, and thus the first and second insulation patterns 315 and 316 and the fourth sacrificial pattern 325 included in the mold may not be removed.

Figure 25:
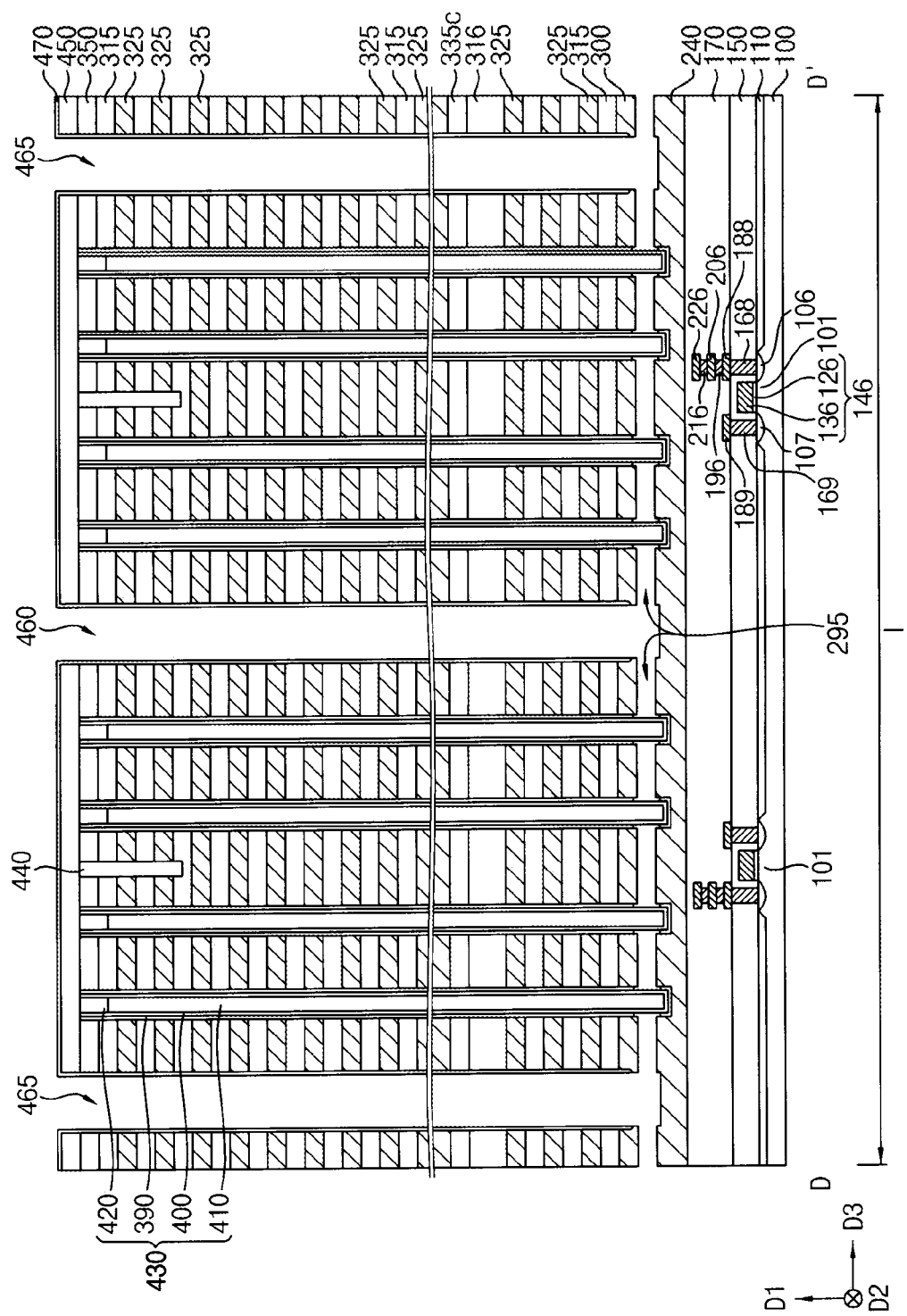

Referring to FIG. 25, the first sacrificial layer structure 290 exposed by the second to fourth openings 460, 465 and 467 may be removed by, e.g., an isotropic etching process such as a wet etching process to form a second gap 295.

The wet etching process may be performed using, e.g., hydrofluoric acid such as buffered hydrofluoric acid and/or phosphoric acid such as hot phosphoric acid.

As the second gap 295 is formed, a lower portion of the first support layer 300 and an upper surface of the CSP 240 may be exposed. Additionally, a sidewall of the charge storage structure 390 may be partially exposed by the second gap 295, and the exposed sidewall of the charge storage structure 390 may also be removed to expose an outer sidewall of the channel 400. Accordingly, the charge storage structure 390 may be divided into an upper portion extending through the mold to cover most portion of the outer sidewall of the channel 400 and a lower portion covering a lower surface of the channel 400 on the CSP 240.

Figure 26:
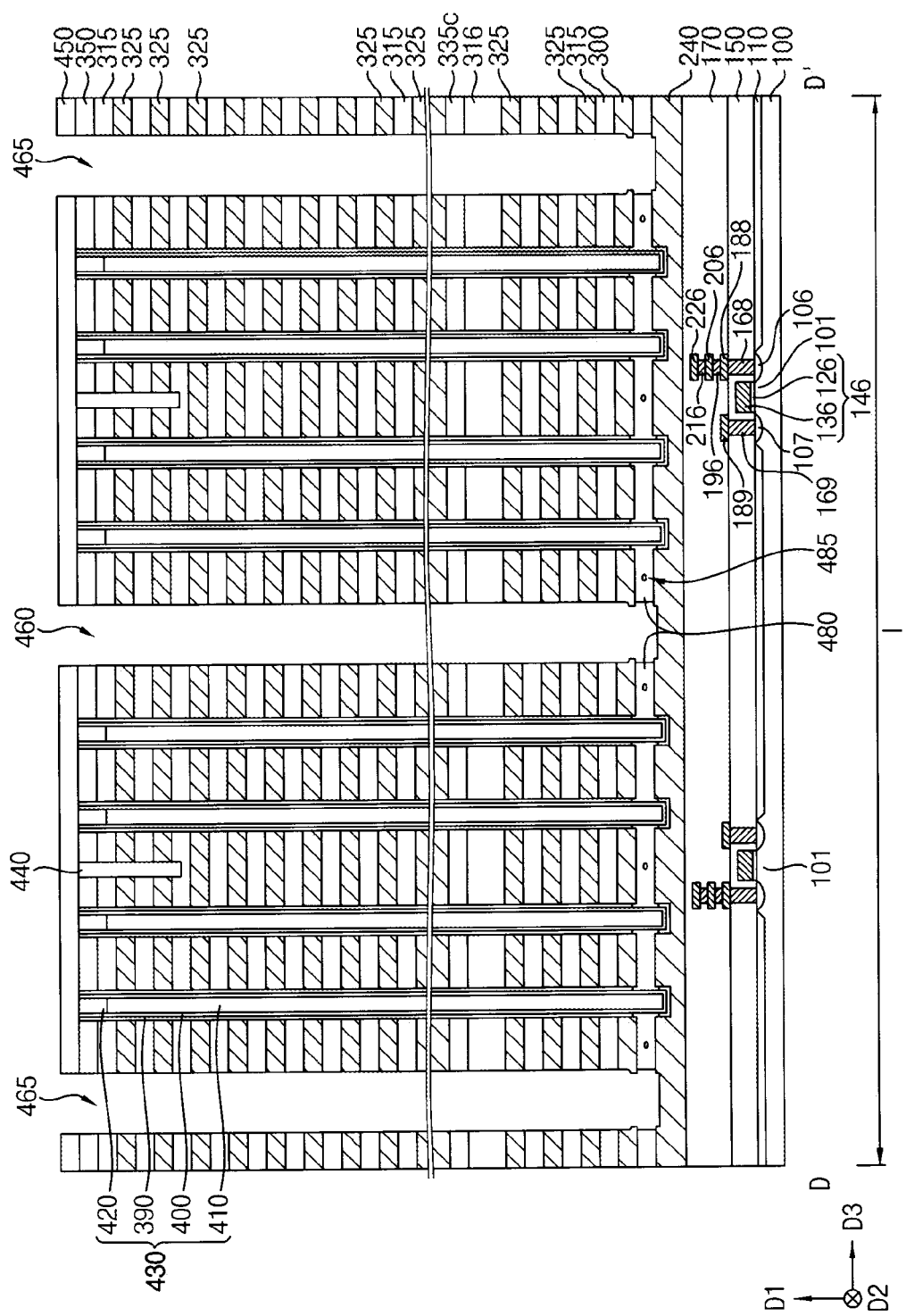

Referring to FIG. 26, after removing the first spacer 470, a channel connection layer may be formed on the sidewalls of the second to fourth openings 460, 465 and 467 and in the second gap 295, and a portion of the channel connection layer in the second to fourth openings 460, 465 and 467 may be removed to form a channel connection pattern 480 in the second gap 295.

As the channel connection pattern 480 is formed, the channels 400 between neighboring ones of the second and third openings 460 and 465 in the third direction D3, for example, the channels 400 included in each channel group may be connected with each other.

The channel connection pattern 480 may include, e.g., polysilicon doped with n-type impurities or undoped polysilicon.

An air gap 485 may be formed in the channel connection pattern 480.

Figure 27:
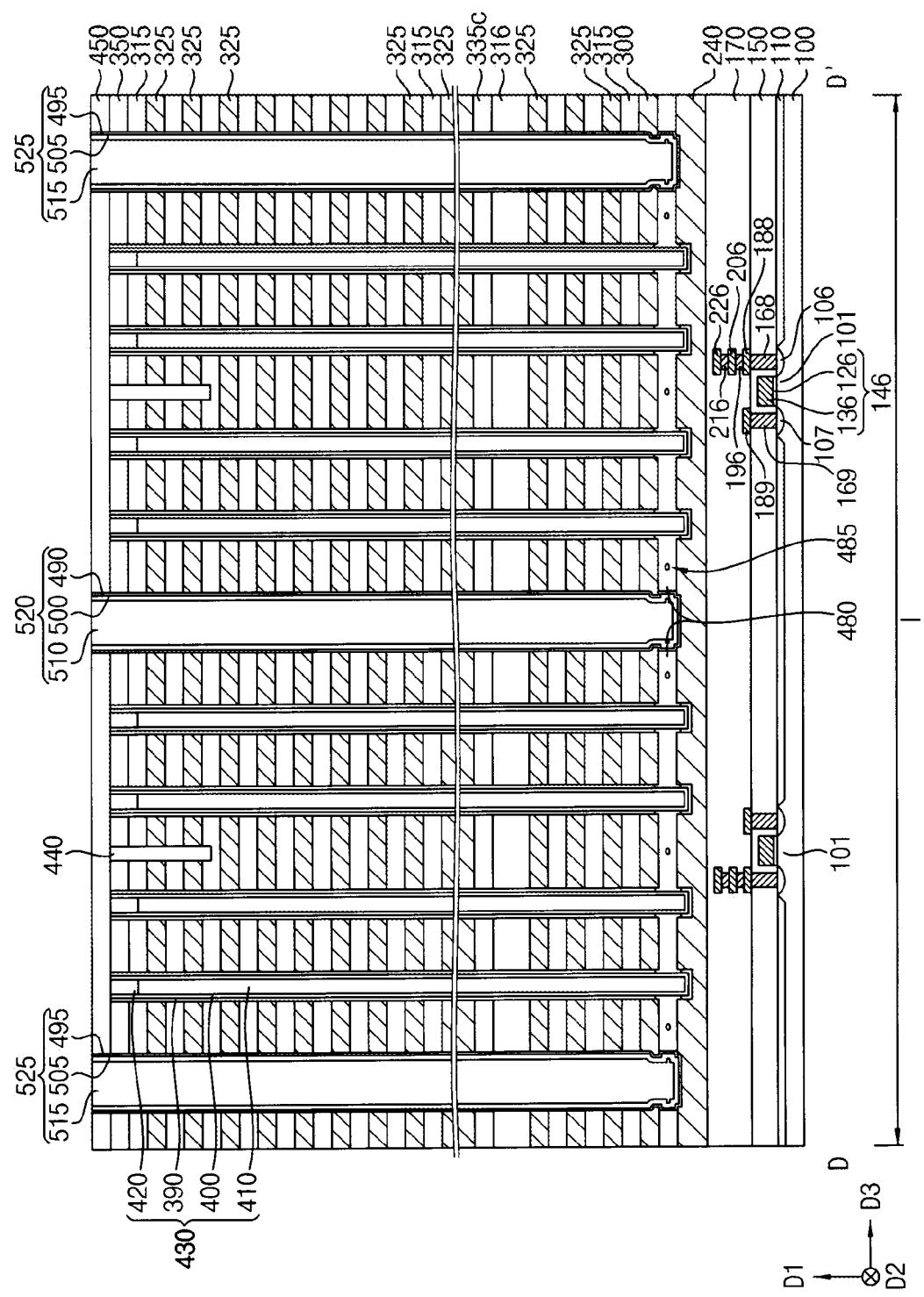
Figure 28:
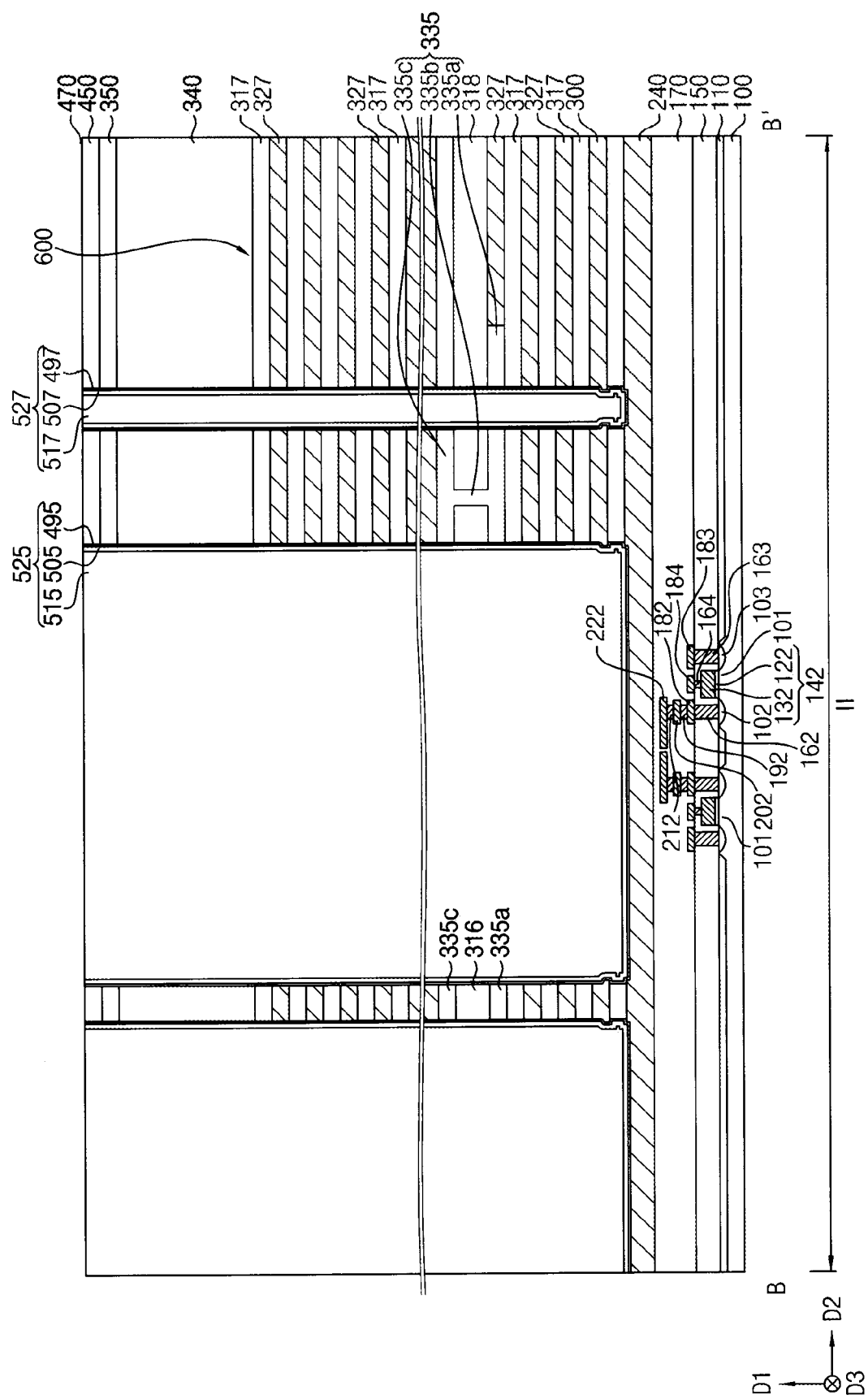
Figure 29:
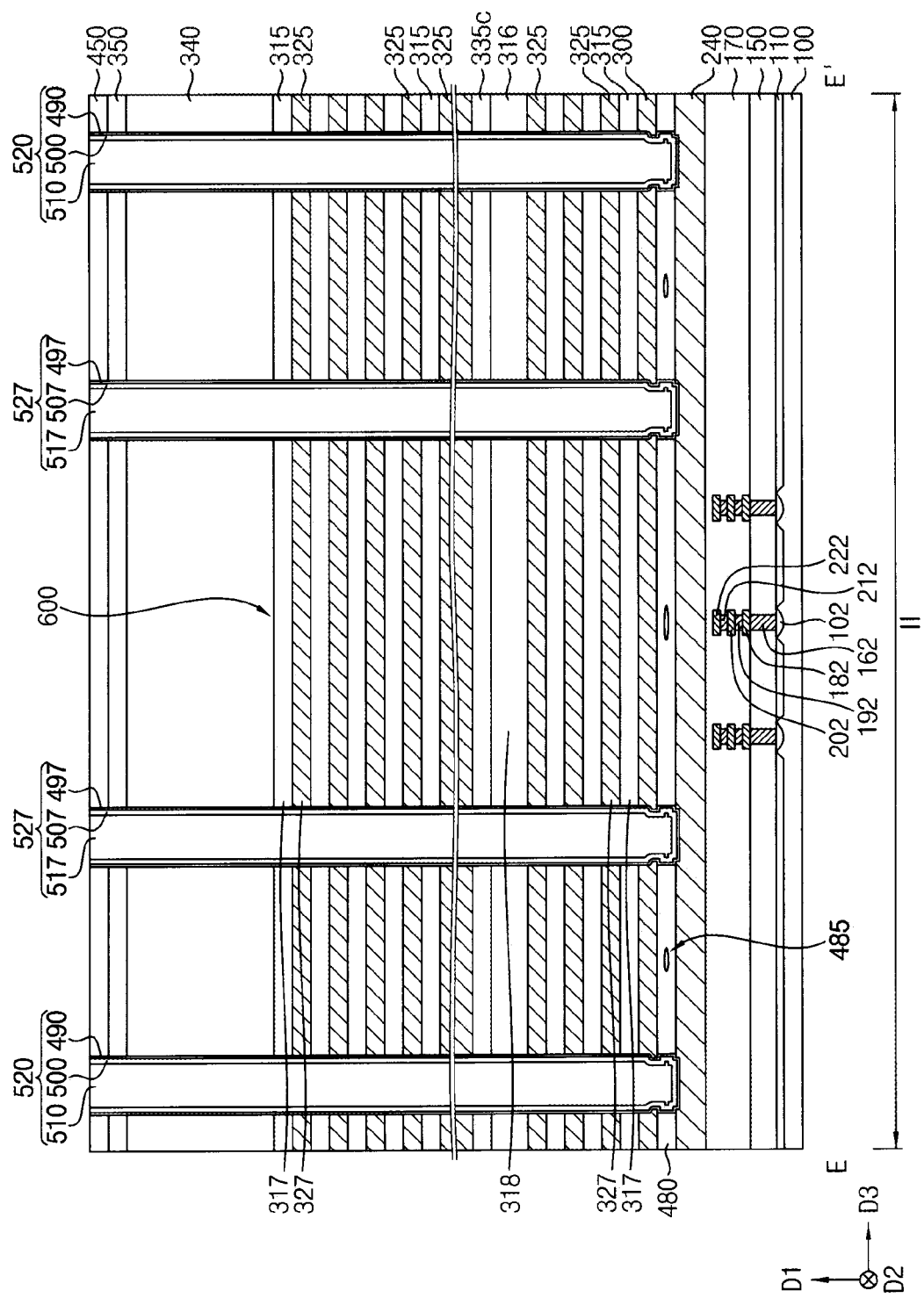

Referring to FIGS. 27 to 29, second and third sacrificial layer structures 520 and 525 and an etch stop structure 527 may be formed in the second, third and fourth openings 460, 465 and 467, respectively.

The second and third sacrificial layer structures 520 and 525 and the etch stop structure 527 may be formed by sequentially forming an etch stop layer and a second spacer layer on the sidewalls of the second to fourth openings 460, 465 and 467 and the exposed upper surface of the CSP 240, forming a fifth sacrificial layer on the second spacer layer to fill the second to fourth openings 460, 465 and 467, and planarizing the fifth sacrificial layer, the second spacer layer and the etch stop layer until the upper surface of the fifth insulating interlayer 450 is exposed.

The second sacrificial layer structure 520 may include a first etch stop pattern 490, a second spacer 500 and a fifth sacrificial pattern 510 sequentially stacked, the third sacrificial layer structure 525 may include a second etch stop pattern 495, a third spacer 505 and a sixth sacrificial pattern 515 sequentially stacked, and the etch stop structure 527 may include a third etch stop pattern 497, a fourth spacer 507 and a second filling pattern 517 sequentially stacked.

The etch stop layer may include a material having an etching selectivity with respect to the fourth sacrificial pattern 325, e.g., an oxide such as silicon oxide. The second spacer layer may include, e.g., a nitride such as silicon nitride, and the fifth sacrificial layer may include, e.g., polysilicon or silicon oxide.

Figure 30:
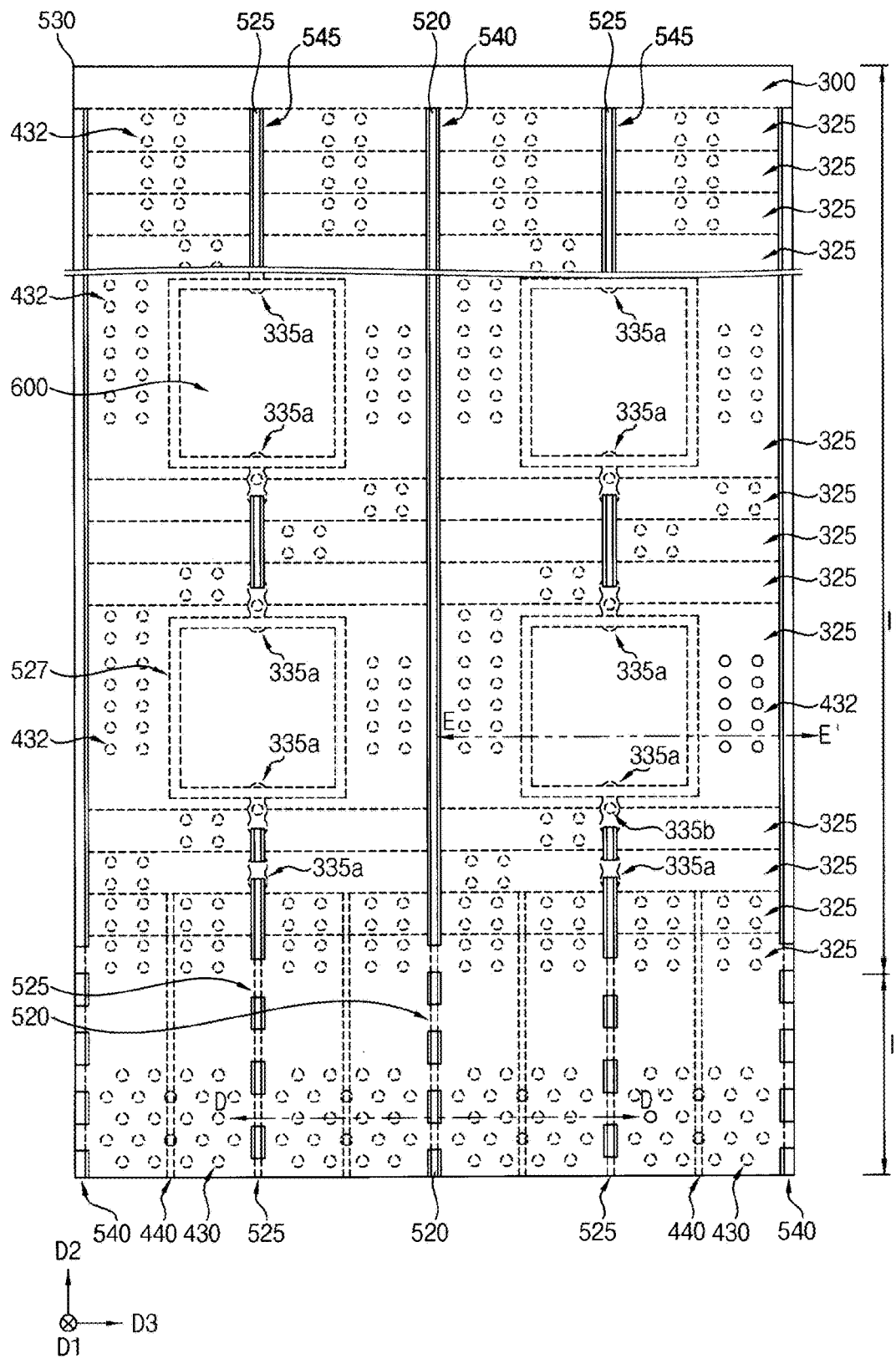
Figure 31:
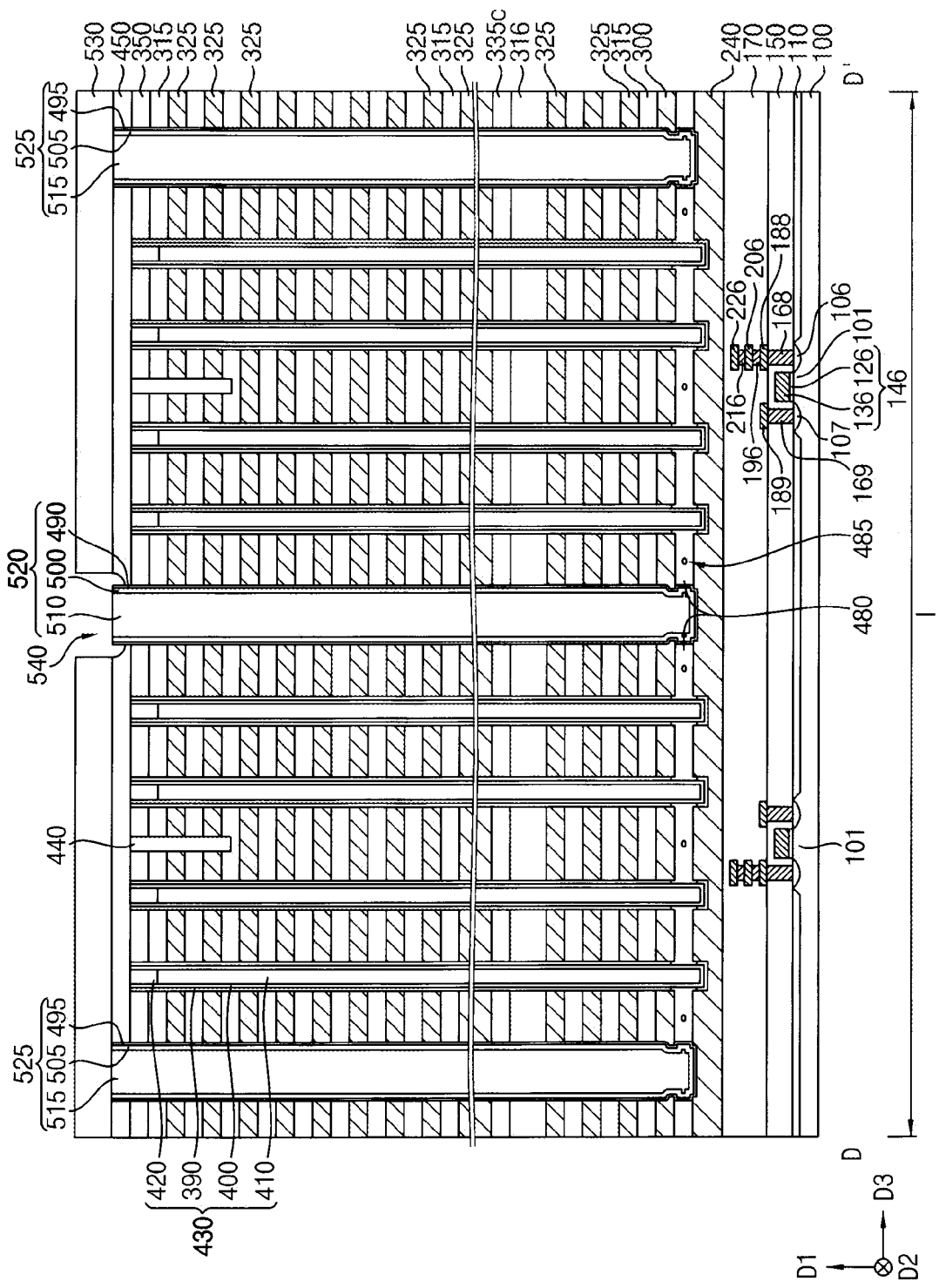

Referring to FIGS. 30 and 31, a second support layer 530 may be formed on the fifth insulating interlayer 450, the second and third sacrificial layer structures 520 and 525, and the etch stop structure 527, and may be partially etched to form fifth and sixth openings 540 and 545.

In some example embodiments, the fifth opening 540 may overlap the second sacrificial layer structure 520 in the first direction D1. In the drawing, the fifth opening 540 continuously extends in the second direction D2 on the second region II of the substrate 100, and a plurality of fifth openings 540 is spaced apart from each other in the second direction D2 on the first region I of the substrate 100. However, inventive concepts may not be limited thereto, and a plurality of fifth openings 540 may be spaced apart from each other in the second direction D2 even on the second region II of the substrate 100. In an example embodiment, the fifth opening 540 may have a width in the third direction D3 greater than that of the second sacrificial layer structure 520, however, inventive concepts may not be limited thereto.

In some example embodiments, the sixth opening 545 may overlap the third sacrificial layer structure 525 in the first direction D1. Thus, a plurality of sixth openings 545 may be spaced apart from each other in the second direction D2 on the second region II of the substrate 100. Additionally, a plurality of sixth openings 545 may be spaced apart from each other in the second direction D2 on the same third sacrificial layer structure 525 even on the first region I of the substrate 100. In an example embodiment, the sixth opening 545 may have a width in the third direction D3 greater than that of the third sacrificial layer structure 525, however, inventive concepts may not be limited thereto.

In some example embodiments, the fifth and sixth openings 540 and 545 may be arranged in a zigzag pattern in the second direction D2 on the first region I of the substrate 100. The fifth and sixth openings 540 and 545 may partially overlap each other in the third direction D3.

The second support layer 530 may include an oxide, e.g., silicon oxide. The etch stop structure 527 may be entirely covered by the second support layer 530, and may not be exposed.

Figure 32:
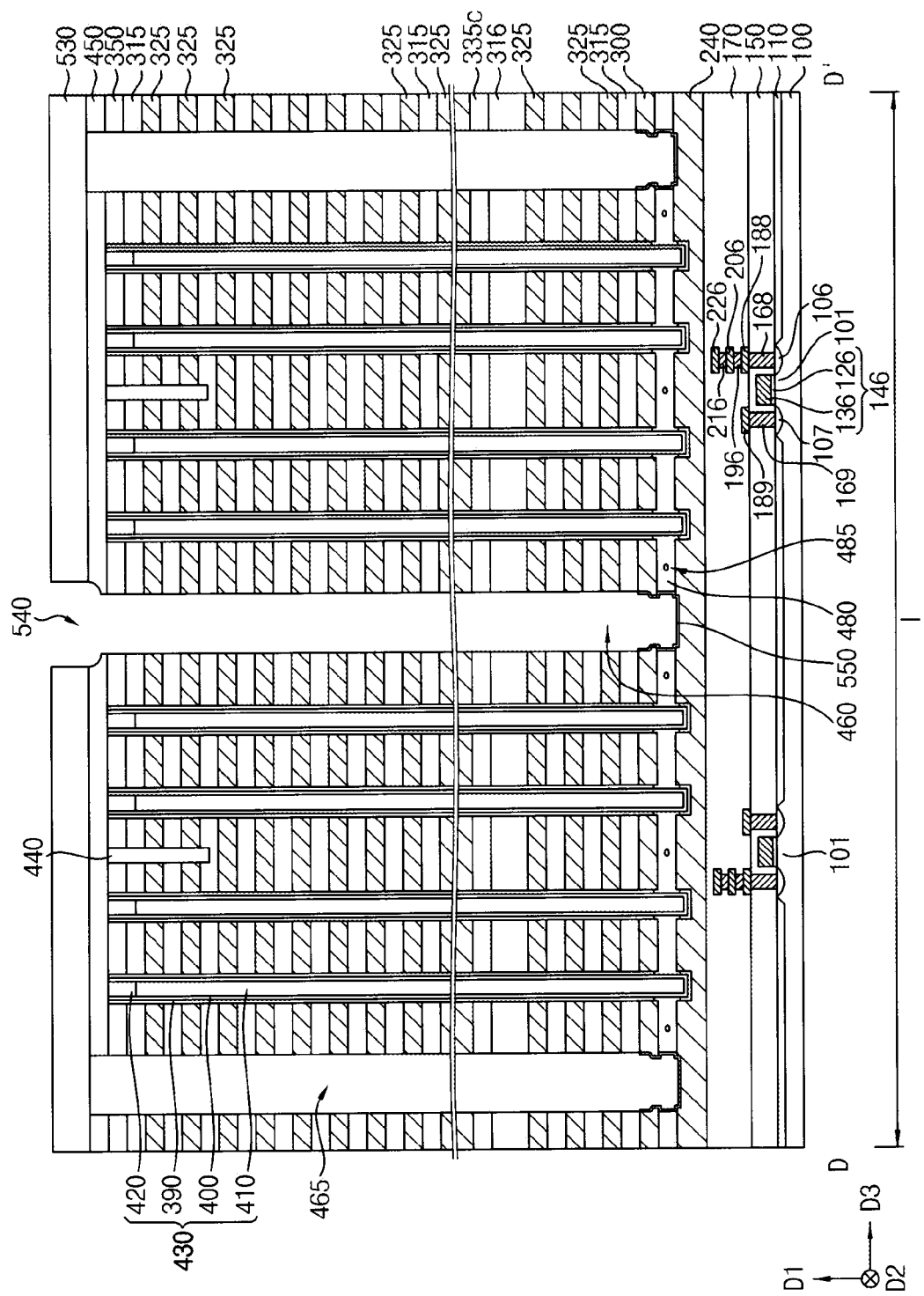

Referring to FIG. 32, the second and third sacrificial layer structures 520 and 525 may be removed by an etching process through the fifth and sixth openings 540 and 545, and thus the second and third openings 460 and 465 may be formed again.

As illustrated above, the fifth and sixth openings 540 and 545 might not entirely expose but partially cover upper surfaces of the second and third sacrificial layer structures 520 and 525, respectively, on the first region I of the substrate 100, an thus, even though the second and third openings 460 and 465 are formed again by the etching process, the upper surfaces of the second and third sacrificial layer structures 520 and 525 may be at least partially covered by the second support layer 530. Accordingly, even though an upper surface of the mold is high and an extension length in the second direction D2 is large, the mold might not lean or fall down in the third direction D3, due to the second support layer 530 at least partially covering portions of the mold where the second and third openings 460 and 465 are formed.

A plurality of third openings 465 is spaced apart from each other in the second direction D2 on the second region II of the substrate 100 so that a portion of the mold remain between the third openings 465, and the support structures 432 extend through the mold, and thus the mold may not lean or fall down in the third direction D3 due to the portion of the mold and the support structures 432.

In some example embodiments, the second and third sacrificial layer structures 520 and 525 may be removed by a wet etching process.

An oxidation process may be performed on a layer structure including silicon and exposed by the second and third openings 460 and 465 to form a protection layer 550. In some example embodiments, as the oxidation process is performed, the protection layer 550 may be formed on the upper surface of the CSP 240 exposed by the second and third openings 460 and 465, a sidewall of the channel connection pattern 480, and a sidewall of the first support layer 300. The protection layer 550 may include, e.g., silicon oxide.

Figure 33:
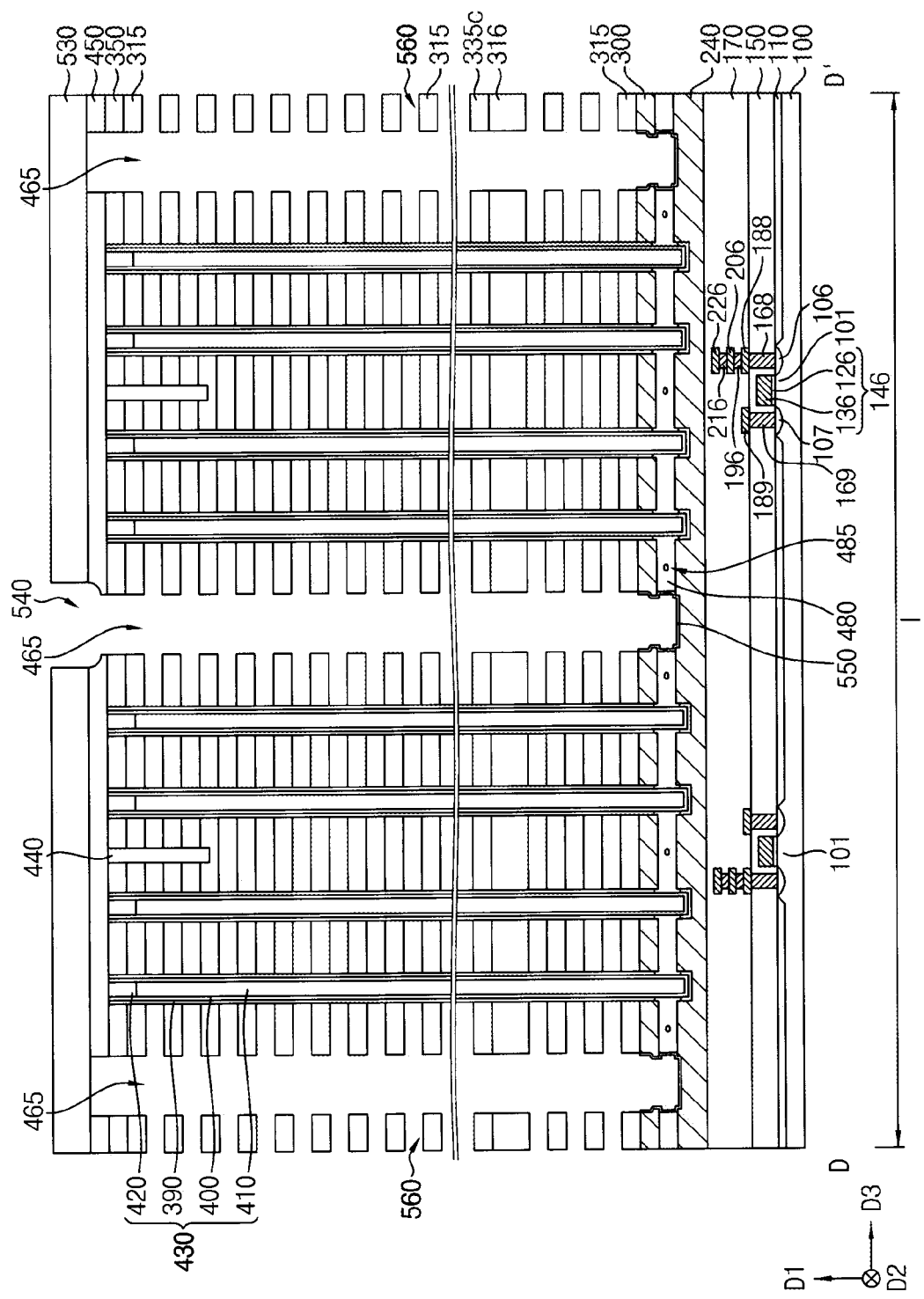
Figure 34:
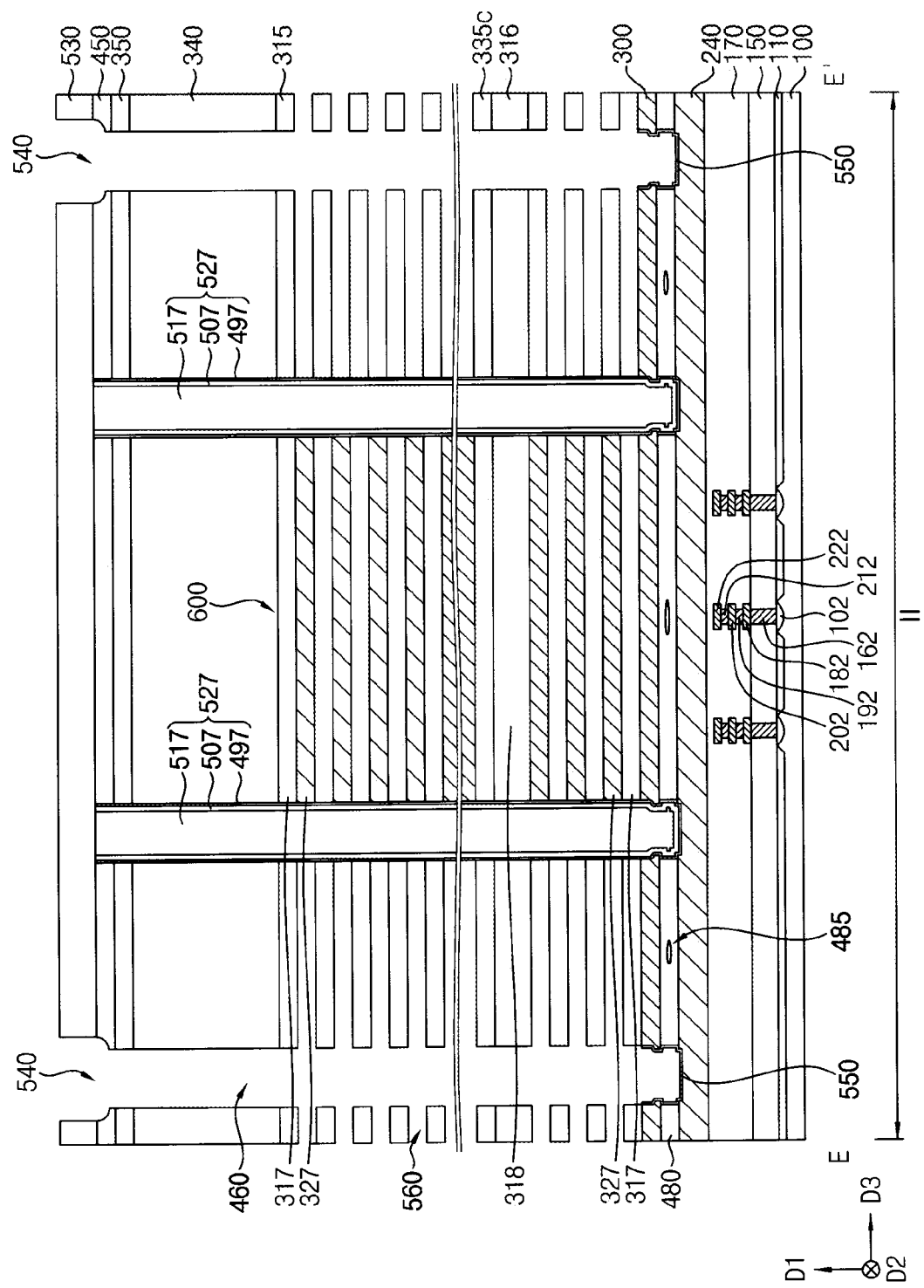

Referring to FIGS. 33 and 34, the fourth sacrificial patterns 325 exposed by the second and third openings 460 and 465 may be removed to form a third gap 560 between the first insulation patterns 315, and an outer sidewall of the charge storage structure 390 included in the memory channel structure 430 and an outer sidewall of the dummy charge storage structures 392 included in the support structure 432 may be partially exposed by the third gap 560.

In some example embodiments, the fourth sacrificial patterns 325 may be removed by a wet etching process using, e.g., phosphoric acid ($H_3PO_4$) and/or sulfuric acid ($H_2SO_4$).

The wet etching process may be performed through the second and third openings 460 and 465, and a portion of the fourth sacrificial pattern 325 between the second and third openings 460 and 465 may be entirely removed by an etching solution provided through the second and third openings 460 and 465 in two ways. However, the etching solution may be provided only in one way through the second opening 460 at an area where the etch stop structure 527 is formed, and thus the fourth sacrificial pattern 325 might not be entirely removed but partially remain.

An outer sidewall of the etch stop structure 527 may be exposed by the wet etching process, however, the third etch stop pattern 497 having an etching selectivity with respect to the fourth sacrificial pattern 325 may be formed on the outer sidewall of the etch stop structure 527, so that the etch stop structure 527 might not be removed by the wet etching process. Accordingly, portions of the third to fifth insulation patterns 317, 318 and 319 surrounded by the etch stop structure 527 might not be removed, either.

Figure 35:
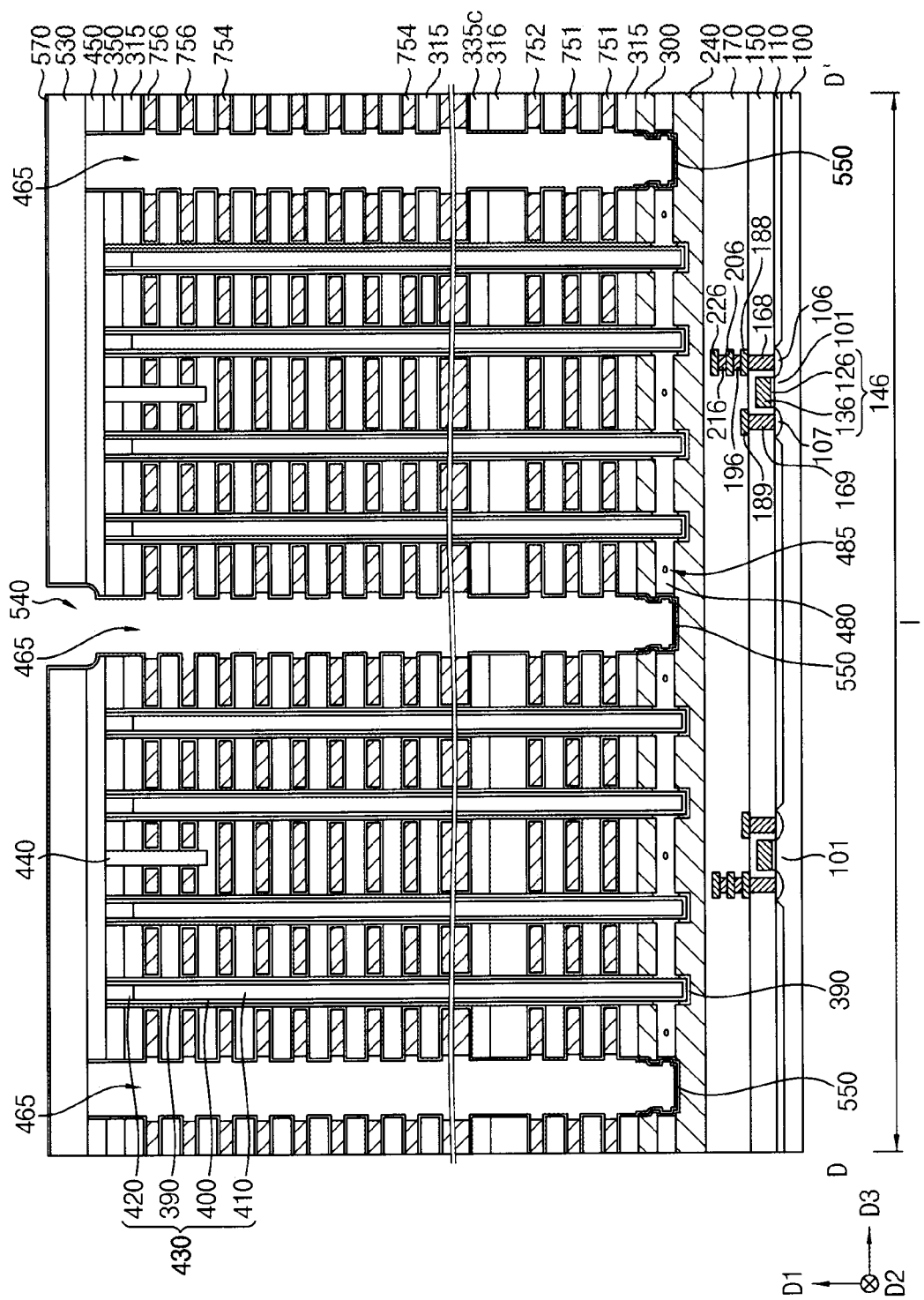
Figure 36:
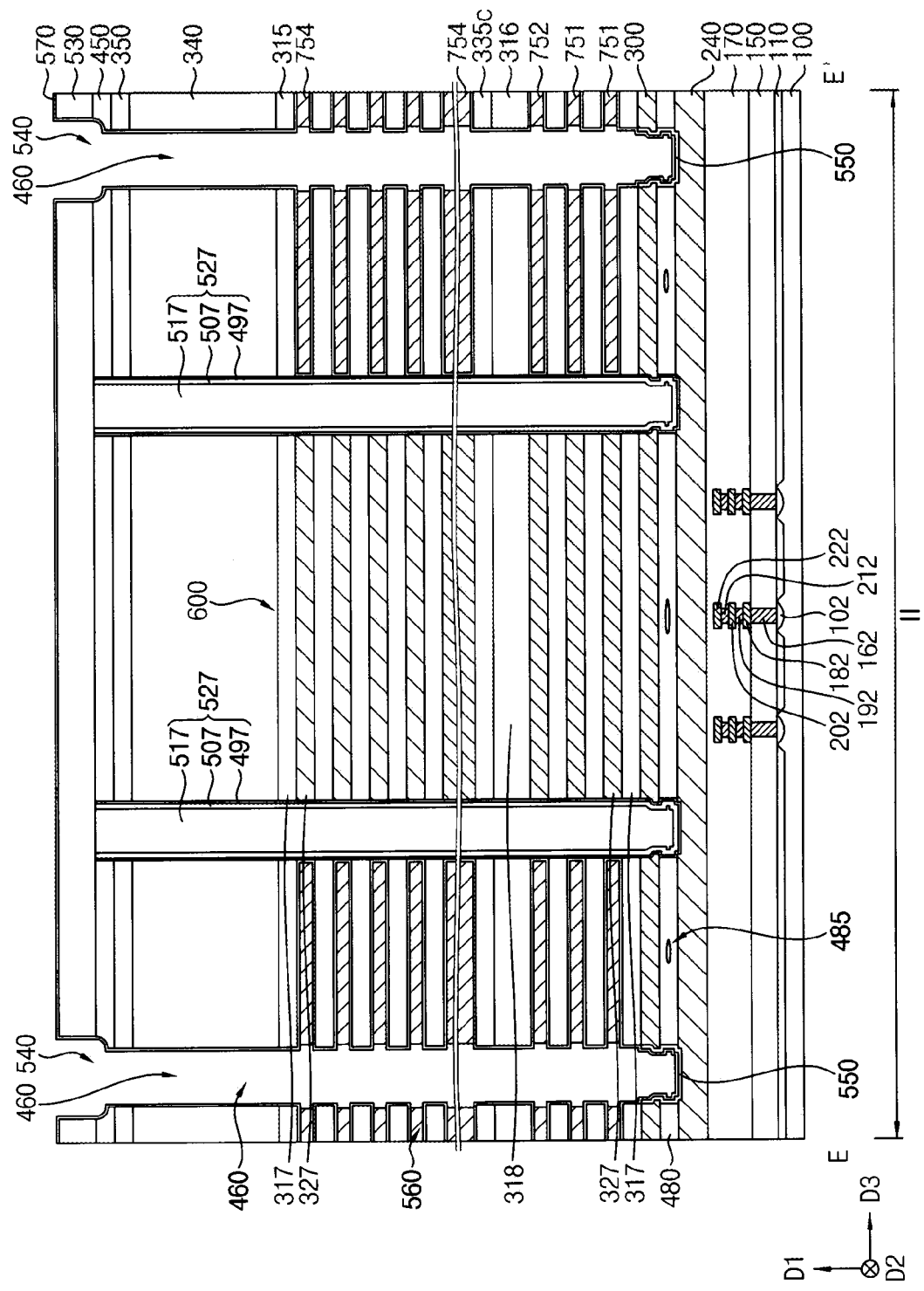

Referring to FIGS. 35 and 36, a second blocking layer 570 may be formed on the outer sidewall of the charge storage structure 390 exposed by the second and third openings 460 and 465, the outer sidewall of the dummy charge storage structure 392 included in the support structure 432 exposed by the second and third openings 460 and 465, inner walls of the third gaps 560, surfaces of the first insulation patterns 315, an upper surface of the protection layer 550, a sidewall and an upper surface of the fifth insulating interlayer 450, and a sidewall and an upper surface of the second support layer 530, and a gate electrode layer may be formed on the second blocking layer 570.

The gate electrode layer may include a gate barrier layer and a gate conductive layer sequentially stacked. The gate electrode layer may include a low resistance metal, and the gate barrier layer may include a metal nitride. The second blocking layer 570 may include a metal oxide, e.g., aluminum oxide, hafnium oxide, zirconium oxide, etc.

The gate electrode layer may be partially removed to form a gate electrode in each of the third gaps 560. In some example embodiments, the gate electrode layer may be partially removed by a wet etching process. As a result, the fourth sacrificial pattern 325 in the mold having the staircase shape including the fourth sacrificial pattern 325 and the first insulation pattern 315 sequentially stacked as a step layer may be replaced with the gate electrode and the second blocking layer 570 covering lower and upper surfaces of the gate electrode.

In some example embodiments, the gate electrode may extend in the second direction D2, and a plurality of gate electrodes may be spaced apart from each other in the first direction D1 to form a gate electrode structure. The gate electrodes may be staked in a staircase shape in which extension lengths in the second direction D2 decrease in a stepwise manner from a lowermost level toward an uppermost level. An end portion in the second direction D2 of each of the gate electrodes that is not overlapped with upper gate electrodes in the first direction D1, that is, the step of each of the step layers may be referred to as a pad. The gate electrode structure may include first pads having a relatively short length in the second direction D2 and second pads having a relatively large length in the second direction D2. The numbers of the first and second pads might not be limited.

Additionally, a plurality of gate electrode structures may be formed in the third direction D3. That is, the gate electrode structures may be spaced apart from each other in the third direction D3 by the second openings 460. As illustrated above, the third opening 465 might not extend in the second direction D2 to opposite ends in the second direction D2 of the gate electrode structure, but a plurality of third openings 465 may be spaced apart from each other in the second direction D2, and thus the gate electrode structure might not be divided by the third openings 465. However, one of the gate electrodes at a lowermost level may be divided in the third direction D3 by the third and fourth openings 465 and 467, the first division pattern 335 and the insulation pattern structure 600, and each one of the gate electrodes at upper two levels may be divided in the third direction D3 by the third opening 465 and the second division pattern 440.

In some example embodiments, the gate electrode structure may include first to fourth gate electrodes 751, 752, 754 and 756 sequentially stacked in the first direction D1. In some example embodiments, the first gate electrode 751 may be formed at a lowermost level and a second level from below, and may serve as a GIDL gate electrode for being used in erase operation. The second gate electrode 752 may be formed on the first gate electrode 751, and may serve as a ground selection line (GSL). The fourth gate electrode 756 may be formed at an uppermost level and a second level from above, and may serve as a string selection line (SSL). The third gate electrode 754 may be formed at a plurality of levels between the second and fourth gate electrodes 752 and 756, and may serve as word lines, respectively. However, the numbers of levels at which the first to fourth gate electrodes 751, 752, 754 and 756 are formed might not be limited to the above, and may be varied.

Additionally, the first gate electrode 751 may be further formed on the fourth gate electrode 756. For example, if the first gate electrode 751 is further formed at an uppermost level and a second level from above, the first and fourth gate electrodes 751 and 756 at upper four levels, respectively, of the mold may be divided in the third direction D3 by the third opening 465 and the second division patterns 440 at opposite sides in the third direction D3.

In some example embodiments, each of the memory blocks between neighboring ones of the second openings 460 in the third direction D3 may include two GSLs, one word line and four SSLs at each level, however, inventive concepts might not be limited thereto.

Figure 37:
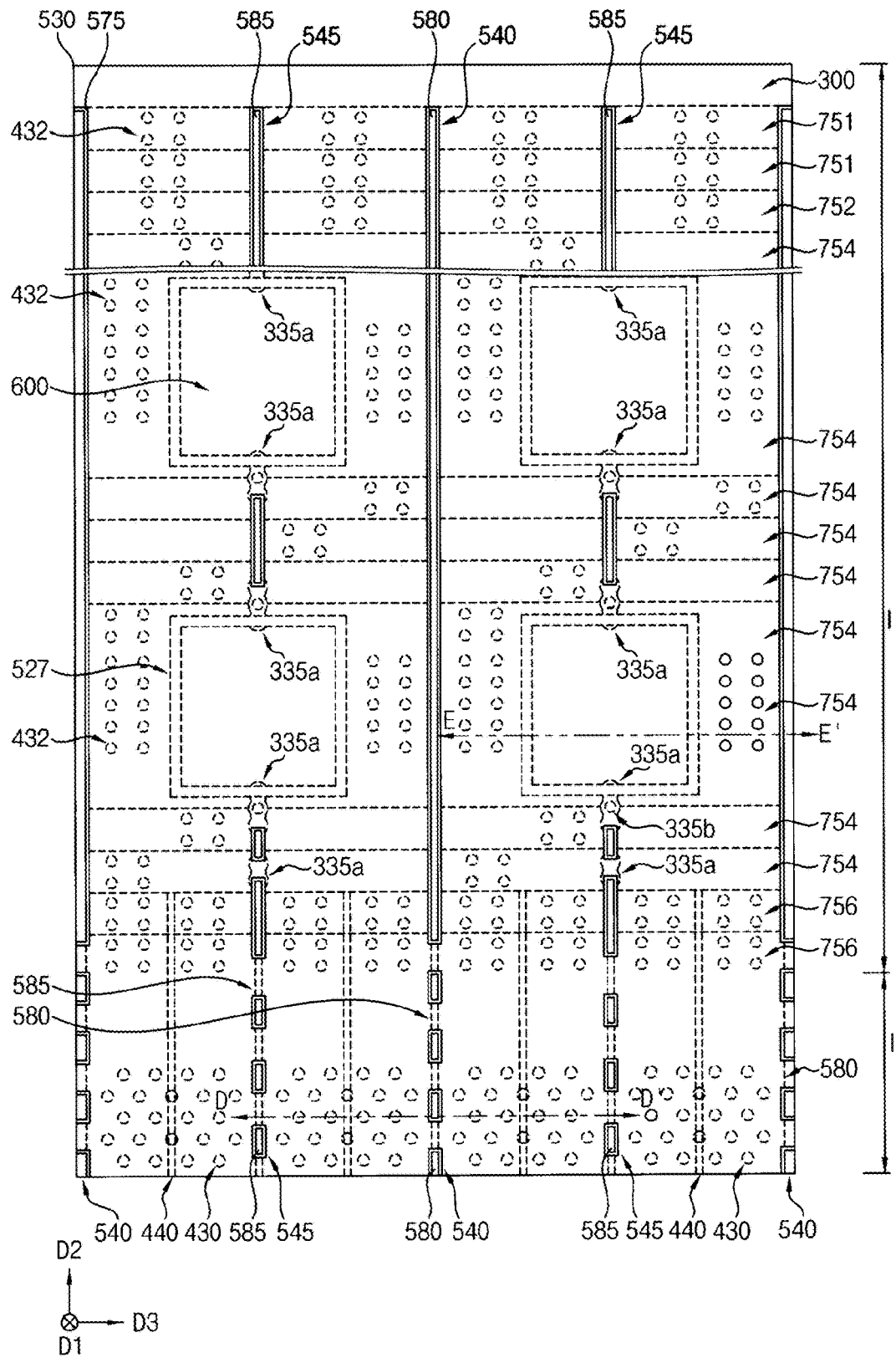
Figure 38:
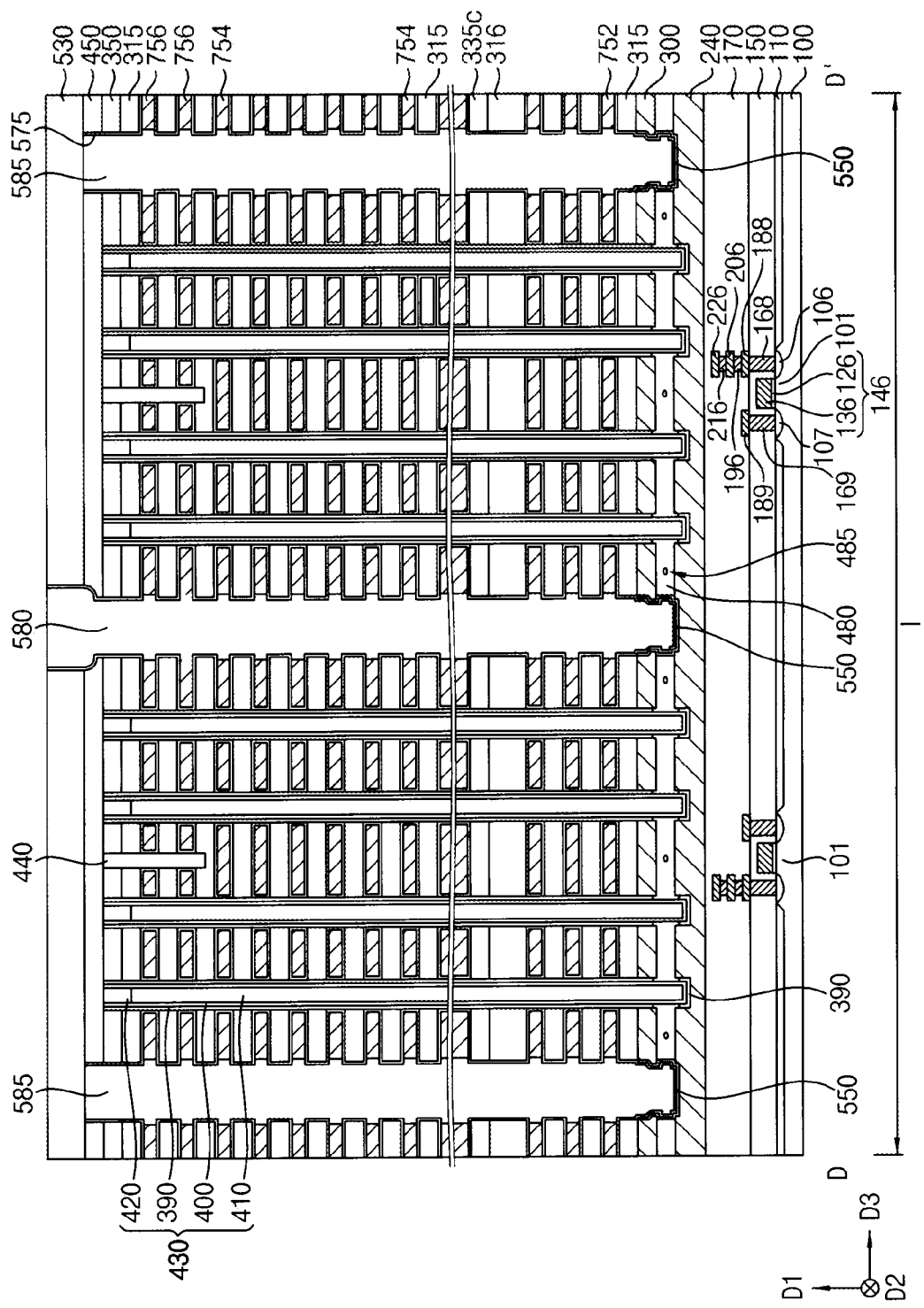
Figure 39:
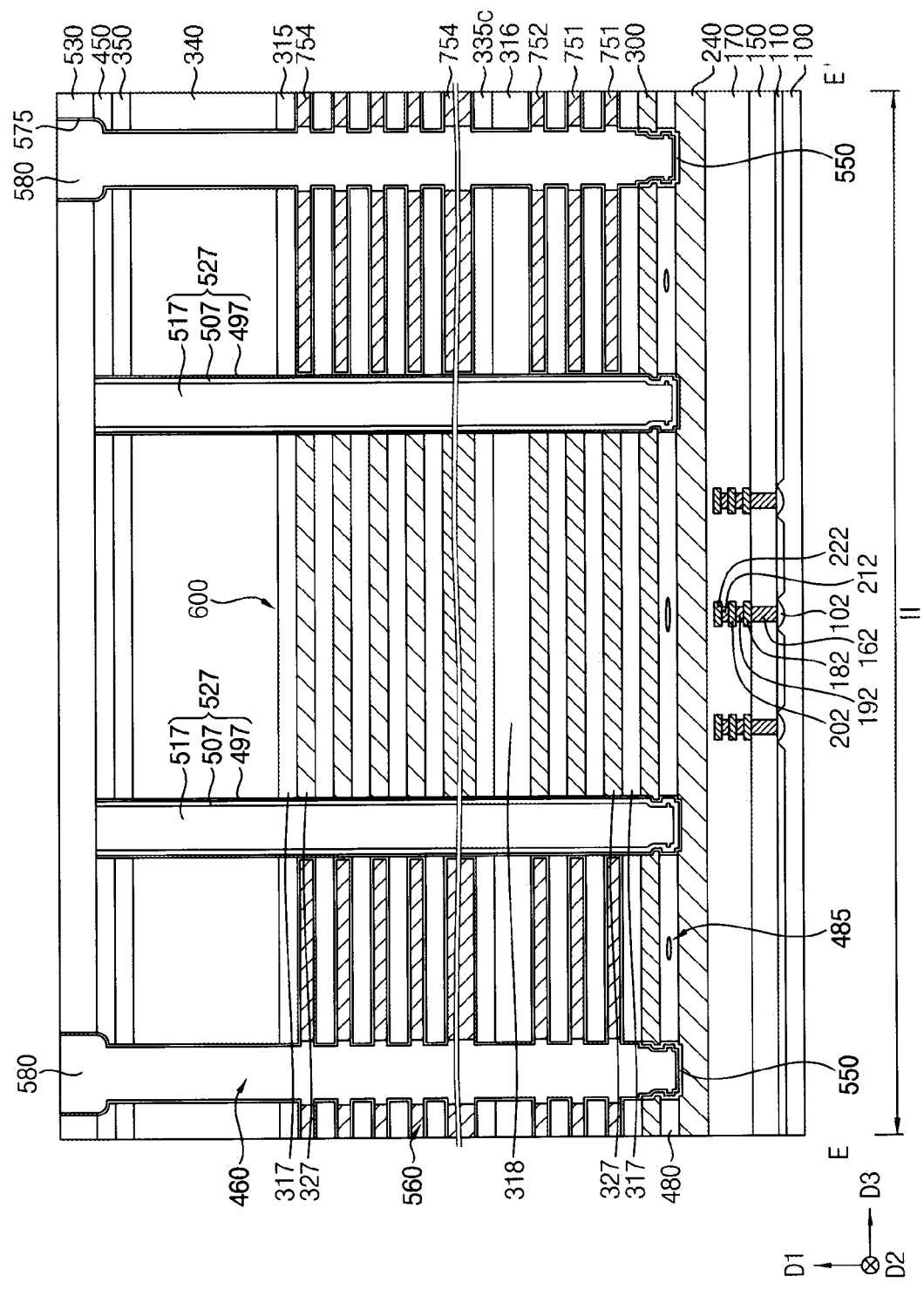

Referring to FIGS. 37 to 39, a third division pattern 580 filling the second and fifth openings 460 and 540 and a fourth division pattern 585 filling the third and sixth openings 465 and 545 may be formed on the second blocking layer 570, and may be planarized until an upper surface of the second support layer 530 is exposed. Thus, the second blocking layer 570 may be transformed into a second blocking pattern 575.

The third and fourth division patterns 580 and 585 may include an oxide, e.g., silicon oxide.

Referring to FIGS. 40 to 42, first to fourth upper contact plugs 610, 620, 622 and 624 may be formed through the second support layer 530, the third to fifth insulating interlayers 340, 350 and 450, and the first insulation pattern 315 on the second region II of the substrate 100.

The first to fourth contact plugs 610, 620, 622 and 624 may contact pads of the fourth, third, second and first gate electrodes 756, 754, 752 and 751, respectively. In some example embodiments, each of the first to fourth upper contact plugs 610, 620, 622 and 624 may be formed in an area surrounded by the support structure 432 in each of the first and second pads of the gate electrode structure. For example, the support structures 432 may be disposed at vertices of a rectangle in a plan view, and each of the first to fourth upper contact plugs 610, 620, 622 and 624 may be formed in an inside of the rectangle.

FIG. 40 shows exemplary layouts of the first to fourth upper contact plugs 610, 620, 622 and 624, however, inventive concepts may not be limited thereto, and thus the numbers and layouts of the first to fourth upper contact plugs 610, 620 and 622 may be varied.

Figure 43:
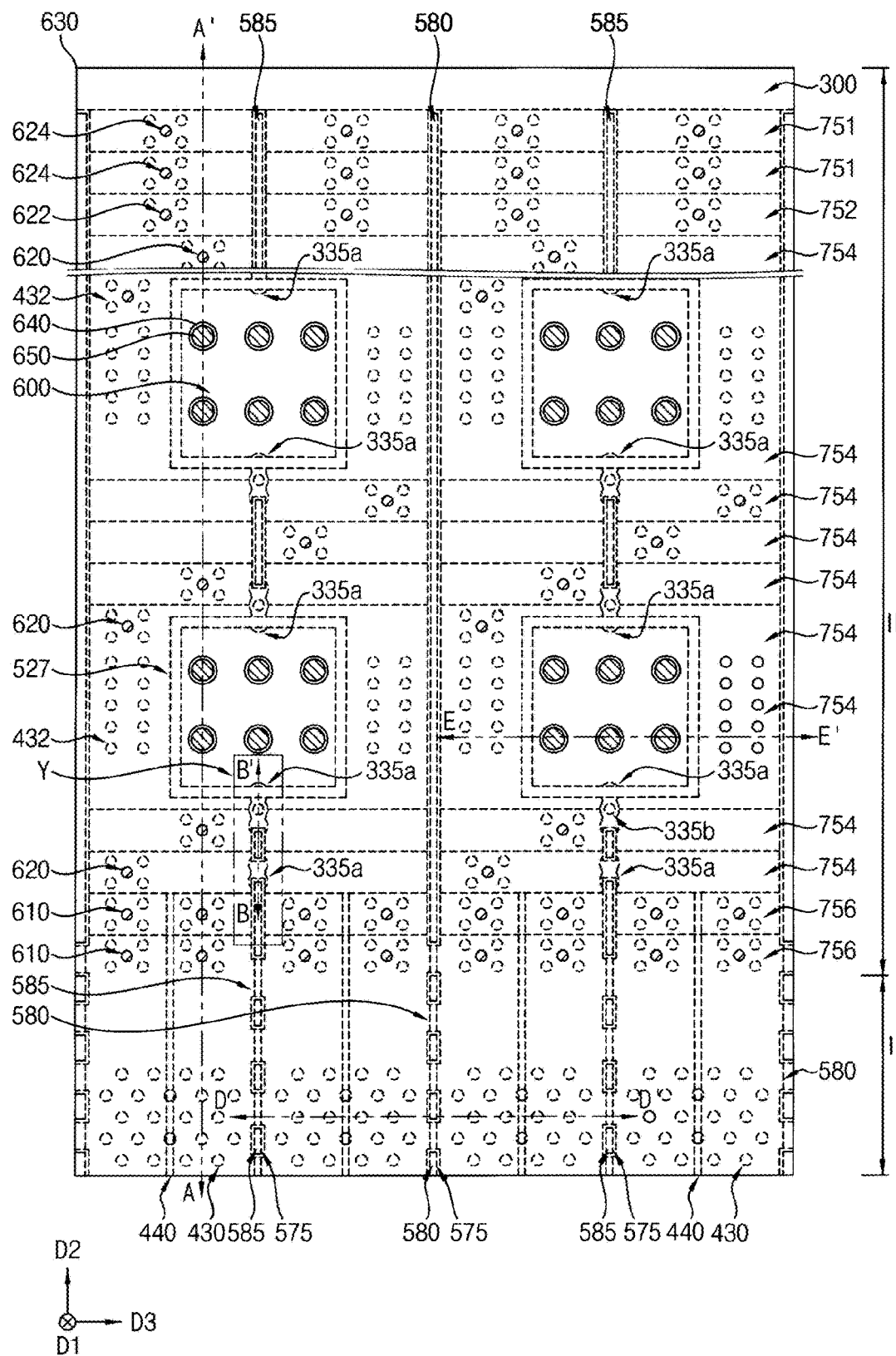
Figure 44:
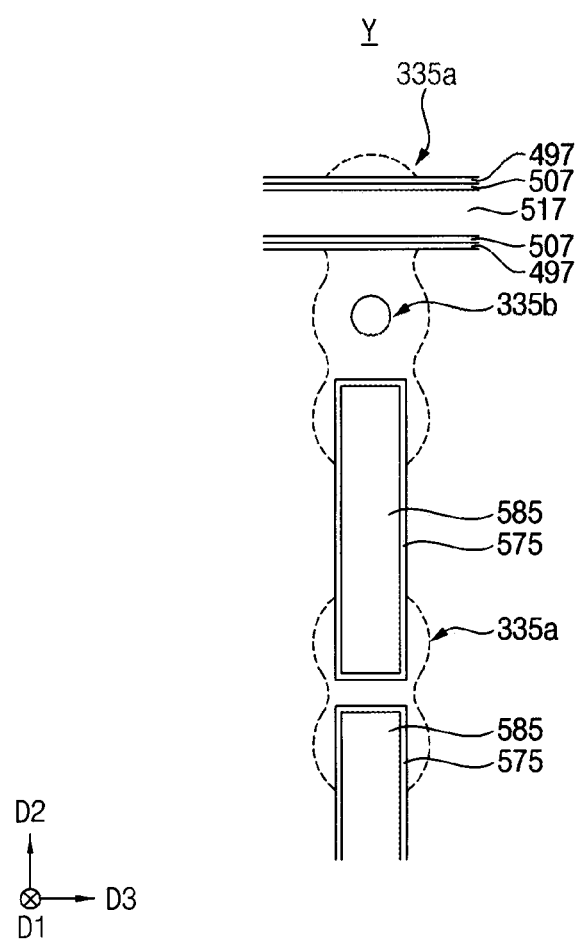
Figure 45:
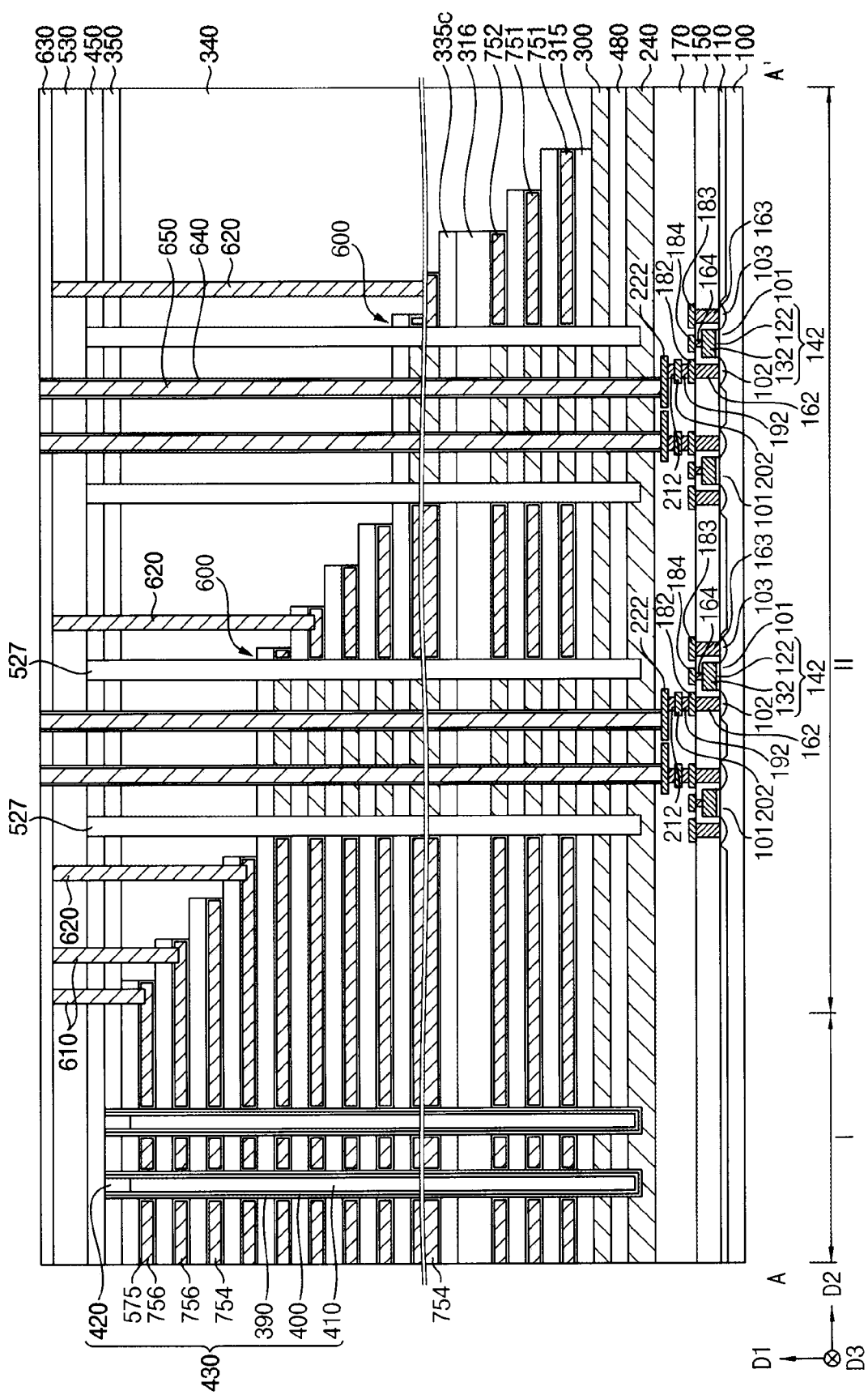
Figure 46:
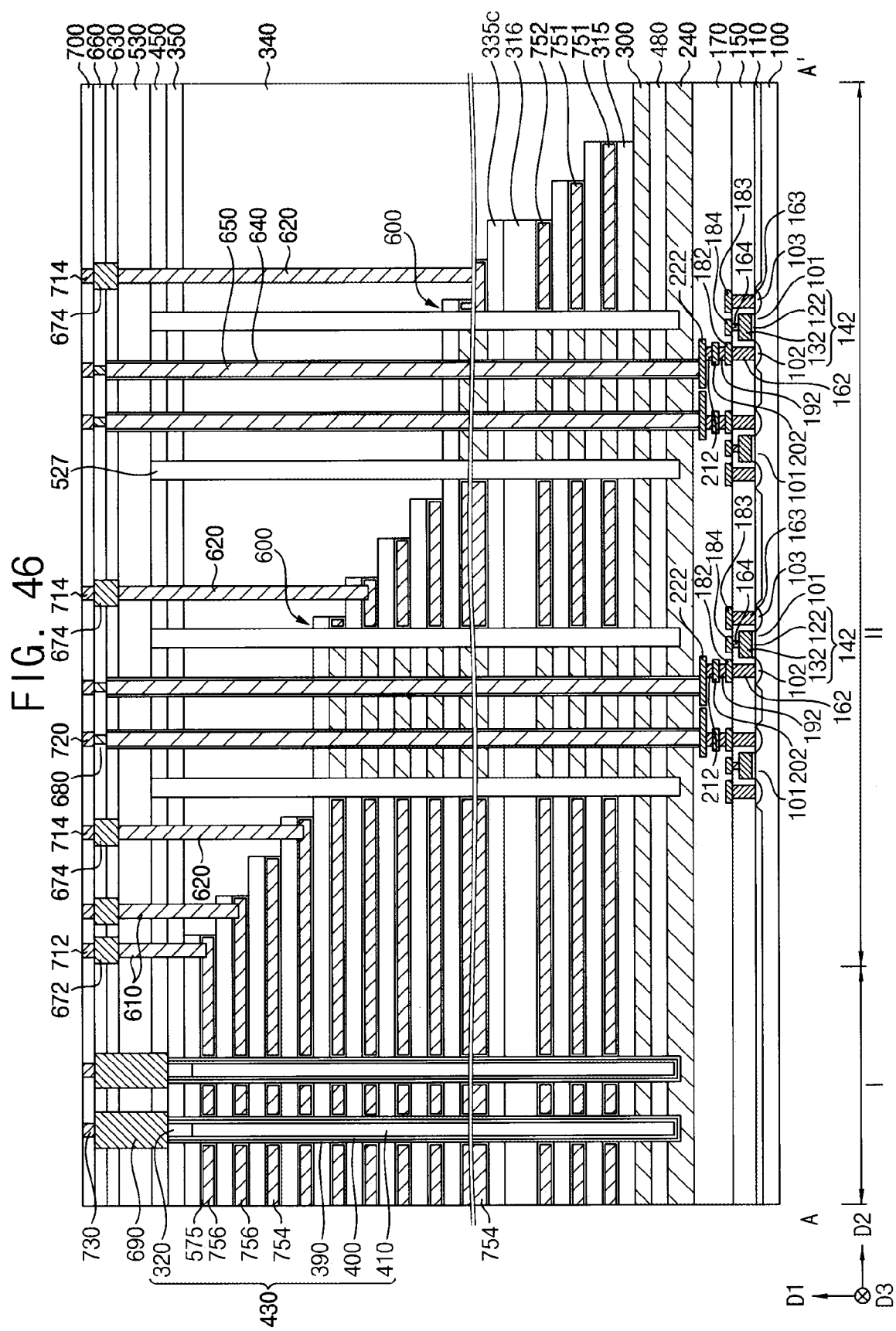
Figure 47:
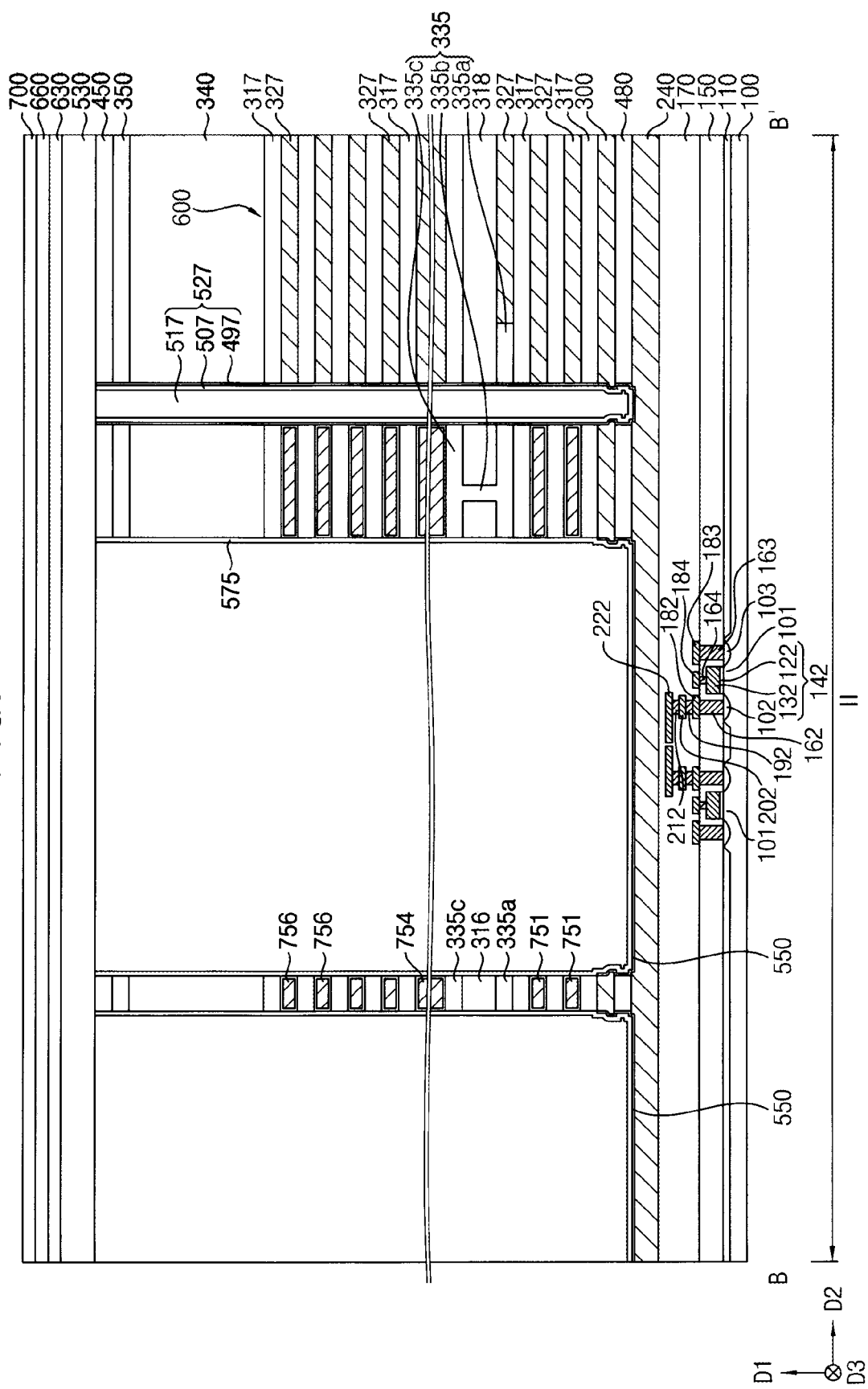

Referring to FIGS. 43 to 45, a sixth insulating interlayer 630 may be formed on the second support layer 530 and the first to fourth upper contact plugs 610, 620, 622 and 624, and a through via 650 may be formed through the insulation pattern structure 600 surrounded by the etch stop structure 527, the first support layer 300, the channel connection pattern 480, the CSP 240 and the second insulating interlayer 170 on the second region II of the substrate 100 to contact an upper surface of the eighth lower wiring 222.

A plurality of through vias 650 may be formed to be spaced apart from each other in an area where the insulation pattern structure 600 is formed. In the drawing, six through vias 650 are formed in each area, however, inventive concepts might not be limited thereto.

A sixth insulation pattern 640 may be formed on a sidewall of the through via 650, and may be electrically connected to the first support layer 300, the channel connection pattern 480 and the CSP 240. However, the through via 650 may extend through the insulation pattern structure 600, that is, the third to fifth insulation patterns 317, 318 and 327 to be electrically insulated from the first to fourth gate electrodes 751, 752, 754 and 756, and thus, if an additional insulation pattern is formed on sidewalls of the first support layer 300, the channel connection pattern 480 and the CSP, the sixth insulation pattern 640 might not be formed.

The first to fourth contact plugs 610, 620, 622 and 624 and the through via 650 may include, e.g., a metal, a metal nitride, a metal silicide, etc., and the sixth insulation pattern 640 may include an oxide, e.g., silicon oxide.

A common source contact plug may be further formed through a portion of the first support layer 300 that is not covered by the gate electrode structure.

Referring to FIGS. 46 to 49, a seventh insulating interlayer 660 may be formed on the sixth insulating interlayer 630, the sixth insulation pattern 640 and the through via 650, and fourth and fifth upper contact plugs 672 and 674, sixth and seventh upper contact plugs, and eighth and ninth upper contact plugs 680 and 690 may be formed.

The fourth and fifth upper contact plugs 672 and 674 and the sixth and seventh upper contact plugs may extend through the sixth and seventh insulating interlayers 630 and 660 to contact upper surfaces of the first to fourth upper contact plugs 610, 620, 622 and 624, respectively, the eighth upper contact plug 680 may extend through the seventh insulating interlayer 660 to contact an upper surface of the through via 650, and the ninth upper contact plug 690 may extend through the second support layer 530 and the fifth to seventh insulating interlayers 450, 630 and 660 to contact an upper surface of the capping pattern 420.

An eighth insulating interlayer 700 may be formed on the seventh insulating interlayer 660, the fourth and fifth upper contact plugs 672 and 674, the sixth and seventh upper contact plugs, and the eighth and ninth upper contact plugs 680 and 690, and first and second upper wirings 712 and 714, third and fourth upper wirings, and fifth and sixth upper wirings 720 and 730 may be formed.

The first and second upper wirings 712 and 714 may contact upper surfaces of the fourth and fifth upper contact plugs 672 and 674, respectively, the third upper wiring may contact upper surfaces of the sixth and seventh upper contact plugs, respectively, and the fifth and sixth upper wirings 720 and 730 may contact upper surfaces of the eighth and ninth upper contact plugs 680 and 690, respectively.

In some example embodiments, the sixth upper wiring 730 may extend in the third direction D3, and a plurality of sixth upper wirings 730 may be formed. The sixth upper wiring may serve as a bit line. Alternatively, an additional upper via and a seventh upper wiring may be further formed on the sixth upper wiring 730, and the seventh upper wiring may serve as a bit line.

The numbers and layouts of the first and second upper wirings 712 and 714, the third and fourth upper wirings, and the fifth upper wiring 720 on the second region II of the substrate 100 may be varied.

The fabrication of the semiconductor device may be completed by the above processes.

As illustrated above, the first insulation layer 310 and the fourth sacrificial layer 320 may be alternately and repeatedly stacked in the first direction D1, the second insulation layer 311 may be formed on the uppermost one of the fourth sacrificial layers 320, and the first holes 312 may be formed through the second insulation layer 311 to expose the uppermost one of the fourth sacrificial layers 320. The exposed uppermost one of the fourth sacrificial layers 320 may be removed by, e.g., a wet etching process, which is an isotropic etching process, to form the first gap 322 exposing the uppermost one of the first insulation layers 310, the first division layer 330 may be formed on the uppermost one of the first insulation layers 310 and the second insulation layer 311 to fill the first gap 322 and the first holes 312, and an upper portion of the first division layer 330 may be planarized by, e.g., a buffing CMP process. The fourth sacrificial layer 320 and the first insulation layer 310 may be further stacked on the first division layer 330 alternately and repeatedly to form the mold layer.

The first division layer 330 may have a flat upper surface, and thus the fourth sacrificial layers 320 and the first insulation layers 310 alternately and repeatedly stacked on the first division layer 330 may not be bent but have uniform heights at an area overlapping the first gap 322 in the first direction D1. Conventionally, due to the bending of a portion of the mold layer on a division pattern for dividing the GSL, the electrical characteristics of the semiconductor device may be deteriorated, and thus, the portion of the mold layer has to be excessively removed in order to the deterioration of the electrical characteristics, which may aggravate the process margin in order to secure a distance from neighboring structures, e.g., the support structures 432. However, in some example embodiments, the first division layer 330 filling the first gap 322 on the second insulation layer 311 may have the flat upper surface, and thus the portion of the mold layer overlapping the first gap 322 may not be bent, so as not to be excessively removed, which may increase the process margin. Additionally, the gate electrodes 751, 752, 754 and 756 that may be formed by replacing the fourth sacrificial layers 320 each of which may be stacked at a uniform height may have enhanced electrical characteristics.

The semiconductor device may have the following structural characteristics.

Referring to FIGS. 43 and 44 and FIGS. 46 to 49, the semiconductor device may include the lower circuit patterns on the substrate 100 including the first region I and the second region II at least partially surrounding the first region I; the CSP 240 over the lower circuit patterns; the gate electrode structure including the gate electrodes 752, 754 and 756, each of which may extend in the second direction D2, spaced apart from each other in the first direction D1 on the CSP 240; the memory channel structure 430 including the channel 400 extending in the first direction D1 through the gate electrode structure on the first region I of the substrate 100 to contact the upper surface of the CSP 230 and the charge storage structure 390 on the outer sidewall of the channel 400; the third division pattern 580 extending in the second direction D2 on each of opposite sides in the third direction D3 of the gate electrode structure; the fourth division patterns 585, each of which may extend in the second direction D2 through the gate electrode structure between the third division patterns 580, spaced apart from each other in the second direction D2; the first division pattern 335 between the fourth division patterns 585 and dividing the second gate electrode 752 in the third direction D3 together with the fourth division patterns 585; the insulation pattern structure 600 extending through a portion of the gate electrode structure on the CSP 240; the through via 650 extending in the first direction D1 through the insulation pattern structure 600 and the CSP 240 to contact and be electrically connected to one of the lower circuit patterns; the contact plugs 610, 620, 622 and 624 extending in the first direction D1 to contact end portions in the second direction D2, that is, the pads of the gate electrodes 752, 754 and 756; and the support structure 432 extending in the first direction D1 through the gate electrode structure to contact the upper surface of the CSP 240, which may be adjacent to the contact plugs 610, 620, 622 and 624.

In some example embodiments, the first division pattern 335 may include the first horizontal portion 335a at the same level as the second gate electrode 752 serving as the GSL and dividing the second gate electrode 752, the vertical portion connected to and extending from the first horizontal portion 335a through the second insulation pattern 315 in the first direction D1, and the second horizontal portion 335c connected to an upper end of the vertical portion 335b and on the second insulation pattern 316.

In some example embodiments, the first horizontal portion 335a of the first division pattern 335 may have a curved outer contour in a plan view. For example, the first horizontal portion 335a of the first division pattern 335 may extend in the second direction D2, and may have an outer contour of a shape of a peanut, e.g. a two pea or three pea or more than three pea peanut, from which opposite ends in the second direction D2 are removed when viewed in a plan view. Alternatively or additionally, the first horizontal portion 335a of the first division pattern 335 may extend in the third direction D3, and may have an outer contour of a shape of a peanut from which opposite ends in the third direction D3 are removed when viewed in a plan view. Alternatively or additionally, the first horizontal portion 335a of the first division pattern 335 may extend in a fourth direction having an acute angle with the second and third directions D2 and D3, and may have an outer contour of a shape of a peanut from which opposite ends in the fourth direction are removed when viewed in a plan view.

In some example embodiments, the first horizontal portion 335a of the first division pattern 335 may partially overlap the fourth division pattern 585 in the third direction D3. That is, the fourth division pattern 585 may extend through opposite ends of the first horizontal portion 335a of the first division pattern 335 in an extension direction thereof, and thus the first horizontal portion 335a of the first division pattern 335 may have a shape of a peanut from which opposite ends are removed.

In some example embodiments, the vertical portion 335b of the first division pattern 335 may have an outer contour of a shape of a circle or ellipse in a plan view.

In some example embodiments, the third gate electrode 754 serving as a word line may be formed on the second horizontal portion 335c of the first division pattern 335. Additionally, the first gate electrode 751 under the second gate electrode 752 may be or correspond to a GIDL gate electrode, and the first gate electrode 751 may be further formed over the fourth gate electrode 756 serving as an SSL.

In some example embodiments, the insulation pattern structure 600 may be surrounded by the etch stop structure 527, and the etch stop structure 527 may partially extend through the second horizontal portion 335c of the first division pattern 335 and the first horizontal portion 335a and/or the vertical portion 335b as well. The etch stop structure 527 may include a first extension portion extending in the second direction D2 and a second extension portion extending in the third direction D3, and the second extension portion may partially extend through the first horizontal portion 335a and/or the vertical portion 335b of the first division pattern 335.

In some example embodiments, the gate electrode structure and the third and fourth division patterns 580 and 585 may be formed on the first and second regions I and II of the substrate 100, the memory channel structure 430 may be formed on the first region I of the substrate 100, and the first division pattern 335 may be formed on the second region II of the substrate 100.

In some example embodiments, the memory channel structure 430 may include the channel 400 having a cup-like shape, the charge storage structure 390 on the outer sidewall of the channel 400, the first filling pattern 410 filling the inner space defined by the channel 400, and the capping pattern 420 on the channel 400 and the first filling pattern 410 and contacting the inner sidewall of the charge storage structure 390.

In some example embodiments, the support structure 432 may have the same structure as the memory channel structure 430, however, the support structure 432 may be or correspond a dummy memory channel structure so as not serve as the channel 400 or the charge storage structure 390, but may support, e.g. mechanically support, the semiconductor device.

Figure 50:
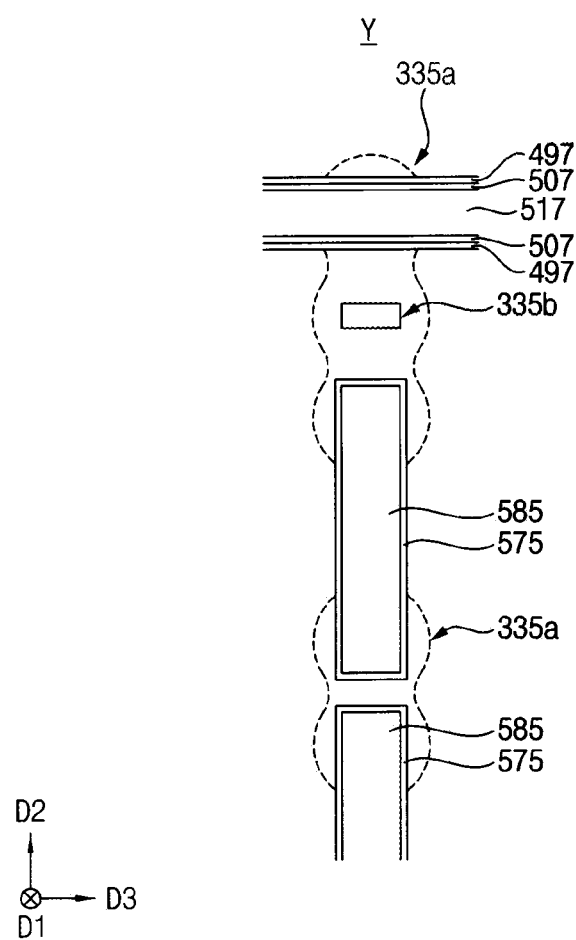
FIG. 50 is a plan view illustrating a shape of the first division pattern included in a semiconductor device in accordance with some example embodiments, which may correspond to FIG. 44.

FIG. 50 is a plan view illustrating a shape of the first division pattern included in a semiconductor device in accordance with some example embodiments, which may correspond to FIG. 44.

Referring to FIG. 50, the vertical portion 335b of the first division pattern 335 may have, e.g., a bar shape extending in the second direction D2 in a plan view. Alternatively, the vertical portion 335b of the first division pattern 335 may have, e.g., a bar shape extending in the third direction D3 in a plan view.

Figure 51:
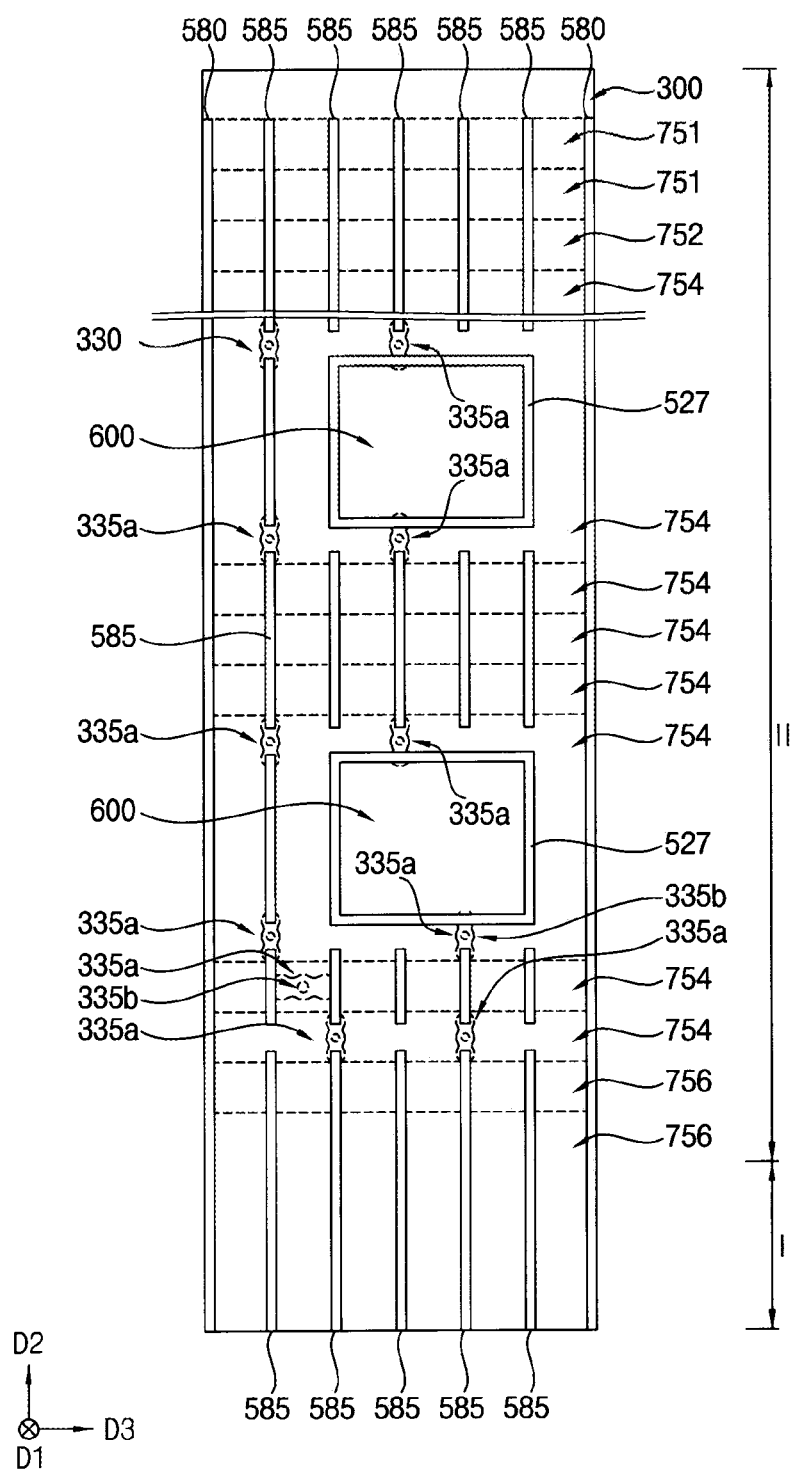
FIG. 51 is a plan view illustrating layouts of the etch stop structure and the first and fourth division patterns in a semiconductor device in accordance with some example embodiments, which shows one memory block of the semiconductor device.

FIG. 51 is a plan view illustrating layouts of the etch stop structure and the first and fourth division patterns in a semiconductor device in accordance with some example embodiments, which shows one memory block of the semiconductor device.

Referring to FIG. 51, the fourth division patterns 585 each of which may extend in the second direction D2 may be spaced apart from each other in the third direction D3 between the third division patterns 580 each of which may extend in the second direction D2 on the first region I of the substrate 100 and a portion of the second region II of the substrate 100 where the pads of the gate electrodes at upper two levels, respectively, are formed.

The fourth division patterns 585 may be spaced apart from each other in the second direction D2 between the third division patterns 580 each of which may extend in the second direction D2 to form a fourth division pattern column, and a plurality of fourth division pattern columns may be spaced apart from each other in the third direction D3 on a portion of the second region II of the substrate 100 where the pads of the gate electrodes at other levels, respectively, are formed.

The etch stop structure 527 may extend through the second pad of the gate electrode between the third division pattern 580 and the fourth division pattern 585 spaced apart from the third division pattern 580 in the third direction D3, and may be formed between the fourth division patterns 585 spaced apart from each other in the second direction D2.

Ends of the fourth division patterns 585 spaced apart from each other in the second direction D2, or ends of the fourth division patterns 585 spaced apart from each other in the second direction D2 and the second extension portion of the etch stop structure 527 may extend through the first horizontal portion 335a of the first division pattern 335. Additionally or alternatively, portions of the fourth division patterns 585 spaced apart from each other in the third direction D3 may also extend through the first horizontal portion 335a of the first division pattern 335. Thus, the memory block may include desired numbers of the GSL, the word line and the SSL by using the fourth division patterns 585, the etch stop structure 527 and the first division pattern 335. In the drawings, the memory block includes six SSLs, one word line, and three GSLs at each level, however, inventive concepts may not be limited thereto.

Figure 48:
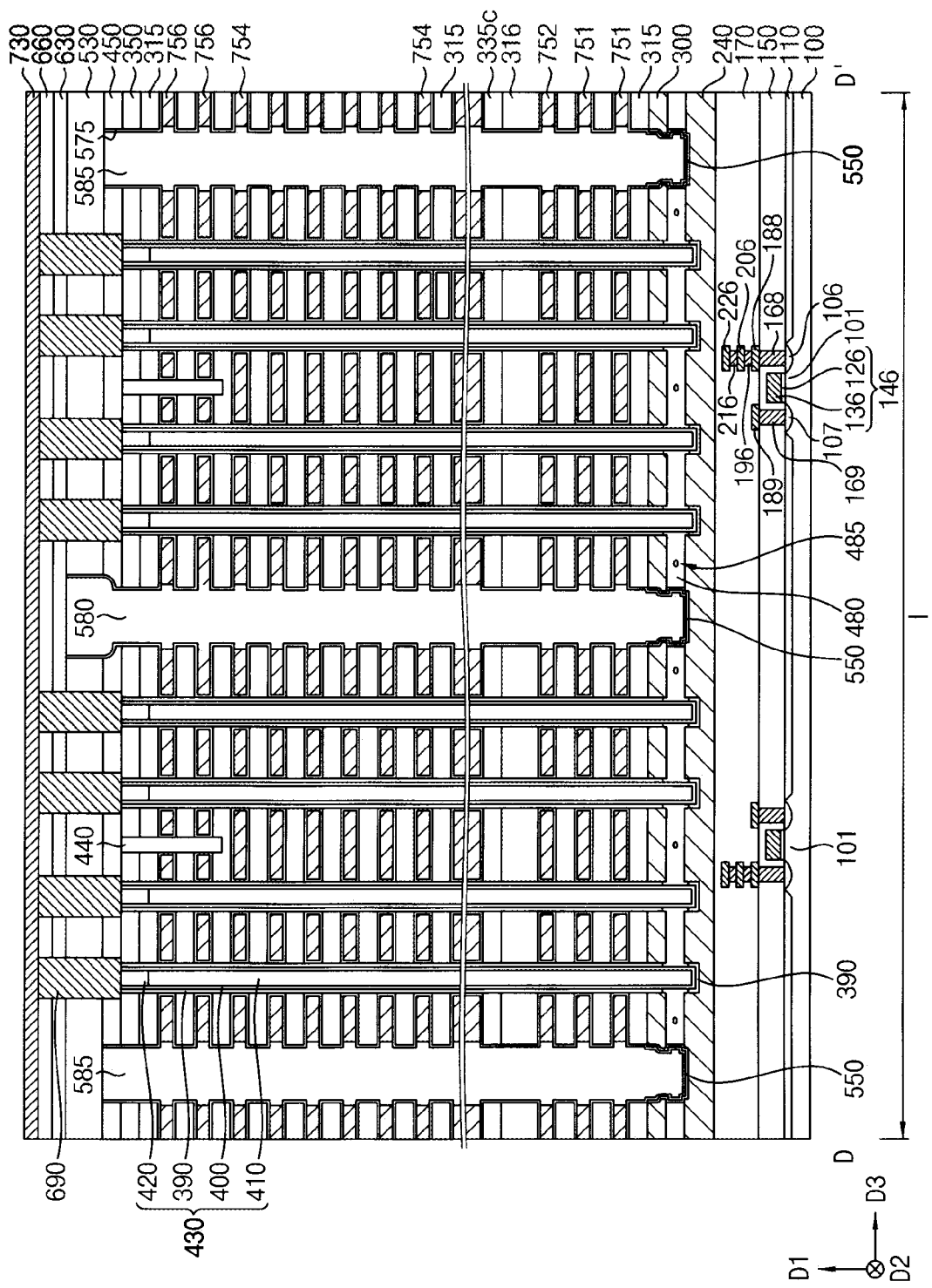
Figure 49:
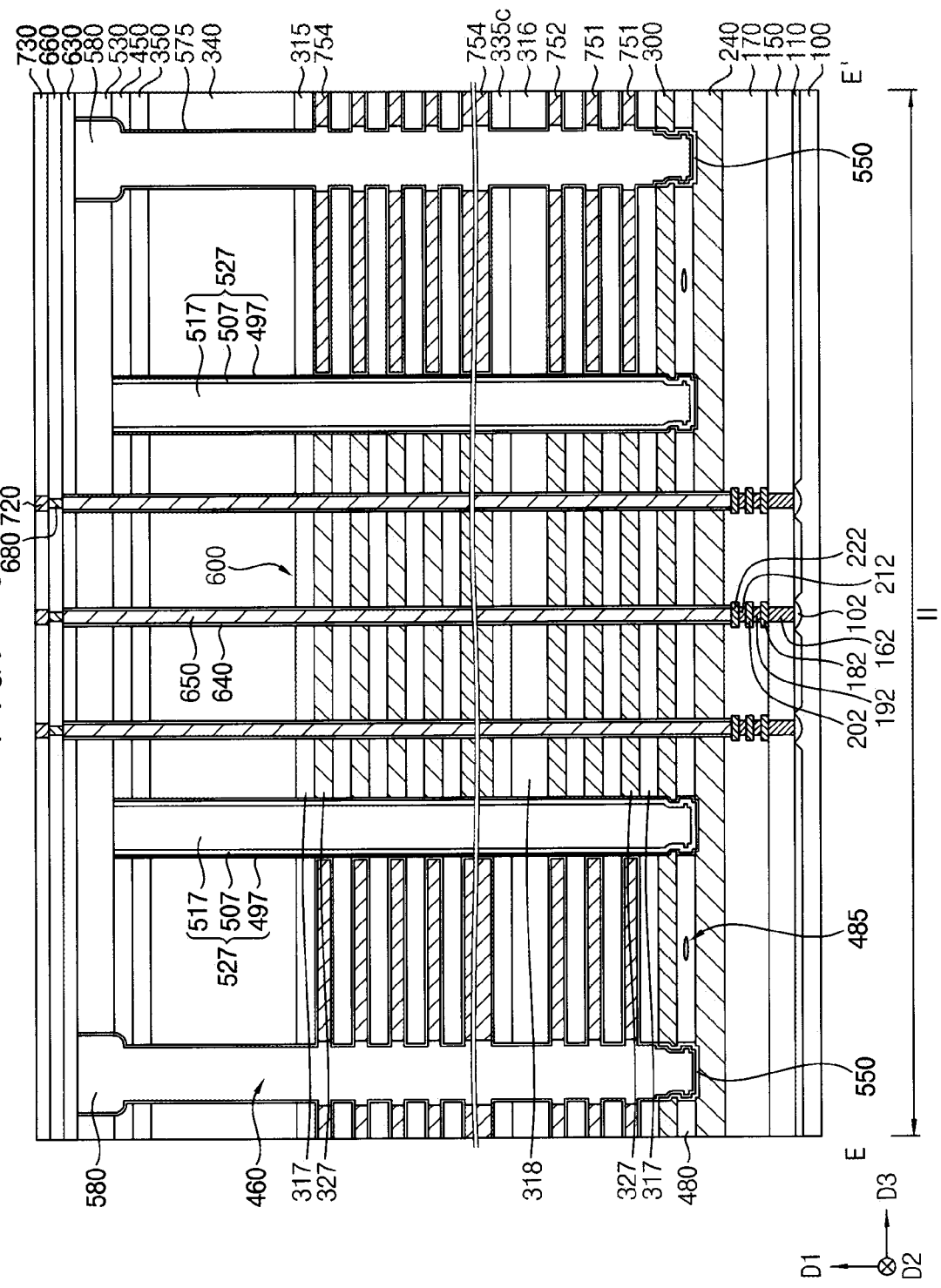
Figure 52:
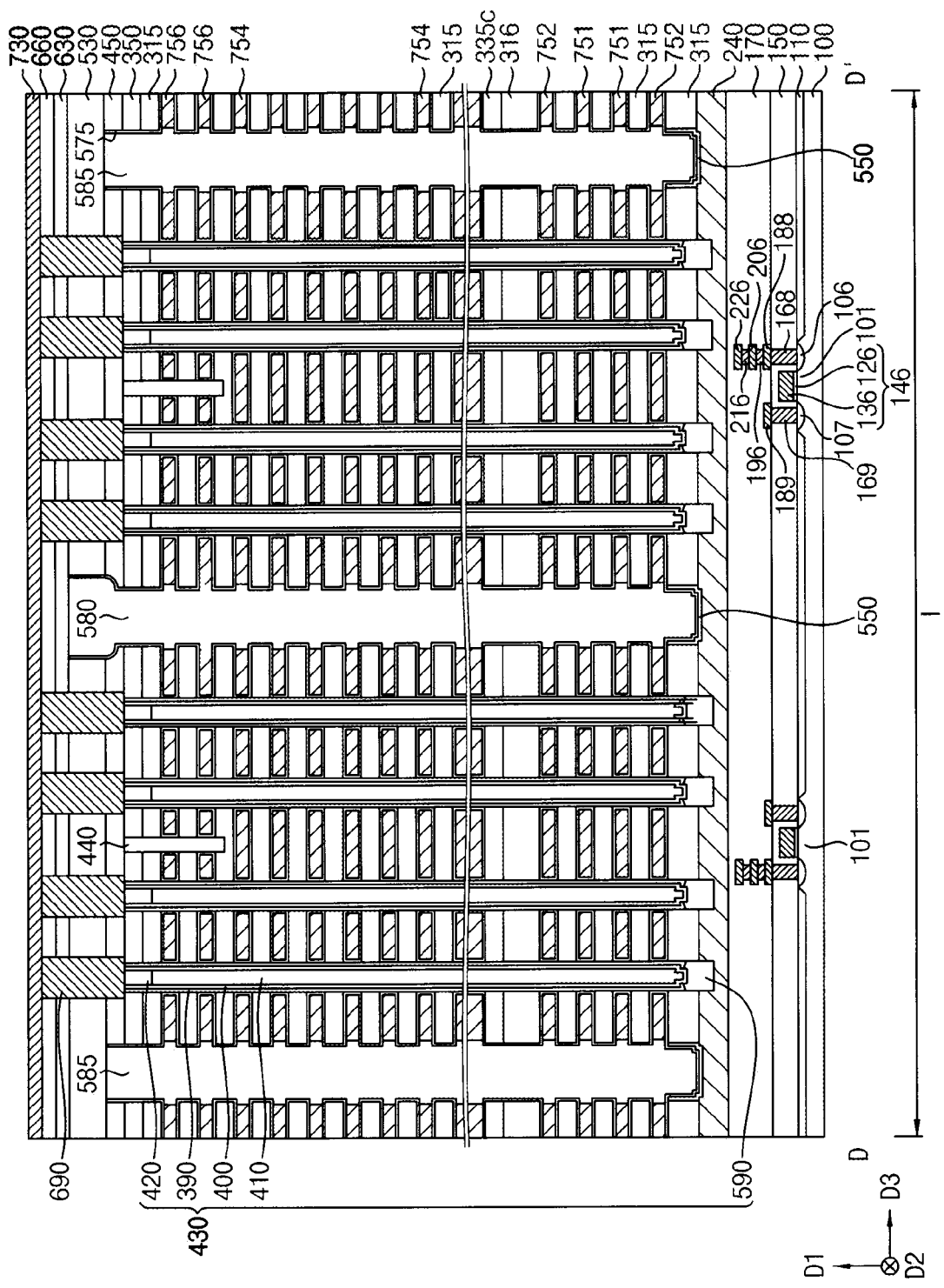
FIG. 52 is a cross-sectional view illustrating a semiconductor device in accordance with some example embodiments, which may correspond to FIG. 48.

FIG. 52 is a cross-sectional view illustrating a semiconductor device in accordance with some example embodiments, which may correspond to FIG. 48. This semiconductor device may be substantially the same as or similar to that of FIGS. 43, 44 and 46 to 49, except for the memory channel structure 430, the channel connection pattern 480 and the first support layer 300.

The memory channel structure 430 may further include a semiconductor pattern 590 on the substrate 100, and the charge storage structure 390, the channel 400, the first filling pattern 410 and the capping pattern 420 may be formed on the semiconductor pattern 590.

The semiconductor pattern 590 may include, e.g., doped or undoped single crystalline silicon or polysilicon. In some example embodiments, an upper surface of the semiconductor pattern 590 may be formed at a height between lower and upper surfaces of the first insulation pattern 315 between the second and third gate electrodes 752 and 754. The charge storage structure 390 may have a cup-like shape of which a central lower surface is opened, and may contact an edge upper surface of the semiconductor pattern 590. The channel 400 may have a cup-like shape, and may contact a central upper surface of the semiconductor pattern 590. Thus, the channel 400 may be electrically connected to the CSP 240 through the semiconductor pattern 590.

The channel connection pattern 480 and the first support layer 300 may not be formed between the CSP 240 and the first gate electrode 752.

Figure 53:
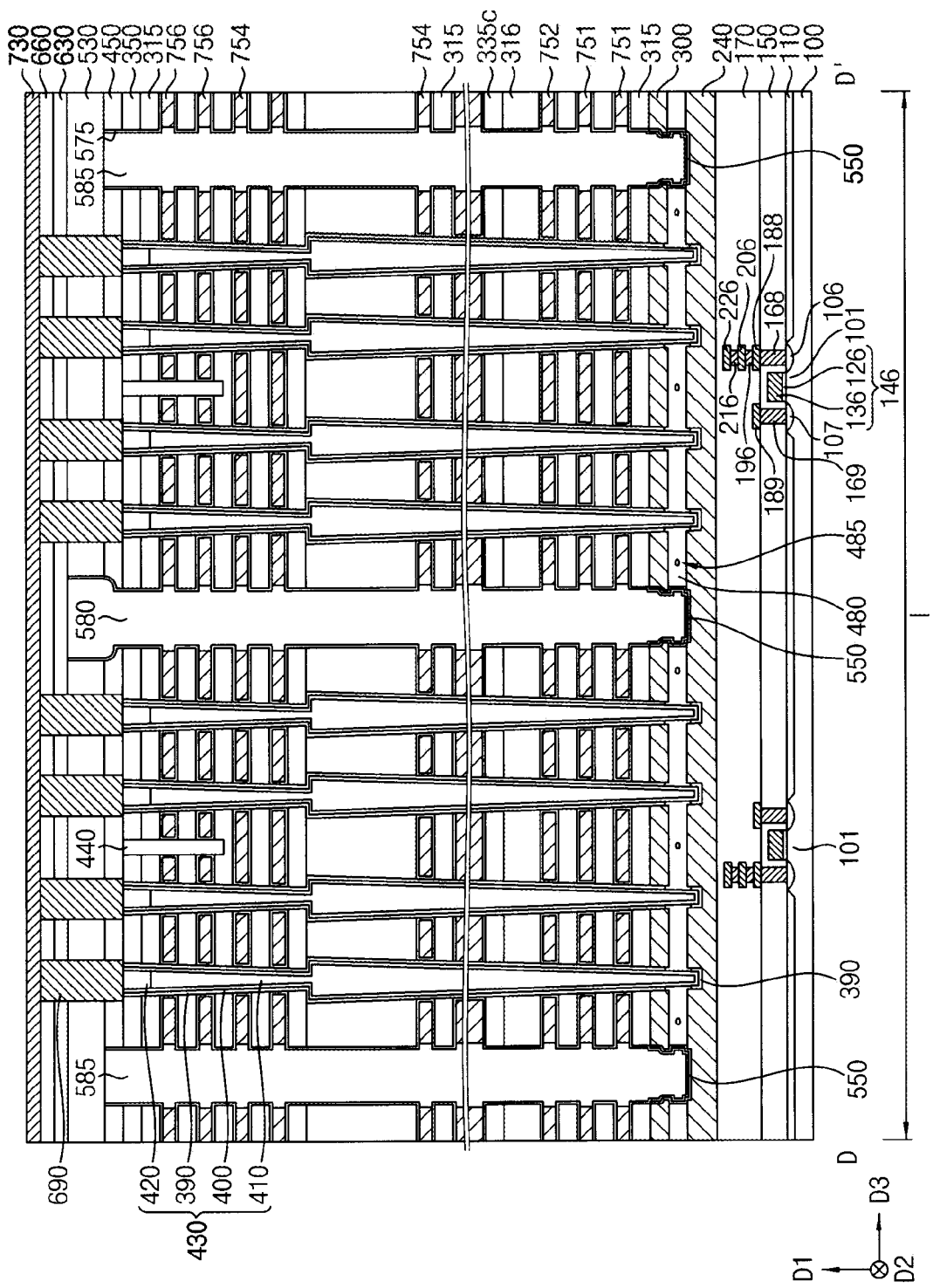
FIG. 53 is a cross-sectional view illustrating a semiconductor device in accordance with some example embodiments, which may correspond to FIG. 48.

FIG. 53 is a cross-sectional view illustrating a semiconductor device in accordance with some example embodiments, which may correspond to FIG. 48. This semiconductor device may be substantially the same as or similar to that of FIGS. 43, 44 and 46 to 49, except for the memory channel structure 430.

The memory channel structure 430 may include lower and upper portions sequentially stacked, and each of the lower and upper portions may have a width gradually increasing from a bottom toward a top thereof. In some example embodiments, a lower surface of the upper portion of the memory channel structure 430 may have an area less than that of an upper surface of the lower portion thereof.

In the drawings, the memory channel structure 430 includes two portions, for example, the lower and upper portions, however, inventive concepts may not be limited thereto, and may include more than two portions. Each of the portions of the memory channel structure 430 may have a width gradually increasing from a bottom toward a top thereof, and an area of a lower surface of an upper portion may be less than that of an upper surface of a lower portion that is directly under the upper portion.

FIG. 54 is a cross-sectional view illustrating a semiconductor device in accordance with some example embodiments, which may correspond to FIG. 48. This semiconductor device may be substantially the same as or similar to that of FIGS. 43, 44 and 46 to 49, except that upper structures are overturned and bonding structures are further formed. The lower circuit patterns may corresponding to the peripheral circuit wirings 4110 of FIG. 4, and circuit structures including the lower circuit patterns may correspond to the first structure 4100 of FIG. 4.

In some example embodiments, ninth to twelfth insulating interlayers 800, 820, 840 and 860 may be sequentially stacked on the eighth and ninth lower wirings 222 and 226 and the second insulating interlayer 170. Additionally or alternatively, a first bonding pattern extending through the ninth insulating interlayer 800 to contact the eight lower wiring 222, and a second bonding pattern 810 extending through the ninth insulating interlayer 800 to contact the ninth lower wiring 226 may be formed. Furthermore, a third bonding pattern extending through the tenth insulating interlayer 820 to contact the first bonding pattern, and a fourth bonding pattern 830 extending through the tenth insulating interlayer 820 to contact the second bonding pattern 810 may be formed. The first to third bonding patterns and the second and fourth bonding patterns 810 and 830 may include a metal, e.g., copper, aluminum, etc., and may be formed by, e.g., a dual damascene process.

A seventh upper wiring extending through the eleventh insulating interlayer 840 to contact the third bonding pattern, and an eighth upper wiring 850 extending through the eleventh insulating interlayer 840 to contact the fourth bonding pattern 830 may be formed, and a first upper via extending through the twelfth insulating interlayer 860 to contact the seventh upper wiring, and a second upper via 870 extending through the twelfth insulating interlayer 860 to contact the eighth upper wiring 850 may be formed.

At least some of the first and second upper wirings 712 and 714, the third upper wiring, the fourth and fifth upper wirings 720 and 730, and the sixth upper wiring may be electrically connected to the lower circuit patterns through the first and third bonding patterns or the second and fourth bonding patterns.

Any of the elements disclosed above may include or be implemented in processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc.

While some example embodiments have been particularly shown and described, it will be understood by one of ordinary skill in the art that variations in form and detail may be made therein without departing from the spirit and scope of the claims.

What is claimed is:

1. A semiconductor device comprising:
   a gate electrode structure on a substrate, the gate electrode structure including gate electrodes spaced apart from each other in a first direction perpendicular to an upper surface of the substrate, each of the gate electrodes extending in a second direction parallel to the upper surface of the substrate;
   a channel on the substrate and extending through the gate electrode structure in the first direction;
   first division patterns apart from each other in the second direction, each of the first division patterns extending in the second direction through the gate electrode structure; and
   a second division pattern between the first division patterns, the second division pattern and the first division patterns together dividing a first gate electrode among the gate electrodes in a third direction parallel to the upper surface of the substrate and crossing the second direction,
   wherein the second division pattern has a shape in a plan view of a peanut from which opposite ends are removed, and the second division pattern overlaps ones of the gate electrodes above the first gate electrode in the first direction.

2. The semiconductor device of claim 1, wherein the second division pattern partially overlaps the first division patterns in the third direction.

3. The semiconductor device of claim 1, wherein the second division pattern extends in the second direction, and the second division pattern has the shape in the plan view of the peanut from which opposite ends in the second direction are removed.

4. The semiconductor device of claim 1, wherein the second division pattern extends in the third direction, and the second division pattern has the shape in the plan view of the peanut from which opposite ends in the third direction are removed.

5. The semiconductor device of claim 1, wherein the second division pattern includes:
   a horizontal portion at a same level as the first gate electrode, the horizontal portion having an outer contour that has a curve in the plan view; and
   a vertical portion connected to the horizontal portion, the vertical portion extending in the first direction from a horizontal direction.

6. The semiconductor device of claim 5, wherein the vertical portion of the second division pattern has an outer contour that is a circle or an ellipse in the plan view.

7. The semiconductor device of claim 5, wherein the vertical portion of the second division pattern has a bar shape extending in a direction in a plan view.

8. The semiconductor device of claim 5, wherein:
   the horizontal portion is a first horizontal portion,
   the second division pattern further includes a second horizontal portion connected to an upper end of the vertical portion, and
   a second gate electrode among the gate electrodes is on the second horizontal portion.

9. The semiconductor device of claim 8, wherein the first gate electrode corresponds to a ground selection line (GSL), and the second gate electrode corresponds to a word line.

10. The semiconductor device of claim 1, wherein gate electrodes include a second gate electrode under the first gate electrode, and
    the first gate electrode corresponds to a ground selection line (GSL), and the second gate electrode corresponds to a gate induced drain leakage (GIDL) gate electrode.

11. The semiconductor device of claim 1, further comprising:
    an insulation pattern structure extending through the gate electrode structure between the first division patterns; and
    an etch stop structure surrounding the insulation pattern structure,
    wherein the etch stop structure extends through the second division pattern.

12. The semiconductor device of claim 11, wherein the etch stop structure includes:
    a first extension portion extending in the second direction; and
    a second extension portion extending in a third direction parallel to the upper surface of the substrate and crossing the second direction, and
    the second extension portion of the etch stop structure extends through the second division pattern.

13. The semiconductor device of claim 11, further comprising:
    a through via extending through the insulation pattern structure.

14. The semiconductor device of claim 1, further comprising:
    a third division pattern on each of opposite sides of the gate electrode structure in a third direction parallel to the upper surface of the substrate and crossing the second direction, the third division pattern extending in the second direction.

15. The semiconductor device of claim 1, wherein the substrate includes a cell array region and an extension region at least partially surrounding the cell array region, and
the gate electrode structure and the first division patterns are on the cell array region and the extension region of the substrate, the channel is on the cell array region of the substrate, and the second division pattern is on the extension region of the substrate.

16. The semiconductor device of claim 1, wherein the channel has a cup shape,
wherein the semiconductor device further comprises:
a charge storage structure on an outer sidewall of the channel;
a filling pattern filling an inner space defined by the channel; and
a capping pattern on the channel and the filling pattern, the capping pattern contacting an inner sidewall of the charge storage structure, and
wherein the charge storage structure, the channel, the filling pattern and the capping pattern together correspond to a memory channel structure extending in the first direction.

17. A semiconductor device comprising:
a gate electrode structure on a substrate, the gate electrode structure including gate electrodes spaced apart from each other in a first direction perpendicular to an upper surface of the substrate, each of the gate electrodes extending in a second direction parallel to the upper surface of the substrate;
a channel on the substrate and extending in the first direction through the gate electrode structure;
first division patterns spaced apart from each other in the second direction, each of the first division patterns extending in the second direction through the gate electrode structure; and
a second division pattern between the first division patterns, the second division pattern and the first division patterns together dividing a first gate electrode among the gate electrodes in a third direction parallel to the upper surface of the substrate and crossing the second direction,
wherein the second division pattern includes,
a horizontal portion at a same level as the first gate electrode, the horizontal portion and the first division patterns together dividing the first gate electrode in the third direction, and
a vertical portion connected to the horizontal portion, the vertical portion extending in the first direction from the horizontal portion,
wherein an area of an upper surface of the horixontal portion is greater than an area of an upper surface of the vertical portion, and the second division pattern overlaps the ones of the gate electrodes above the first gate electrode in the dires direction.

18. The semiconductor device of claim 17, wherein:
the horizontal portion is a first horizontal portion,
the second division pattern further includes a second horizontal portion connected to an upper end of the vertical portion, and
a second gate electrode among the gate electrodes is on the second horizontal portion.

19. A massive data storage system comprising:
(I) a semiconductor device comprising,
  (A) a memory cell structure including,
    (1) a gate electrode structure on a substrate, the gate electrode structure including gate electrodes spaced apart from each other in a first direction perpendicular to an upper surface of the substrate, each of the gate electrodes extending in a second direction parallel to the upper surface of the substrate,
    (2) a channel extending in the first direction through the gate electrode structure on the substrate,
    (3) first division patterns spaced apart from each other in the second direction, each of the first division patterns extending in the second direction through the gate electrode structure, and
    (4) a second division pattern between the first division patterns, the second division pattern and the first division patterns together dividing a first gate electrode among the gate electrodes in a third direction parallel to the upper surface of the substrate and crossing the second direction,
  wherein the second division pattern has a shape in a plan view of a peanut from which opposite ends are removed, ans the second division pattern overlaps ones of the gate electrodes above the first gate electrode in the first direction;
  (B) peripheral circuit wirings configured to apply electrical signals to the memory cell structure, and
  (C) an input/output pad electrically connected to the peripheral circuit wirings; and
(II) a controller circuitry electrically connected to the semiconductor device through the input/output pad, the controller circuitry configured to control the semiconductor device.

* * * * *